United States Patent
Ito et al.

(10) Patent No.: US 9,618,665 B2
(45) Date of Patent: Apr. 11, 2017

(54) COLORED COMPOSITION, CURED FILM, COLOR FILTER, METHOD FOR PRODUCING COLOR FILTER, SOLID-STATE IMAGE SENSOR, AND IMAGE DISPLAY DEVICE

(71) Applicant: FUJIFILM Corporation, Tokyo (JP)

(72) Inventors: Junichi Ito, Shizuoka (JP); Tetsuya Watanabe, Shizuoka (JP); Yuushi Kaneko, Shizuoka (JP); Suguru Samejima, Shizuoka (JP); Kazuya Oota, Shizuoka (JP); Yoshinori Taguchi, Shizuoka (JP); Naotsugu Muro, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/009,923

(22) Filed: Jan. 29, 2016

(65) Prior Publication Data

US 2016/0146987 A1 May 26, 2016

Related U.S. Application Data

(63) Continuation of application No. PCT/JP2014/069814, filed on Jul. 28, 2014.

(30) Foreign Application Priority Data

Jul. 31, 2013 (JP) .................. 2013-158924

(51) Int. Cl.

| | |
|---|---|
| *G03F 7/004* | (2006.01) |
| *G02B 5/20* | (2006.01) |
| *C08F 12/20* | (2006.01) |
| *C08F 12/30* | (2006.01) |
| *C08L 101/02* | (2006.01) |
| *G03F 7/029* | (2006.01) |
| *G03F 7/031* | (2006.01) |
| *G03F 7/00* | (2006.01) |
| *G03F 7/033* | (2006.01) |
| *G03F 7/038* | (2006.01) |
| *G03F 7/105* | (2006.01) |
| *C08F 212/14* | (2006.01) |
| *C09B 69/10* | (2006.01) |
| *G02B 5/22* | (2006.01) |
| *G03F 7/039* | (2006.01) |
| *G03F 7/20* | (2006.01) |
| *G03F 7/32* | (2006.01) |
| *C08F 220/38* | (2006.01) |

(52) U.S. Cl.
CPC .............. *G02B 5/201* (2013.01); *C08F 12/20* (2013.01); *C08F 12/30* (2013.01); *C08F 212/14* (2013.01); *C08L 101/02* (2013.01); *C09B 69/103* (2013.01); *C09B 69/105* (2013.01); *C09B 69/108* (2013.01); *C09B 69/109* (2013.01); *G02B 5/20* (2013.01); *G02B 5/223* (2013.01); *G03F 7/0007* (2013.01); *G03F 7/029* (2013.01); *G03F 7/031* (2013.01); *G03F 7/033* (2013.01); *G03F 7/039* (2013.01); *G03F 7/0388* (2013.01); *G03F 7/105* (2013.01); *G03F 7/20* (2013.01); *G03F 7/32* (2013.01); *C08F 220/38* (2013.01)

(58) Field of Classification Search
CPC ........ G03F 7/0007; G03F 7/029; G03F 7/031; G03F 7/033; G03F 7/0388; G03F 7/105; G03F 7/032; G02B 5/201; G02B 5/223; H01L 27/14621; G02F 1/133516; C09B 69/10; C09B 69/103; C09B 69/105; C09B 69/108; C09B 69/109; C08F 212/14; C08F 220/06; C08F 12/20; C08F 12/30; C08F 220/38; C08L 101/02
USPC ........... 430/7, 270.1, 281.1, 286.1; 349/106; 257/440
See application file for complete search history.

(56) References Cited

FOREIGN PATENT DOCUMENTS

| | | | |
|---|---|---|---|
| JP | 2002-356071 A | | 12/2002 |
| JP | 2012-32754 A | | 2/2012 |
| JP | 2012-173399 A | | 9/2012 |
| JP | 2012-194466 A | * | 10/2012 |
| JP | 2013-67776 A | | 4/2013 |

OTHER PUBLICATIONS

Computer-generated translation of JP 2012-194466 (Oct. 2012).*
International Search Report for PCT/JP2014/069814 dated Aug. 26, 2014 [PCT/ISA/210].
Written Opinion for PCT/JP2014/069814 dated Aug. 26, 2014 [PCT/ISA/237].
International Preliminary Report on Patentability issued from the International Bureau in counterpart Application No. PCT/JP2014/069814, mailed Feb. 11, 2016.
Office Action dated May 24, 2016, from the Japanese Patent Office in counterpart Japanese Application No. 2013-158924.
Office Action dated Dec. 27, 2016, from the State Intellectual Property Office of People's Republic of China in corresponding Chinese Application No. 201480042508.6.
Office Action dated Feb. 14, 2017 in counterpart Korean Patent Application 10-2016-7002467.

* cited by examiner

*Primary Examiner* — John A McPherson
(74) *Attorney, Agent, or Firm* — Sughrue Mion, PLLC

(57) ABSTRACT

Provided are a colored composition which enables the formation of a pattern having excellent heat resistance and excellent solubility in solvents and has inhibited color migration; and a cured film, a color filter, a method for producing a color filter, a solid-state image sensor, and an image display device, each of which uses the colored composition.
The colored composition includes a polymer anion having a repeating unit containing a weakly nucleophilic anionic structure, and a dye having a cationic structure, in which the weakly nucleophilic anionic structure represents an anionic structure produced by dissociating an organic acid having a lower pKa value than the pKa value of sulfuric acid.

36 Claims, No Drawings

COLORED COMPOSITION, CURED FILM, COLOR FILTER, METHOD FOR PRODUCING COLOR FILTER, SOLID-STATE IMAGE SENSOR, AND IMAGE DISPLAY DEVICE

CROSS-REFERENCE TO RELATED APPLICATIONS

This application is a Continuation of PCT International Application No. PCT/JP2014/069814 filed on Jul. 28, 2014, which claims priority under 35 U.S.C §119(a) to Japanese Patent Application No. 2013-158924 filed on Jul. 31, 2013. Each of the above application(s) is hereby expressly incorporated by reference, in its entirety, into the present application.

BACKGROUND OF THE INVENTION

1. Field of the Invention

The present invention relates to a colored composition and a cured film using the same. It further relates to a color filter having a cured film, a method for producing a color filter, a solid-state image sensor, and an image display device, each of which has a color filter.

2. Description of the Related Art

As one of the methods for producing a color filter which is used for a liquid crystal display device, a solid-state image sensor, or the like, there is a pigment dispersion method. As the pigment dispersion method, there is a method for producing a color filter by a photolithography method by using a colored photosensitive composition which is obtained by dispersing pigments in various photosensitive compositions. That is, a curable composition is applied onto a substrate by using a spin coater, a roll coater, or the like, the substrate is dried to form a coating film, and the coating film is developed by pattern exposure, thereby obtaining colored pixels. This operation is repeated for the number of the desired hues to manufacture a color filter.

The method is stable with respect to light or heat due to a use of pigments, and positional accuracy is sufficiently secured since patterning is performed by a photolithography method. Accordingly, the method has been widely used as a method suitable for producing a color filter for color display or the like.

However, it is common to use a colored photosensitive composition including a dye or a pigment for manufacture of a color filter, and a colored photosensitive composition which has excellent heat resistance due to using a weakly nucleophilic anion, a colored photosensitive composition which has excellent solubility due to using a weakly nucleophilic anion, and the like have been proposed (JP2012-173399A and JP2013-67776A).

Meanwhile, it is known that for formation of a color filter for a solid-state image sensor such as a CCD, there is no guide pattern such as a black matrix present in a color filter for a LCD, and therefore, there is mixing of dye colors between patterns adjacent to each other. As a result, a method for reducing the thermal diffusion of dye molecules and the diffusivity into a solvent, for example, by multimerizing a dye so as to inhibit the colors from being mixed, has been proposed (JP2012-32754A).

SUMMARY OF THE INVENTION

The present inventors have conducted investigations under these situations, and as a result, they have found that a cationic dye can be improved in terms of heat resistance and solubility in solvents by a weakly diffusable anion as described above, but since a coloring curable component contains an anionic material, an exchange reaction occurs. Further, it could be seen that in the case where a non-nucleophilic or weakly nucleophilic anion is exchanged with the coloring curable component, there is a tendency that the heat resistance or the solubility in solvents deteriorates. Further, it could be seen that by only multimerization of a cationic dye in the multimerization of a dye, the exchange reaction with another anion cannot be completely inhibited and an exchange with the aforementioned non-nucleophilic or weakly nucleophilic anion occurs, and thus, there is a tendency that the heat resistance or the solubility in solvents deteriorates. In addition, it could be seen that when a dye is polymerized, there are cases where in an excessive heating process, the dye is decomposed and color migration to another pattern occurs.

The present invention has been made to solve the above-described problems and relates to a colored composition which is capable of forming a pattern having excellent heat resistance and solubility in solvents and having inhibited color migration; and a cured film, a color filter, a method for producing a color filter, a solid-state image sensor, and an image display device, each of which uses the colored composition.

The present inventors have conducted extensive investigation, and as a result, they have found that it is possible to solve the problems as described above by using a polymer anion having a repeating unit containing a weakly nucleophilic anionic structure and a cation having a dye structure.

Specifically, the problems were solved by the following means <1>, and preferably <2> to <18>.

<1> A colored composition including a polymer anion having a repeating unit containing a weakly nucleophilic anionic structure and a cation having a dye structure, in which the weakly nucleophilic anionic structure represents an anionic structure produced by dissociating an organic acid having a lower pKa value than the pKa value of sulfuric acid.

<2> The colored composition as described in <1>, in which the repeating unit containing a weakly nucleophilic anionic structure is represented by General Formula (1).

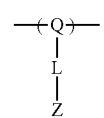

General Formula (1)

(in General Formula (1), Q represents the main chain of the repeating unit, L represents a single bond or a divalent linking group, and Z is an anionic structure represented by General Formula (2-1), an anionic structure represented by General Formula (2-2), or an anionic structure represented by the following General Formula (2-3).)

  General Formula (2-1)

(in General Formula (2-1), * represents a binding site to L in General Formula (1), $Y^1$ represents a fluorinated alkylene group, and $A^1$ represents $SO_3^-$.)

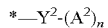  General Formula (2-2)

(in General Formula (2-2), * represents a binding site to L in General Formula (1), and $Y^2$ represents an anion including a boron atom, a carbon atom, a nitrogen atom, or a phosphorus atom;

in the case where $Y^2$ is a boron atom, n is 3, and $A^2$'s are each a halogen atom, a cyano group, an alkyl group containing at least one of a fluorine atom and a cyano group, or an aryl group containing at least one of a fluorine atom and a cyano group;

in the case where $Y^2$ is a carbon atom, n is 2, and $A^2$'s are each a halogen atom, a cyano group, an alkyl group containing at least one of a fluorine atom and a cyano group, an aryl group containing at least one of a fluorine atom and a cyano group, an alkylsulfonyl group which may contain at least one of a fluorine atom and a cyano group, or an arylsulfonyl group which may contain at least one of a fluorine atom and a cyano group, and two $A^2$'s may be bonded to each other to form a ring;

in the case where $Y^2$ is a nitrogen atom, n is 1, and $A^2$'s are each an alkyl group containing at least one of a fluorine atom and a cyano group, an aryl group containing at least one of a fluorine atom and a cyano group, an alkylsulfonyl group which may contain at least one of a fluorine atom and a cyano group, or an arylsulfonyl group which may contain at least one of a fluorine atom and a cyano group; and in the case where $Y^2$ is a phosphorus atom, n is 1 or 3, and $A^2$'s are each an alkyl group containing at least one of a fluorine atom and a cyano group, an aryl group containing at least one of a fluorine atom and a cyano group, an alkylsulfonyl group which may contain at least one of a fluorine atom and a cyano group, or an arylsulfonyl group which may contain at least one of a fluorine atom and a cyano group.)

General Formula (2-3)

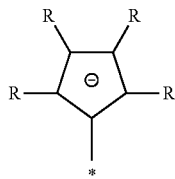

(in General Formula (2-3), * represents a binding site to L in General Formula (1), and R's each represent a cyano group or a fluorinated alkyl group.)

<3> The colored composition as described in <2>, in which in the case where Z in General Formula (1) is represented by General Formula (2-1), L has a fluorinated alkylene group having 1 to 10 carbon atoms.

<4> The colored composition as described in any one of <1> to <3>, in which the cation having a dye structure has a polymerizable group.

<5> The colored composition as described in any one of <1> to <4>, in which the polymer anion contains a repeating unit having an acid group.

<6> The colored composition as described in any one of <1> to <5>, in which the composition further includes a polymerizable compound (B).

<7> The colored composition as described in any one of <1> to <6>, in which the composition further includes a pigment (C) other than the cation having a dye structure.

<8> The colored composition as described in any one of <1> to <7>, in which the composition further contains a photopolymerization initiator (D).

<9> The colored composition as described in <8>, in which the photopolymerization initiator (D) is an oxime compound.

<10> The colored composition as described in any one of <2> to <9>, in which Z in General Formula (1) is an anionic structure represented by General Formula (2-1), or an anionic structure produced by dissociating at least one group selected from a fluorinated alkylsulfonimide group and a fluorinated alkylsulfonemethide group.

<11> The colored composition as described in any one of <1> to <10>, in which the cation having a dye structure has a dye structure selected from a dipyrromethene dye, a triarylmethane dye, a xanthene dye, a cyanine dye, and a squarylium dye.

<12> The colored composition as described in any one of <1> to <11>, in which the polymer anion having the repeating unit containing a weakly nucleophilic anionic structure and the cation having a dye structure form a dye multimer.

<13> The colored composition as described in any one of <1> to <12>, which is used for formation of a colored layer of a color filter.

<14> A cured film obtained by curing the colored composition as described in any one of <1> to <13>.

<15> A color filter including the cured film as described in <14>.

<16> A method for producing a color filter, including a step of applying the colored composition as described in any one of <1> to <13> onto a support to form a colored composition layer, a step of patternwise exposing the colored composition layer, and a step of developing an unexposed area after the exposure.

<17> A solid-state image sensor including the color filter as described in <15> or a color filter obtained by the method for producing a color filter as described in <16>.

<18> An image display device including the color filter as described in <15> or a color filter obtained by the method for producing a color filter as described in <16>.

According to the present invention, it became possible to provide a colored composition which is capable of forming a pattern having excellent heat resistance and solubility in solvents and having inhibited color migration; and a cured film, a color filter, a method for producing a color filter, a solid-state image sensor, and an image display device, each of which uses the colored composition.

DESCRIPTION OF THE PREFERRED EMBODIMENTS

Hereinafter, the contents of the present invention will be described in detail. Further, in the present specification "(a value) to (a value)" is used to mean a range including the numeral values described before and after "(a value) to (a value)" as a lower limit value and an upper limit value, respectively. Further, the organic EL element in the present invention refers to an organic electroluminescence element.

In the present specification, the total solid content refers to a total mass of the components remaining when a solvent is excluded from the entire composition of a colored composition.

In citations for a group (atomic group) in the present specification, when the group is denoted without specifying whether it is substituted or unsubstituted, the group includes both a group having no substituents and a group having a substituent. For example, an "alkyl group" includes not only an alkyl group having no substituents (unsubstituted alkyl group), but also an alkyl group having a substituent (substituted alkyl group).

Furthermore, "radiation" in the present specification means, for example, a bright line spectrum of a mercury lamp, far ultraviolet rays represented by an excimer laser, extreme ultraviolet rays (EUV rays), X-rays, electron beams, or the like. In addition, in the present invention, light means actinic rays or radiation. "Exposure" in the present specification includes, unless otherwise specified, not only exposure by a mercury lamp, far ultraviolet rays represented by an excimer laser, X-rays, EUV rays, or the like, but also writing by particle rays such as electron beams and ion beams.

Moreover, in the present specification, "(meth)acrylate" represents either or both of acrylate and methacrylate, "(meth)acryl" represents either or both of acryl and methacryl, and "(meth)acryloyl" represents either or both of acryloyl and methacryloyl.

In the present specification, a "monomer material" and a "monomer" have the same definition. The monomer in the present specification refers to a compound which is distinguished from an oligomer or a polymer and has a weight-average molecular weight of 2,000 or less. In the present specification, a polymerizable compound refers to a compound having a polymerizable functional group, and may be a monomer or a polymer. The polymerizable functional group refers to a group involved in a polymerization reaction.

In chemical formulae in the present specification, Me represents a methyl group, Et represents an ethyl group, Pr represents a propyl group, Bu represents a butyl group, and Ph represents a phenyl group.

In the present specification, a term "step" includes not only an independent step, but also steps which are not clearly distinguished from other steps if an intended action of the steps is obtained.

The present invention has been made in consideration of the above circumstances, and has an object to provide a colored composition having excellent color characteristics.

The colored composition of the present invention (hereinafter simply referred to as "the composition of the present invention" in some cases) may include a polymer anion having a repeating unit containing a weakly nucleophilic anionic structure and a cation having a dye structure. Incidentally, the weakly nucleophilic anionic structure represents an anionic structure produced by dissociating an organic acid having a lower pKa value than the pKa value of sulfuric acid.

By adopting such a configuration, it becomes possible to form a pattern having excellent heat resistance and solubility in solvents, and excellent pattern formability with inhibition of color migration into another pattern.

Furthermore, in the related art, for a colored composition produced by formulating dye multimers, when a pattern is formed by a dry etching method, the resistance to a developing liquid or the resistance to a peeling solution of a photoresist was poor in some cases. In contrast, in the present invention, it becomes possible to improve the resistance to a developing liquid or the resistance to a peeling solution of a photoresist.

Therefore, it is possible to provide a cured film having excellent color characteristics and a color filter including the cured film according to the present invention. Further, it is possible to provide a pattern forming method which is capable of forming a colored pattern having excellent color characteristics and a method for producing a color filter according to the present invention. In addition, it is possible to provide a solid-state image sensor and an image display device (a liquid crystal display device, an organic EL display device, and the like), each including a color filter having excellent color characteristics according to the present invention.

Although the action mechanism of the invention is still not clear, it is presumed that a local anion concentration can be increased by multimerizing a weakly nucleophilic anion capable of forming a stable salt, and thus, it is possible to form a stable salt in a complex system in which different anionic species are present, such as a resist liquid.

Furthermore, in the colored composition of the present invention, a polymer anion having a repeating unit containing a weakly nucleophilic anionic structure and a cation having a dye structure may be present separately, but it is preferable that a cation is present as a counter cation of the polymer anion. That is, in the present invention, a preferred embodiment in which a polymer anion and a cation form a dye multimer is preferable. In a color filter as a final embodiment, at least a part of the polymer anion and the cation forms a dye multimer. Hereinafter, the dye multimer may be referred to as a dye multimer (A) in some cases for the sake of convenience, but an embodiment in which a polymer anion and a cation having a dye structure are present separately in a composition is also included in the present invention.

Hereinbelow, details of the present invention will be described.

<Dye Multimer (A)>

The colored composition of the present invention contains at least one kind of each of a polymer anion having a repeating unit containing a weakly nucleophilic anionic structure and a cation having a dye structure.

Here, the weakly nucleophilic anionic structure is generally an anionic structure obtained by an acid having a low pKa, called a super acid, dissociating a proton. The definition of a super acid varies depending on the document, but super acids collectively refer to acids having a lower pKa than that of methanesulfonic acid, and the structures described in J. Org. Chem. 2011, 76, 391-395 Equilibrium Acidities of Superacids are known. In the present invention, the weakly nucleophilic anionic structure is an anionic structure produced by dissociating an organic acid having a lower pKa value than the pKa value of sulfuric acid. Further, the pKa of sulfuric acid varies depending on documents, but it is about $-2.5$ (pKa in 1,2-dichloroethane).

The pKa of the weakly nucleophilic anionic structure is preferably from $-2.6$ to $-18$, more preferably from $-4$ to $-18$, and still more preferably from $-5$ to $-18$. Further, the pKa can be measured by the method described in, for example, J. Org. Chem. 2011, 76, 391-395. In addition, the pKa value in the present specification is a pKa in 1,2-dichloroethane unless otherwise specified.

<<Polymer Anion Having Repeating Unit Containing Weakly Nucleophilic Anionic Structure>>

The polymer anion having a repeating unit containing a weakly nucleophilic anionic structure (hereinafter simply referred to as a "polymer anion" in some cases) is not specifically defined as long as it represents an anionic structure produced by dissociating an organic acid having a lower pKa value than the pKa value of sulfuric acid, but preferably has a repeating unit represented by the following General Formula (1). One kind or two or more kinds of the repeating unit represented by General Formula (1) may be included in the polymer anion. In addition, other repeating units may be included, as will be described later.

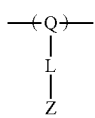

General Formula (1)

(In General Formula (1), Q represents the main chain of the repeating unit, L represents a single bond or a divalent linking group, and Z is an anionic structure represented by General Formula (2-1), an anionic structure represented by General Formula (2-2), or an anionic structure represented by the following General Formula (2-3).)

Q represents the main chain of the repeating unit, usually, a linking group formed by polymerization. Specifically, it is preferably the main chain of the repeating unit formed by radically, cationically, or anionically polymerizing a compound having a polymerizable group. Further, it can also be introduced by polycondensation, a polymer reaction, or the like. Above all, it is preferably a structure formed by polymerizing a compound including a group having a radical polymerizable unsaturated bond. Examples of such a polymerizable group include a group including an ethylenically unsaturated bond, a cyclic ether group (an epoxy group or an oxetane group), and a methylol group. In particular, a group having an ethylenically unsaturated bond is preferred, a (meth)acryloyl group is more preferable, and a (meth)acryloyl group derived from glycidyl(meth)acrylate and 3,4-epoxy-cyclohexylmethyl(meth)acrylate is still more preferable.

Furthermore, Q is preferably a group having 1 to 20 carbon atoms, more preferably a group having 2 to 10 carbon atoms, and still more preferably —$CH_2$—CH(-*L)— or —$CH_2$—C(-*L)($CH_3$)— (*L represents a position bonding to L in General Formula (1)).

Specific examples thereof include groups having structures having one addition-polymerizable unsaturated bond, selected from a vinyl ether, vinyl ester, and the like, which have acrylic acid, methacrylic acid, acrylic ester, methacrylic ester, acrylamide, methacrylamide, or allyl structures, and preferably groups having acrylic ester, methacrylic ester, acrylamide, methacrylamide, allyl, and vinyl ester structures.

L represents a single bond or a divalent linking group. Examples of the divalent linking group include a hydrocarbon group, —NH—, —CO—O—, and a divalent group including a dye structure, an alkylene group having 1 to 20 carbon atoms (preferably an alkylene group having 1 to 10 carbon atoms), an arylene group having 6 to 20 carbon atoms (preferably an arylene group having 6 to 10 carbon atoms), a heterocyclic group having 4 to 20 carbon atoms (preferably a heterocyclic group having 5 to 10 carbon atoms), an alkylsulfonyl group having 1 to 20 carbon atoms (preferably an alkylsulfonyl group having 1 to 10 carbon atoms), an arylsulfonyl group having 6 to 20 carbon atoms (preferably an arylsulfonyl group having 6 to 10 carbon atoms), an alkylcarbonyl group having 1 to 20 carbon atoms (preferably an alkylcarbonyl group having 1 to 10 carbon atoms), an arylcarbonyl group having 6 to 20 carbon atoms (preferably an arylcarbonyl group having 6 to 11 carbon atoms), an alkylamino group having 1 to 20 carbon atoms (preferably an alkylamino group having 1 to 10 carbon atoms), an arylamino group having 6 to 20 carbon atoms (preferably an arylamino group having 6 to 10 carbon atoms), an alkylcarbonyloxy group having 1 to 2 carbon atoms (preferably an alkylcarbonyloxy group having 1 to 10 carbon atoms), and an arylcarbonyloxy group having 6 to 20 carbon atoms (preferably an arylcarbonyloxy group having 6 to 11 carbon atoms). These divalent linking groups are preferably substituted with an electron withdrawing group, and examples of the electron withdrawing group include a halogen atom (a fluorine atom, a chlorine atom, a bromine atom, and an iodine atom), a nitro group, a cyano group, a halogenated alkyl group (for example, a trifluoromethyl group), and a halogenated aryl group.

L is preferably, in the case where Z in General Formula (1) which will be described later is the weakly nucleophilic anionic structure represented by General Formula (2-1), an alkylene group substituted with a fluorine atom (a fluorinated alkylene group), having 1 to 10 carbon atoms.

Z is an anionic structure represented by General Formula (2-1), an anionic structure represented by General Formula (2-2), or an anionic structure represented by the following General Formula (2-3).

*—$Y^1$-$A^1$     General Formula (2-1)

(In General Formula (2-1), * represents a binding site to L in General Formula (1), $Y^1$ represents a fluorinated alkylene group, and $A^1$ represents $SO_3^-$.)

In General Formula (2-1), $Y^1$ represents a fluorinated alkylene group. The fluorinated alkylene group is preferably a fluorinated alkylene group having 1 to 20 carbon atoms, more preferably a fluorinated alkylene group having 1 to 10 carbon atoms, and still more preferably a fluorinated alkylene group having 1 to 6 carbon atoms. Further, it is even still more preferably a perfluoroalkylene group.

*—$Y^2$-$(A^2)_n$     General Formula (2-2)

(In General Formula (2-2), * represents a binding site to L in General Formula (1), and $Y^2$ represents an anion including a boron atom, a carbon atom, a nitrogen atom, or a phosphorus atom.

In the case where $Y^2$ is a boron atom, n is 3, and $A^2$'s are each a halogen atom, a cyano group, an alkyl group containing at least one of a fluorine atom and a cyano group, or an aryl group containing at least one of a fluorine atom and a cyano group, in the case where $Y^2$ is a carbon atom, n is 2, and $A^2$'s are each a halogen atom, a cyano group, an alkyl group containing at least one of a fluorine atom and a cyano group, an aryl group containing at least one of a fluorine atom and a cyano group, an alkylsulfonyl group which may contain at least one of a fluorine atom and a cyano group, or an arylsulfonyl group which may contain at least one of a fluorine atom and a cyano group, and two $A^2$'s may be bonded to each other to form a ring, in the case where $Y^2$ is a nitrogen atom, n is 1, and $A^2$'s are each an alkyl group containing at least one of a fluorine atom and a cyano group, an aryl group containing at least one of a fluorine atom and a cyano group, an alkylsulfonyl group which may contain at least one of a fluorine atom and a cyano group, or an arylsulfonyl group which may contain at least one of a fluorine atom and a cyano group, and in the case where $Y^2$ is a phosphorus atom, n is 1 or 3, and $A^2$'s are each an alkyl group containing at least one of a fluorine atom and a cyano group, an aryl group containing at least one of a fluorine atom and a cyano group, an alkylsulfonyl group which may contain at least one of a fluorine atom and a cyano group, or an arylsulfonyl group which may contain at least one of a fluorine atom and a cyano group.)

In the case where $Y^2$ is a boron atom, $A^2$'s are each preferably an aryl group substituted with a fluorine atom, a fluorinated alkyl group having 1 to 10 carbon atoms (preferably a perfluoroalkyl group having 1 to 6 carbon atoms), a fluorinated aryl group having 6 to 10 carbon atoms (preferably a perfluoroaryl group having 6 to 9 carbon atoms), or a fluorinated alkyl group having 1 to 10 carbon atoms (preferably a perfluoroalkyl group having 1 to 6 carbon atoms).

In the case where $Y^2$ is a carbon atom, $A^2$'s are each preferably an alkyl group, an aryl group, an alkylsulfonyl group, or an arylsulfonyl group, which is substituted with a fluorine atom, a cyano group, or any one of the following substituents:

Substituents; A fluorine atom, a cyano group, a fluorinated alkyl group (preferably a perfluoroalkyl group).

More preferably, a fluorinated alkyl group having 1 to 10 carbon atoms (preferably a fluorinated alkyl group having 1 to 6 carbon atoms), a fluorinated aryl group having 6 to 10 carbon atoms (preferably a fluorophenyl group, a difluorophenyl group, a tetrafluorophenyl group, a pentafluorophenyl group), an unsubstituted alkylsulfonyl group having 1 to 10 carbon atoms (preferably an unsubstituted alkylsulfonyl group having 1 to 6 carbon atoms), an unsubstituted arylsulfonyl group having 6 to 10 carbon atoms (preferably a phenylsulfonyl group), a fluorinated alkylsulfonyl group having 1 to 10 carbon atoms (preferably a fluorinated alkylsulfonyl group having 1 to 6 carbon atoms), and a fluorinated arylsulfonyl group having 6 to 10 carbon atoms (preferably a fluorinated phenylsulfonyl group) are preferable; a cyano group, a fluorinated alkyl group, and a fluorinated alkylsulfonyl group are more preferable; and a fluorinated alkylsulfonyl group is still more preferable.

Moreover, two $A^2$'s may be bonded to each other to form a ring, and a structure in which a ring having carbon as a skeleton is substituted with a cyano group, a fluorine atom, or a fluorinated alkyl group is also preferable.

In the case where $Y^2$ is a nitrogen atom, $A^2$'s are each preferably an alkyl group, an aryl group, an alkylsulfonyl group, or an arylsulfonyl group, which is substituted with a fluorine atom, a cyano group, or at least one of the following substituents:

Substituent; A fluorine atom, a cyano group, a fluorinated alkyl group (preferably a perfluoroalkyl group).

A fluorinated alkylsulfonyl group having 1 to 10 carbon atoms (preferably a fluorinated alkylsulfonyl group having 1 to 6 carbon atoms), and a fluorinated arylsulfonyl group having 6 to 10 carbon atoms (preferably a fluorinated phenylsulfonyl group) are more preferable, among which a fluorinated alkylsulfonyl group is preferable.

In the case where $Y^2$ is a phosphorus atom, n is 1 or 3, and $A^2$'s are each preferably an alkyl group, an aryl group, an alkylsulfonyl group, or an arylsulfonyl group, which is substituted with a fluorine atom, a cyano group, or any one of the following substituents:

Substituents; A fluorine atom, a cyano group, a fluorinated alkyl group (preferably a perfluoroalkyl group).

A fluorinated alkylsulfonyl group having 1 to 10 carbon atoms (preferably a fluorinated alkylsulfonyl group having 1 to 6 carbon atoms), and a fluorinated arylsulfonyl group having 6 to 10 carbon atoms (preferably a fluorinated phenylsulfonyl group) are more preferable, among which a fluorinated alkylsulfonyl group is preferable.

n is 1 or 3, and preferably 3.

In the case where Z in General Formulae (2-1) and (2-2) has fluorine atoms, the proportion of fluorine atoms contained in Z with respect to the total number of atoms constituting Z is preferably from 5% to 80%, and more preferably from 10% to 70%.

Among these, Z preferably represents a group represented by General Formula (2-1), a fluorinated alkylsulfonimide group (in General Formula (2-2), $Y^2$ represents a nitrogen atom, and $A^2$ represents a fluorinated alkylsulfonyl group), or a fluorinated alkylsulfonemethide group (in General Formula (2-2), $Y^2$ represents a carbon atom, and $A^2$ represents a fluorinated alkylsulfonyl group).

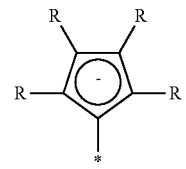

General Formula (2-3)

(In General Formula (2-3), * represents a binding site to L in General Formula (1), and R's each represent a cyano group or a fluorinated alkyl group.)

R's each represent a cyano group or a fluorinated alkyl group, among which a cyano group is preferable.

Specific examples of the repeating unit represented by General Formula (1) used in the present invention are shown below, but the present invention is not limited thereto. Further, the specific examples show the states where a weakly nucleophilic anionic structure is not dissociated, but it is needless to say that a state where a weakly nucleophilic anionic structure is dissociated is also included within the range of the present invention.

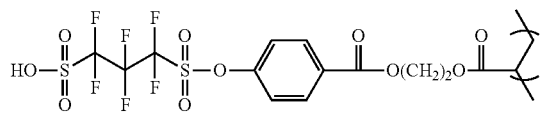

(X-1)

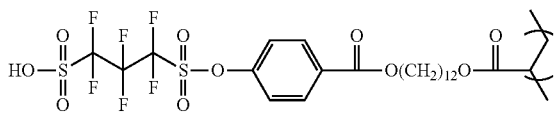

(X-2)

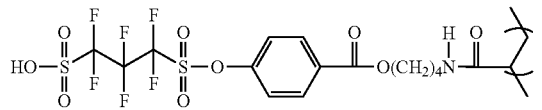

(X-3)

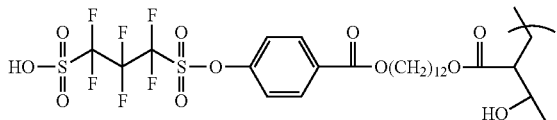

(X-4)

-continued
(X-5) 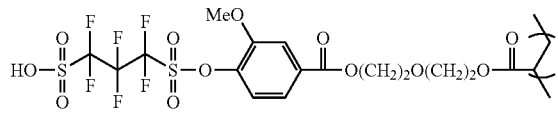
(X-6) 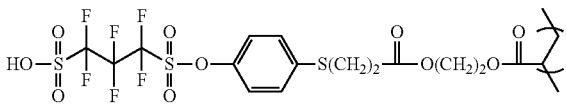
(X-7) 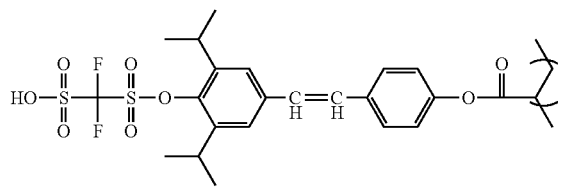
(X-8) 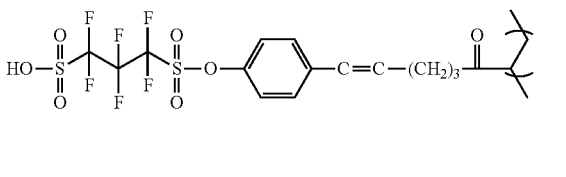
(X-9) 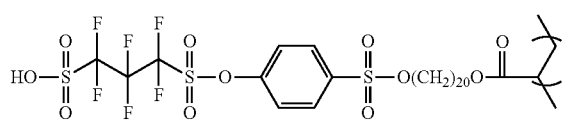
(X-10) 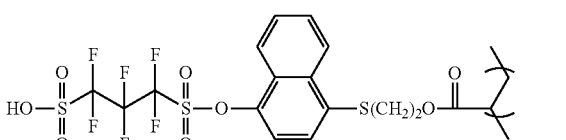
(X-11) 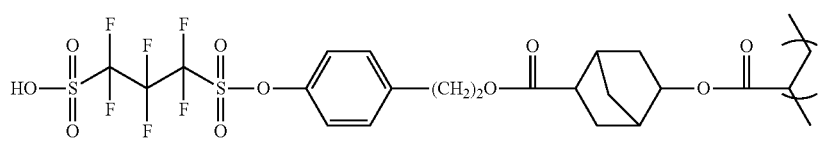
(X-12) 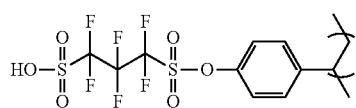
(X-13) 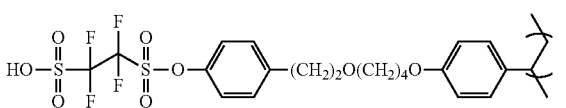
(X-14) 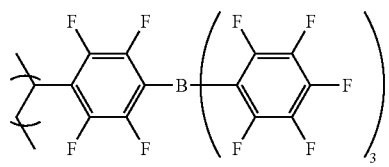
(X-15) 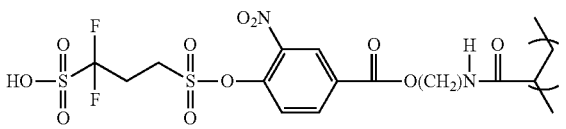
(X-16) 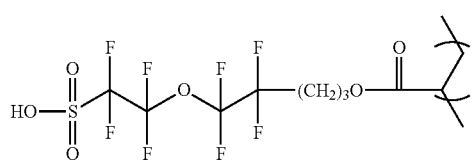
(X-17) 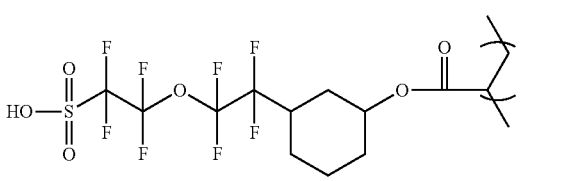
(X-18) 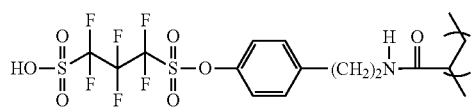
(X-19) 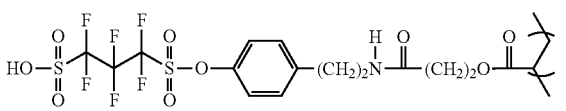
(X-20) 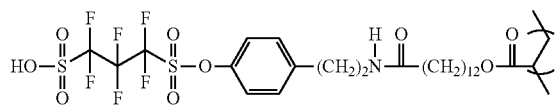
(X-21) 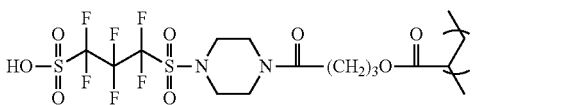

-continued
(X-22) 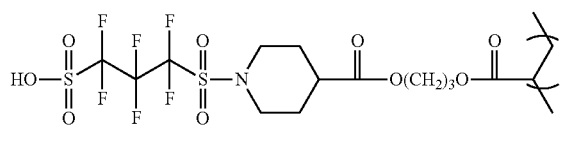
(X-23) 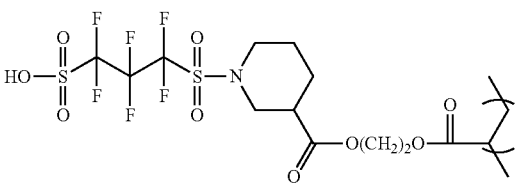
(X-24) 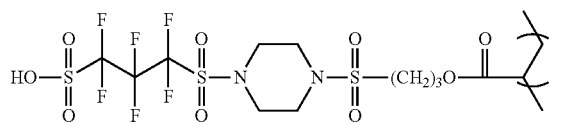
(X-25) 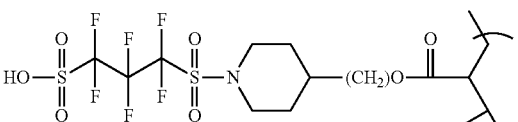
(X-26) 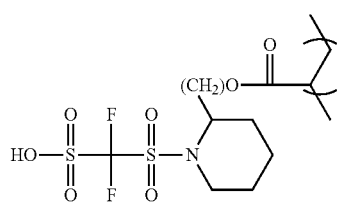
(X-27) 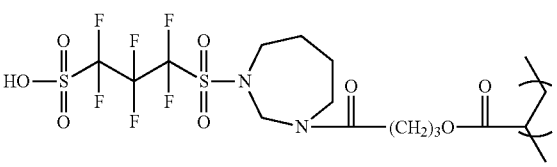
(X-28) 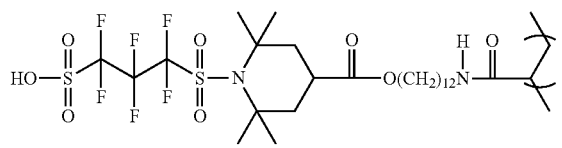
(X-29) 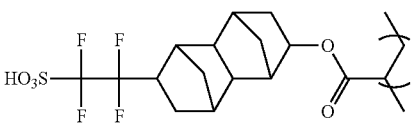
(X-30) 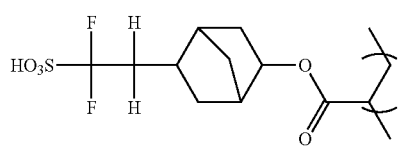
(X-31) 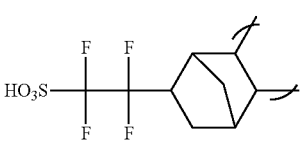
(X-32) 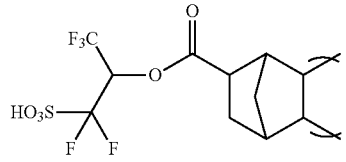
(X-33) 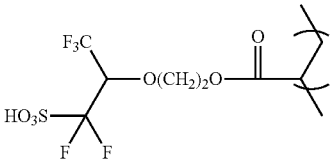
(X-34) 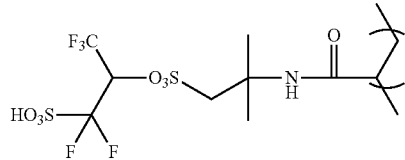
(X-35) 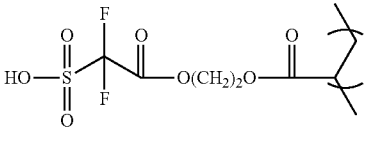
(X-36) 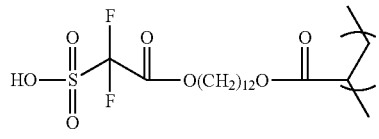
(X-37) 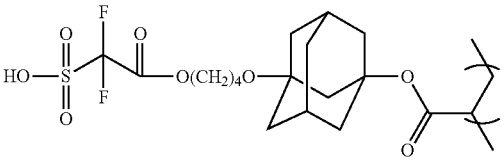

-continued
(X-38) 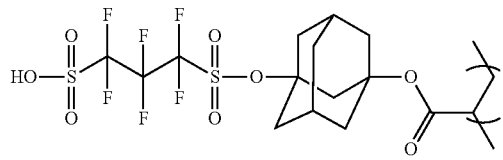
(X-39) 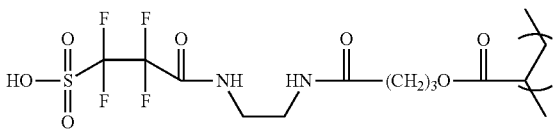
(X-40) 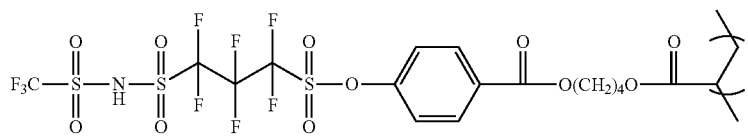
(X-41) 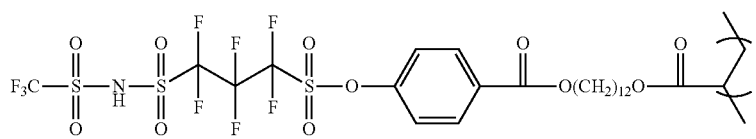
(X-42) 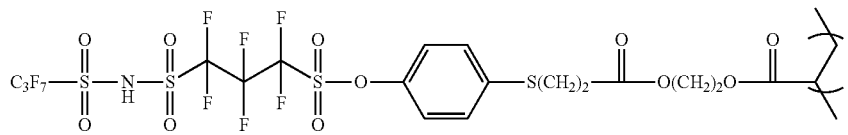
(X-43) 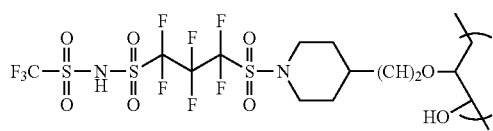
(X-44) 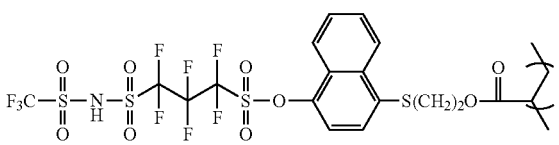
(X-45) 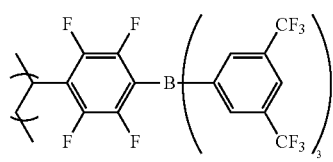
(X-46) 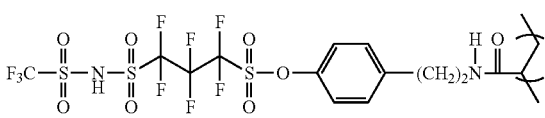
(X-47) 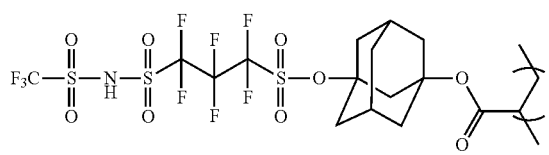
(X-48) 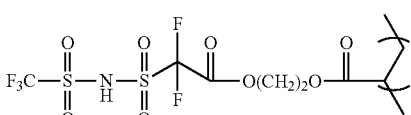
(X-49) 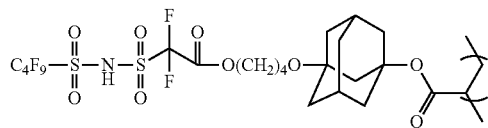
(X-50) 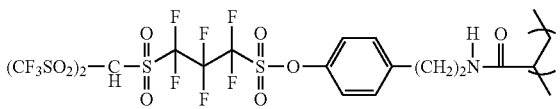
(X-51) 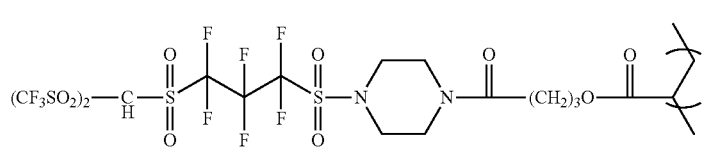
(X-52) 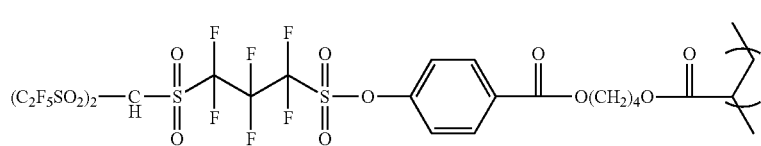

-continued
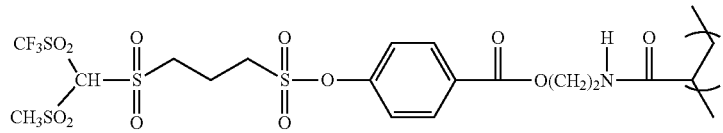 (X-53)
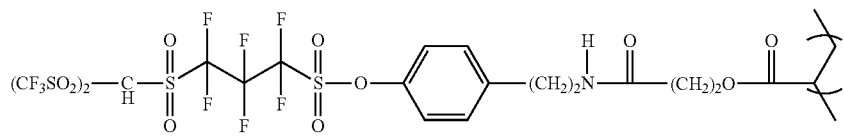 (X-54)
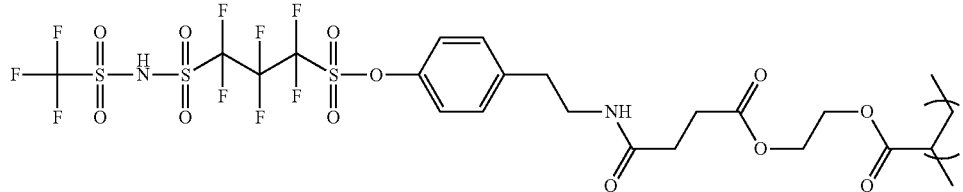 (X-55)
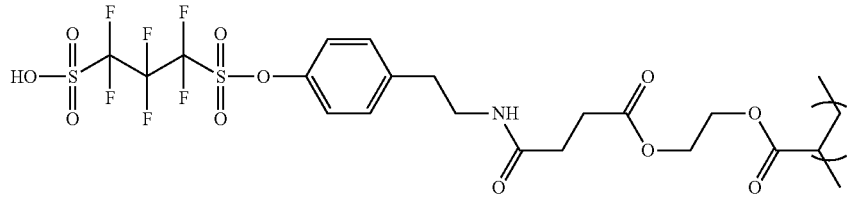 (X-56)
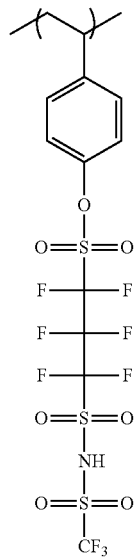 (X-57)
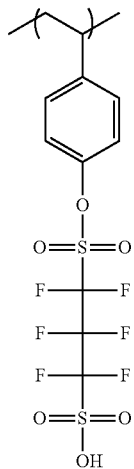 (X-58)

-continued
(X-59)
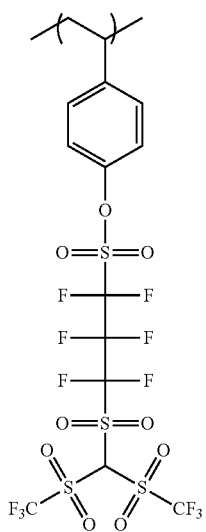
(X-60)
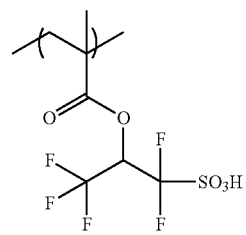
(X-61)
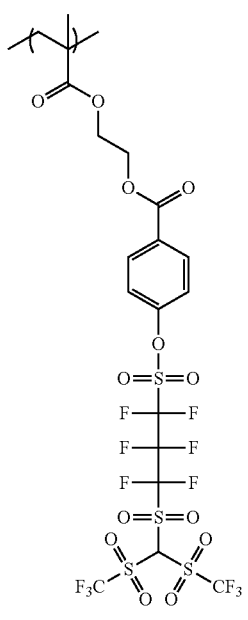
(X-62)
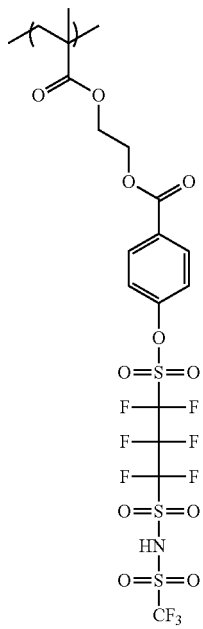
(X-63)
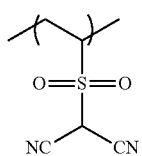
(X-64)
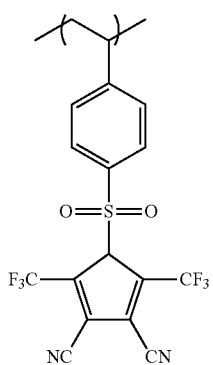

(X-65)
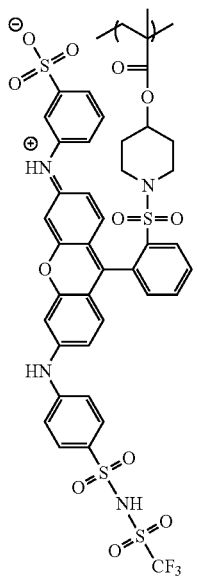
(X-66)
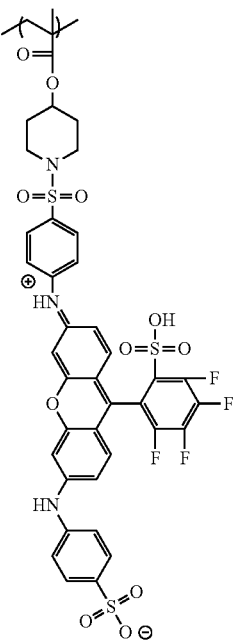
(X-67)
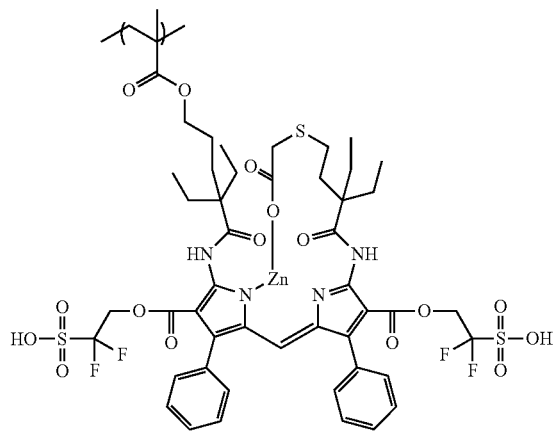
(X-68)
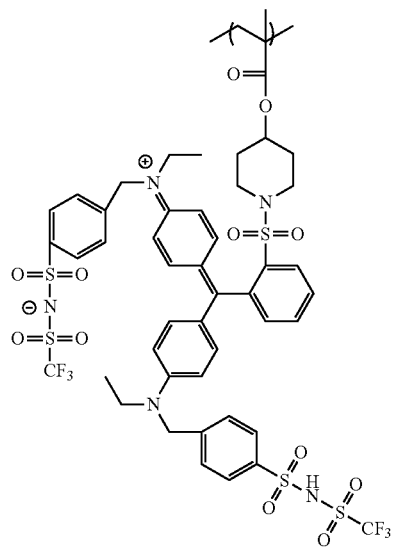

-continued

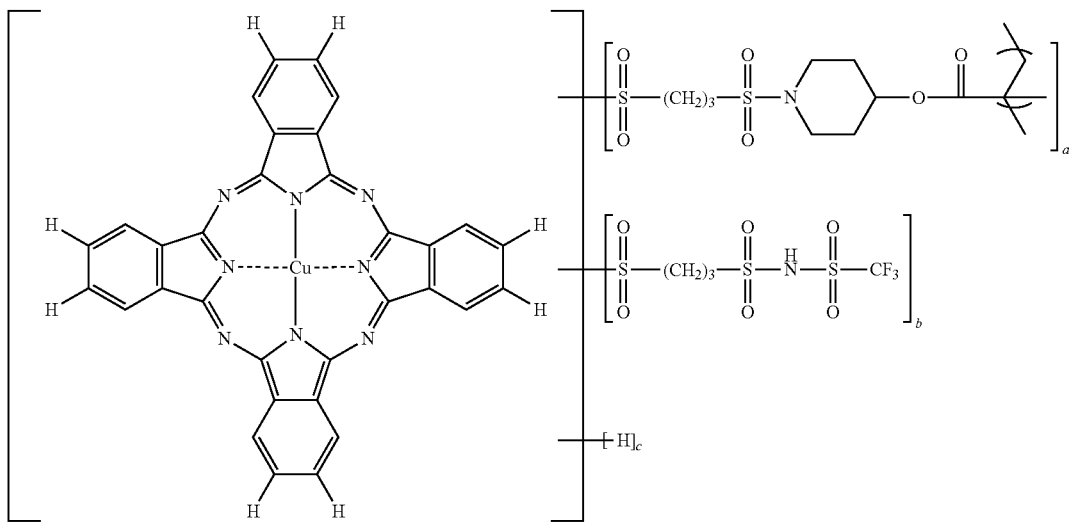

(X-69)

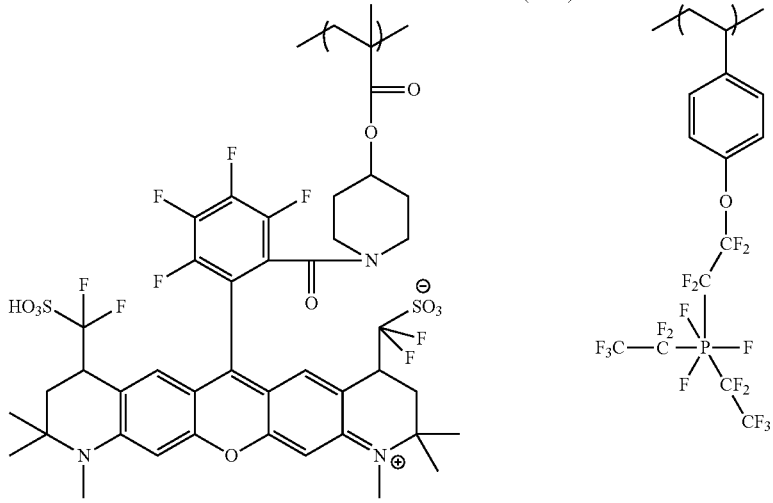

(X-70)

(X-71)

(X-71)

In (X-69), a=3, b=1, and c=4.

It is predicted that the pKa of the fluorinated alkylsulfonic acids represented by (X-1) to (X-13) should be lower than the pKa of sulfuric acid from the viewpoint that the pKa of $CF_3SO_3H$ is −11.4.

It is predicted that the pKa of the fluorinated alkylsulfonimides represented by (X-40) to (X-44) should be lower than the pKa of sulfuric acid from the viewpoint that the pKa of $CF_3$—$SO_2$—NH—$SO_2$—$CF_3$ is −11.9.

It is predicted that the pKa of the fluorinated alkylsulfonemethides represented by (X-59) and (X-61) should be lower than the pKa of sulfuric acid from the viewpoint that the pKa of $(CF_3SO_2)_3$—CH is −16.4.

It is predicted that the pKa of the tetrafluorinated arylborates represented by (X-14) and (X-15) should be lower than the pKa of sulfuric acid from the viewpoint that the sulfuric acid anion is anion-exchanged with a cationic dye becoming a counter salt.

It is predicted that all of the anions of (X-1) to (X-72) should have a lower pKa than the pKa of sulfuric acid from the viewpoint that the sulfuric acid anion is immediately anion-exchanged with a cationic dye becoming a counter salt, even though they have structures not described in J. Org. Chem. 2011, 76, 391-395.

<<Cation Having Dye Structure>>

The cation having a dye structure used in the present invention usually has a dye structure of which a maximum absorption wavelength is present in a range of 400 nm to 780 nm (dye structure) in the molecular structure. This partial structure may be a monomer or a multimer, but is usually a monomer, a dimer, or a trimer, and preferably a monomer.

In the present invention, one kind or two or more kinds of cation may be included in the cation having a dye structure.

Dye Structure

The dye structure is not particularly limited as long as it has a cation site in a molecule thereof, and various structures including known dye structures can be applied. Specific examples of the dye structure include dye structures derived from a dye selected from a dipyrromethene dye, a carbonium dye (a diphenylmethane dye, a triarylmethane dye, a xanthene dye, an acridine dye, and the like), a polymethine dye (an oxonol dye, a merocyanine dye, an arylidene dye, a styryl dye, a cyanine dye, a squarylium dye, a croconium dye, and the like), a subphthalocyanine dye, and metal complex dyes of these.

Among these dye structures, from the viewpoint of color characteristics, dye structures derived from a dye selected from a dipyrromethene dye, a carbonium dye, and a polymethine dye are preferable, dye structures derived from a dye selected from a triarylmethane dye, a xanthene dye, a cyanine dye, a squarylium dye, a quinophthalone dye, a phthalocyanine dye, and a subphthalocyanine dye are more preferable, dye structures derived from a dye selected from a dipyrromethene dye, a triarylmethane dye, a xanthene dye, a cyanine dye, and a squarylium dye are still more preferable, and dye structures derived from a dye selected from xanthene dyes are particularly preferable. There is a tendency that when cations having the dye structure are used, the heat resistance and the light fastness are further improved.

Specific dye compounds which can form a dye structure are described in "New Edition of Dye Handbook" (edited by The Society of Synthetic Organic Chemistry, Japan; Maruzen Co., Ltd., 1970), "Color index" (edited by The Society of Dyers and colourists), "Dye Handbook" (edited by Ogawara et al.; Kodansha, Ltd., 1986), and the like.

In the cation having a dye structure, a particularly preferred dye (dye compound) which can form a dye structure will be described in detail.

<<<Dipyrromethene Dye>>>

One of the embodiments of the dye structure according to the present invention is a dipyrromethene dye structure shown below.

As the dipyrromethene dye in the present invention, a dipyrromethene compound and a dipyrromethene metal complex compound obtained from a dipyrromethene compound with a metal or a metal compound are preferable.

Furthermore, in the present invention, a compound having a dipyrromethene structure is referred to as a dipyrromethene compound, and a complex in which the compound having a dipyrromethene structure is coordinated to a metal or a metal compound is referred to as a dipyrromethene metal complex compound.

As the dipyrromethene metal complex compound, a dipyrromethene metal complex compound obtained from a dipyrromethene compound represented by the following General Formula (M) with a metal or a metal compound and a tautomer thereof are preferable. Among these, a dipyrromethene metal complex compound represented by the following General Formula (7) and a dipyrromethene metal complex compound represented by the following General Formula (8) are exemplified as preferred embodiments, and the dipyrromethene metal complex compound represented by General Formula (8) is more preferable.

Dipyrromethene Metal Complex Compound Obtained from Dipyrromethene Compound Represented by General Formula (M) with Metal or Metal Compound, and Tautomer Thereof One of the preferred embodiments of the dye structure is a dye structure which contains a complex (hereinafter appropriately referred to as a "specific complex") in which a compound (dipyrromethene compound) represented by the following General Formula (M) or a tautomer thereof is coordinated to a metal or a metal compound. In the present invention, the following compound forms a cationic structure, and for example, a metal such as zinc, bonded to a nitrogen atom of General Formula (M) can form a cationic structure.

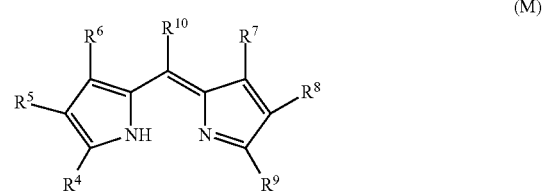

(M)

(In General Formula (M), $R^4$ to $R^{10}$ each independently represent a hydrogen atom or a monovalent substituent, provided that there is no case where $R^4$ and $R^9$ are bonded to each other to form a ring.)

When the compound represented by General Formula (M) is introduced into the structural unit represented by General Formula (1), the introduction site is not particularly limited. However, in view of synthesis suitability, the compound is preferably introduced at any one site of $R^4$ to $R^9$, more preferably introduced at any one site of $R^4$, $R^6$, $R^7$, and $R^9$, and still more preferably introduced at any one site of $R^4$ and $R^9$.

In the case where $R^4$ to $R^9$ in General Formula (M) represent a monovalent substituent, examples of the monovalent substituent include the substituents exemplified in the section of the substituent group A which will be described later.

In the case where the monovalent substituent represented by $R^4$ to $R^9$ in General Formula (M) is a group which can be further substituted, the group may further have the substituents described for $R^4$ to $R^9$, and in the case where the group has two or more substituents, these substituents may be the same as or different from each other.

In General Formula (M), $R^4$ and $R^5$, $R^5$ and $R^6$, $R^7$ and $R^8$, and $R^8$ and $R^9$ may be each independently bonded to each other to form a 5-, 6-, or 7-membered saturated or unsaturated ring, provided that there is no case where $R^4$ and $R^9$ are bonded to each other to form a ring. In the case where the formed 5-, 6-, or 7-membered ring is a group which can be further substituted, the ring may be substituted with the substituents described for $R^4$ to $R^9$, and in the case where the ring is substituted with two or more substituents, these substituents may be the same as or different from each other.

In General Formula (M), in the case where $R^4$ and $R^5$, $R^5$ and $R^6$, $R^7$ and $R^8$, and $R^8$ and $R^9$ are each independently bonded to each other to form a 5-, 6-, or 7-membered saturated or unsaturated ring not having a substituent, examples of the 5-, 6-, or 7-membered saturated or unsaturated ring not having a substituent include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring, and preferably a benzene ring and a pyridine ring.

$R^{10}$ in General Formula (M) preferably represents a hydrogen atom, a halogen atom, an alkyl group, an aryl group, or a heterocyclic group. The halogen atom, the alkyl group, the aryl group, and the heterocyclic group have the same definitions as those of the halogen atom, the alkyl group, the aryl group, and the heterocyclic group, respectively, of the substituent group A which will be described later, and a preferred range thereof is also the same.

In the case where $R^{10}$ represents an alkyl group, an aryl group, or a heterocyclic group, if the alkyl group, the aryl group, and the heterocyclic group are groups which can be further substituted, they may be substituted with the substituents described in the section of the substituent group A which will be described later. In the case where the groups are substituted with two or more substituents, the substituents may be the same as or different from each other.

~Metal or Metal Compound~

The specific complex in the present invention is a complex in which the dipyrromethene compound represented by General Formula (M) or a tautomer thereof is coordinated to a metal or a metal compound.

Here, the metal or metal compound may be any type of metal or metal compound as long as they can form a complex, and examples thereof include a divalent metal atom, a divalent metal oxide, a divalent metal hydroxide, and a divalent metal chloride. Examples of the metal or metal compound include metals such as Zn, Mg, Si, Sn, Rh, Pt, Pd, Mo, Mn, Pb, Cu, Ni, Co, and Fe, metal chlorides such as AlCl, Cl, FeCl, $TiCl_2$, $SnCl_2$, $SiCl_2$, and $GeCl_2$, metal oxides such as TiO and VO, and metal hydroxides such as $Si(OH)_2$.

Among these, in view of the stability, spectral characteristics, heat resistance, light fastness, and production suitability of the complex, Fe, Zn, Mg, Si, Pt, Pd, Mo, Mn, Cu, Ni, Co, TiO, or VO is preferable, Zn, Mg, Si, Pt, Pd, Cu, Ni, Co, or VO is more preferable, and Zn is particularly preferable.

Next, a more preferred range of the specific complex of the compound represented by General Formula (M) in the present invention will be described.

A preferred range of the specific complex in the present invention is a range in which in General Formula (M), $R^4$ and $R^9$ are each independently a hydrogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an amino group, an anilino group, a heterocyclic amino group, a carbonamide group, a ureido group, an imide group, an alkoxycarbonylamino group, an aryloxycarbonylamino group, a sulfonamide group, an azo group, an alkylthio group, an arylthio group, a heterocyclic thio group, an alkylsulfonyl group, an arylsulfonyl group, or a phosphinoylamino group; $R^5$ and $R^8$ are each independently a hydrogen atom, a halogen atom, an alkyl group, an alkenyl group, an aryl group, a heterocyclic group, a hydroxyl group, a cyano group, a nitro group, an alkoxy group, an aryloxy group, a heterocyclic oxy group, an acyl group, an alkoxycarbonyl group, an aryloxycarbonyl group, a carbamoyl group, an imide group, an alkoxycarbonylamino group, a sulfonamide group, an azo group, an alkylthio group, an arylthio group, a heterocyclic thio group, an alkylsulfonyl group, an arylsulfonyl group, or a sulfamoyl group; $R^6$ and $R^7$ are each independently a hydrogen atom, a halogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an anilino group, a carbonamide group, a ureido group, an imide group, an alkoxycarbonylamino group, a sulfonamide group, an azo group, an alkylthio group, an arylthio group, a heterocyclic thio group, an alkylsulfonyl group, an arylsulfonyl group, a sulfamoyl group, or a phosphinoylamino group; $R^{10}$ is a hydrogen atom, a halogen atom, an alkyl group, an aryl group, or a heterocyclic group; and the metal or metal compound is Zn, Mg, Si, Pt, Pd, Mo, Mn, Cu, Ni, Co, TiO, or V=O.

A more preferred range of the specific complex in the present invention is a range in which in General Formula (M), $R^4$ and $R^9$ are each independently a hydrogen atom, an alkyl group, an alkenyl group, an aryl group, a heterocyclic group, a cyano group, an acyl group, an alkoxycarbonyl group, a carbamoyl group, an amino group, a heterocyclic amino group, a carbonamide group, a ureido group, an imide group, an alkoxycarbonylamino group, an aryloxycarbonylamino group, a sulfonamide group, an azo group, an alkylsulfonyl group, an arylsulfonyl group, or a phosphinoylamino group; $R^5$ and $R^8$ are each independently an alkyl group, an alkenyl group, an aryl group, a heterocyclic group, a cyano group, a nitro group, an acyl group, an alkoxycarbonyl group, an aryloxycarbonyl group, a carbamoyl group, an imide group, an alkylsulfonyl group, an aryl sulfonyl group, or a sulfamoyl group; $R^6$ and $R^7$ are each independently a hydrogen atom, an alkyl group, an alkenyl group, an aryl group, a heterocyclic group, a cyano group, an acyl group, an alkoxycarbonyl group, a carbamoyl group, a carbonamide group, a ureido group, an imide group, an alkoxycarbonylamino group, a sulfonamide group, an alkylthio group, an arylthio group, a heterocyclic thio group, an alkylsulfonyl group, an arylsulfonyl group, or a sulfamoyl group; $R^{19}$ is a hydrogen atom, a halogen atom, an alkyl group, an aryl group, or a heterocyclic group; and the metal or metal compound is Zn, Mg, Si, Pt, Pd, Cu, Ni, Co, or V=O.

A particularly preferred range of the specific complex in the present invention is a range in which in General Formula (M), $R^4$ and $R^9$ are each a hydrogen atom, an alkyl group, an aryl group, a heterocyclic group, an amino group, a heterocyclic amino group, a carbonamide group, a ureido group, an imide group, an alkoxycarbonylamino group, a sulfonamide group, an azo group, an alkylsulfonyl group, an arylsulfonyl group, or a phosphinoylamino group; $R^5$ and $R^8$ are each independently an alkyl group, an aryl group, a heterocyclic group, a cyano group, an acyl group, an alkoxycarbonyl group, a carbamoyl group, an alkylsulfonyl group, or an arylsulfonyl group; $R^6$ and $R^7$ are each independently a hydrogen atom, an alkyl group, an aryl group, or a heterocyclic group; $R^{10}$ is a hydrogen atom, an alkyl group, an aryl group, or a heterocyclic group; and the metal or metal compound is Zn, Cu, Co, or V=O.

Moreover, a dipyrromethene metal complex compound represented by General Formula (7) or (8), which will be described in detail below, is also a particularly preferred embodiment of the dipyrromethene dye.

Dipyrromethene Metal Complex Compound Represented by General Formula (7)

One of the suitable embodiments of the dye structure in the cation having a dye structure is a dye structure derived from a dipyrromethene metal complex compound represented by the following General Formula (7). In the present invention, the following compound forms a cationic structure, but for example, Ma of General Formula (7) can form a metal cationic structure such as zinc.

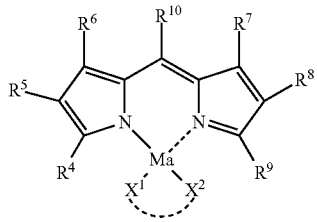

(7)

(In General Formula (7), $R^4$ to $R^9$ each independently represent a hydrogen atom or a monovalent substituent, and $R^{10}$ represents a hydrogen atom, a halogen atom, an alkyl group, an aryl group, or a heterocyclic group. Ma represents a metal atom or a metal compound. $X^1$ represents a group which can be bonded to Ma, $X^2$ represents a group which neutralizes the charge of Ma, and $X^1$ and $X^2$ may be bonded to each other to form a 5-, 6-, or 7-membered ring together with Ma, provided that there is no case where $R^4$ and $R^9$ are bonded to each other to form a ring.)

Incidentally, the dipyrromethene metal complex compound represented by General Formula (7) includes a tautomer.

In the case where the dipyrromethene metal complex compound represented by General Formula (7) is introduced into the structural unit represented by General Formula (1), the introduction site is not particularly limited. However, in view of synthesis suitability, the compound is preferably introduced at any one site of $R^4$ to $R^9$, more preferably introduced at any one site of $R^4$, $R^6$, $R^7$, and $R^9$, and still more preferably introduced at any one site of $R^4$ and $R^9$.

In the case where the cation having a dye structure has an alkali-soluble group, as a method for introducing the alkali-soluble group, a method of bonding the alkali-soluble group to one, two, or more substituents out of $R^4$ to $R^{10}$, $X^1$ and $X^2$ in General Formula (7) can be used. Among these substituents, any one of $R^4$ to $R^9$ and $X^1$ is preferable, any one of $R^4$, $R^6$, $R^7$, and $R^9$ is more preferable, and any one of $R^4$ and $R^9$ is still more preferable.

The dipyrromethene metal complex compound represented by General Formula (7) may have a functional group other than the alkali-soluble group as long as the effects of the present invention are not diminished.

$R^4$ to $R^9$ in General Formula (7) have the same definitions as $R^4$ to $R^9$ in General Formula (M), and preferred embodiments thereof are also the same.

In General Formula (7), Ma represents a metal atom or a metal compound. The metal atom or metal compound may be any type as long as it is a metal atom or a metal compound which can form a complex, and examples thereof include a divalent metal atom, a divalent metal oxide, a divalent metal hydroxide, or a divalent metal chloride.

Examples of the metal atom or metal compound include Zn, Mg, Si, Sn, Rh, Pt, Pd, Mo, Mn, Pb, Cu, Ni, Co, and Fe; metal chlorides such as AlCl, InCl, FeCl, TiCl$_2$, SnCl$_2$, SiCl$_2$, and GeCl$_2$; metal oxides such as TiO and V=O, and metal hydroxides such as Si(OH)$_2$.

Among these, in view of stability, spectral characteristics, heat resistance, light fastness, and production suitability of the complex, as the metal atom or metal compound, Fe, Zn, Mg, Si, Pt, Pd, Mo, Mn, Cu, Ni, Co, TiO, and V=O are preferable, Zn, Mg, Si, Pt, Pd, Cu, Ni, Co, and V=O are more preferable, Zn, Co, V=O, and Cu are still more preferable, and Zn is particularly preferable.

Moreover, in General Formula (7), $R^{10}$ represents a hydrogen atom, a halogen atom, an alkyl group, an aryl group, or a heterocyclic group, and is preferably a hydrogen atom.

In General Formula (7), $X^1$ may be any group as long as the group can be bonded to Ma, and specific examples thereof include water, alcohols (for example, methanol, ethanol, and propanol), and compounds disclosed in "Metal Chelates" ([1] Takeichi Sakaguchi and Kagehira Ueno (1995, Nankodo Co., Ltd.), [2] (1996), [3] (1997), and the like). Among these, in view of production thereof, water, a carboxylic acid compound, and alcohols are preferable, and water and a carboxylic acid compound are more preferable.

In General Formula (7), examples of the "group which neutralizes the charge of Ma" represented by $X^2$ include a halogen atom, a hydroxyl group, a carboxylic acid group, a phosphoric acid group, a sulfonic acid group, and the like. Among these, in view of production thereof, a halogen atom, a hydroxyl group, a carboxylic acid group, and a sulfonic acid group are preferable, and a hydroxyl group and a carboxylic acid group are more preferable.

In General Formula (7), $X^1$ and $X^2$ may be bonded to each other to form a 5-, 6-, or 7-membered ring together with Ma. The formed 5-, 6-, or 7-membered ring may be a saturated or unsaturated ring. In addition, the 5-, 6-, or 7-membered ring may be constituted only with carbon atoms or may form a heterocycle having at least one atom selected from a nitrogen atom, an oxygen atom, or/and a sulfur atom.

In a preferred embodiment of the compound represented by General Formula (7), $R^4$ to $R^9$ each independently represent the groups described as the preferred embodiment of $R^4$ to $R^9$; $R^{10}$ represents the group described as the preferred embodiment of $R^{10}$, Ma is Zn, Cu, Co, or V=O; $X^1$ is water or a carboxylic acid compound; $X^2$ is a hydroxyl group or a carboxylic acid group; and $X^1$ and $X^2$ may be each independently bonded to each other to form a 5- or 6-membered ring.

Dipyrromethene Metal Complex Compound Represented by General Formula (8)

One of suitable embodiments of dye structure in the cation having a dye structure is a dye structure derived from a dipyrromethene metal complex compound represented by the following General Formula (8). In the present invention, the following compound forms a cationic structure, but for example, Ma of General Formula (8) can form a metal cationic structure such as zinc.

(8)

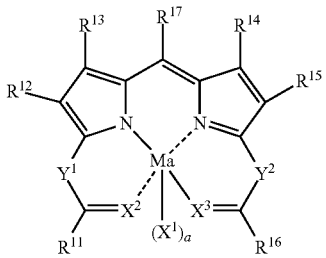

(In General Formula (8), $R^{11}$ and $R^{16}$ each independently represent an alkyl group, an alkenyl group, an aryl group, a heterocyclic group, an alkoxy group, an aryloxy group, an alkylamino group, an arylamino group, or a heterocyclic amino group. $R^{12}$ to $R^{15}$ each independently represent a hydrogen atom or a substituent. $R^{17}$ represents a hydrogen atom, a halogen atom, an alkyl group, an aryl group, or a heterocyclic group. Ma represents a metal atom or a metal compound. $X^2$ and $X^3$ each independently represent NR (in which R represents a hydrogen atom, an alkyl group, an alkenyl group, an aryl group, a heterocyclic group, an acyl group, an alkylsulfonyl group, or an arylsulfonyl group), a nitrogen atom, an oxygen atom, or a sulfur atom. $Y^1$ and $Y^2$ each independently represent $NR^c$ (in which $R^c$ represents a hydrogen atom, an alkyl group, an alkenyl group, an aryl group, a heterocyclic group, an acyl group, an alkylsulfonyl group, or an arylsulfonyl group), a nitrogen atom or a carbon atom. $R^{11}$ and $Y^1$ may be bonded to each other to form a 5-, 6-, or 7-membered ring, and $R^{16}$ and $Y^2$ may be bonded to each other to form a 5-, 6-, or 7-membered ring. $X^1$ represents a group which can be bonded to Ma, and a represents 0, 1, or 2.)

Incidentally, the dipyrromethene metal complex compound represented by General Formula (8) includes a tautomer.

The site at which the dipyrromethene metal complex compound represented by General Formula (8) is introduced into the structural unit represented by General Formula (1) is not particularly limited as long as the effects of the present invention are not diminished. However, the site is preferably at least one of $R^{11}$ to $R^{17}$, $X^1$, $Y^1$ to $Y^2$. Among these, in view of synthesis suitability, it is preferable that the compound is introduced at any one of $R^{11}$ to $R^{16}$ and $X^1$. In a more preferred embodiment, the compound is introduced at any one of $R^{11}$, $R^{13}$, $R^{14}$, and $R^{16}$. In a still more preferred embodiment, the compound is introduced at one of $R^{11}$ and $R^{16}$.

In the case where the cation having a dye structure has an alkali-soluble group, a method in which an alkali-soluble group is incorporated into any one substituent or two or more substituents of $R^{11}$ to $R^{17}$, $X^1$, $Y^1$ to $Y^2$ in General Formula (8) can be used. Among these substituents, any one of $R^{11}$ to $R^{16}$ and $X^1$ is preferable, any one of $R^{11}$, $R^{13}$, $R^{14}$, and $R^{16}$ is more preferable, and any one of $R^{11}$ and $R^{16}$ is still more preferable.

The dipyrromethene metal complex compound represented by General Formula (8) may have a functional group other than the alkali-soluble group as long as the effects of the present invention are not diminished.

In General Formula (8), $R^{12}$ to $R^{15}$ have the same definitions as $R^5$ to $R^8$ in General Formula (M), and preferred embodiments thereof are also the same. $R^{17}$ has the same definition as $R^{10}$ in General Formula (M), and preferred embodiments thereof are also the same. Ma has the same definition as Ma in General Formula (7), and preferred ranges thereof are also the same.

More specifically, among $R^{12}$ to $R^{15}$ in General Formula (8), as $R^{12}$ and $R^{15}$, an alkoxycarbonyl group, an aryloxycarbonyl group, a carbamoyl group, an alkylsulfonyl group, an arylsulfonyl group, a nitrile group, an imide group, and a carbamoylsulfonyl group are preferable, an alkoxycarbonyl group, an aryloxycarbonyl group, a carbamoyl group, an alkylsulfonyl group, a nitrile group, an imide group, and a carbamoylsulfonyl group are more preferable, an alkoxycarbonyl group, an aryloxycarbonyl group, a carbamoyl group, a nitrile group, an imide group, and a carbamoylsulfonyl group are still more preferable, and an alkoxycarbonyl group, an aryloxycarbonyl group, and a carbamoyl group are particularly preferable.

As $R^{13}$ and $R^{14}$, a substituted or unsubstituted alkyl group, a substituted or unsubstituted aryl group, and a substituted or unsubstituted heterocyclic group are preferable, and a substituted or unsubstituted alkyl group and a substituted or unsubstituted aryl group are more preferable. Specific examples of a more preferable alkyl group, aryl group, and heterocyclic group include the same specific examples as listed for $R^6$ and $R^7$ of General Formula (M).

In General Formula (8), $R^{11}$ and $R^{16}$ each represent an alkyl group (a linear, branched, or cyclic alkyl group preferably having 1 to 36 carbon atoms, and more preferably having 1 to 12 carbon atoms, for example, a methyl group, an ethyl group, a propyl group, an isopropyl group, a butyl group, an isobutyl group, a tert-butyl group, a hexyl group, a 2-ethylhexyl group, a dodecyl group, a cyclopropyl group, a cyclopentyl group, a cyclohexyl group, and a 1-adamantyl group), an alkenyl group (an alkenyl group preferably having 2 to 24 carbon atoms, and more preferably having 2 to 12 carbon atoms, for example, a vinyl group, an allyl group, and a 3-buten-1-yl group), an aryl group (an aryl group preferably having 6 to 36 carbon atoms, and more preferably having 6 to 18 carbon atoms, for example, a phenyl group and a naphthyl group), a heterocyclic group (a heterocyclic group preferably having 1 to 24 carbon atoms, and more preferably having 1 to 12 carbon atoms, for example, a 2-thienyl group, a 4-pyridyl group, a 2-furyl group, a 2-pyrimidinyl group, a 2-pyridyl group, a 2-benzothiazolyl group, a 1-imidazolyl group, a 1-pyrazolyl group, and a benzotriazol-1-yl group), an alkoxy group (an alkoxy group preferably having 1 to 36 carbon atoms, and more preferably having 1 to 18 carbon atoms, for example, a methoxy group, an ethoxy group, a propyloxy group, a butoxy group, a hexyloxy group, a 2-ethylhexyloxy group, a dodecyloxy group, and a cyclohexyloxy group), an aryloxy group (an aryloxy group preferably having 6 to 24 carbon atoms, and more preferably having 6 to 18 carbon atoms, for example, a phenoxy group and a naphthyloxy group), an alkylamino group (an alkylamino group preferably having 1 to 36 carbon atoms, and more preferably having 1 to 18 carbon atoms, for example, a methylamino group, an ethylamino group, a propylamino group, a butylamino group, a hexylamino group, a 2-ethylhexylamino group, an isopropylamino group, a tert-butylamino group, a tert-octylamino group, a cyclohexylamino group, an N,N-diethylamino group, an N,N-dipropylamino group, an N,N-dibutylamino group, and an N-methyl-N-ethylamino group), an arylamino group (an arylamino group preferably having 6 to 36 carbon atoms, and more preferably having 6 to 18 carbon atoms, for example, a phenylamino group, a naphthylamino group, an N,N-diphenylamino group, and an N-ethyl-N-phenylamino group), and a heterocyclic amino group (a heterocyclic amino group preferably having 1 to 24 carbon atoms, and more preferably having 1 to 12 carbon atoms, for example, a 2-aminopyrrole group, 3-aminopyrazole, a 2-aminopyridine group, and a 3-aminopyridine group).

Among the above groups, as $R^{11}$ and $R^{16}$, an alkyl group, an alkenyl group, an aryl group, a heterocyclic group, an alkylamino group, an arylamino group, and a heterocyclic amino group are preferable, an alkyl group, an alkenyl group, an aryl group, and a heterocyclic group are more preferable, an alkyl group, an alkenyl group, and an aryl group are still more preferable, and an alkyl group is particularly preferable.

In General Formula (8), in the case where the alkyl group, the alkenyl group, the aryl group, the heterocyclic group, the alkoxy group, the aryloxy group, the alkylamino group, the arylamino group, or the heterocyclic amino group represented by $R^{11}$ and $R^{16}$ is a group which can be further substituted, the group may be substituted with the substituents described in the section of the substituent group A which will be described later. In the case where the group is substituted with two or more substituents, these substituents may be the same as or different from each other.

In General Formula (8), $X^2$ and $X^3$ each independently represent NR, a nitrogen atom, an oxygen atom, or a sulfur atom. Here, R represents a hydrogen atom, an alkyl group (a linear, branched, or cyclic alkyl group preferably having 1 to 36 carbon atoms, and more preferably having 1 to 12 carbon atoms, for example, a methyl group, an ethyl group, a propyl group, an isopropyl group, a butyl group, an isobutyl group, a tert-butyl group, a hexyl group, a 2-ethylhexyl group, a dodecyl group, a cyclopropyl group, a cyclopentyl group, a cyclohexyl group, and a 1-adamantyl group), an alkenyl group (an alkenyl group preferably having 2 to 24 carbon atoms, and more preferably having 2 to 12 carbon atoms, for example, a vinyl group, an allyl group, and a 3-buten-1-yl group), an aryl group (an aryl group preferably having 6 to 36 carbon atoms, and more preferably having 6 to 18 carbon atoms, for example, a phenyl group and a naphthyl group), a heterocyclic group (a heterocyclic group preferably having 1 to 24 carbon atoms, and more preferably having 1 to 12 carbon atoms, for example, a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, and a benzotriazol-1-yl group), an acyl group (an acyl group preferably having 1 to 24 carbon atoms, and more preferably having 2 to 18 carbon atoms, for example, an acetyl group, a pivaloyl group, a 2-ethylhexyl group, a benzoyl group, and a cyclohexanoyl group), an alkylsulfonyl group (an alkylsulfonyl group preferably having 1 to 24 carbon atoms, and more preferably having 1 to 18 carbon atoms, for example, a methylsulfonyl group, an ethylsulfonyl group, an isopropylsulfonyl group, and a cyclohexylsulfonyl group), and an arylsulfonyl group (an arylsulfonyl group preferably having 6 to 24 carbon atoms, and more preferably having 6 to 18 carbon atoms, for example, a phenylsulfonyl group and a naphthylsulfonyl group).

In General Formula (8), $Y^1$ and $Y^2$ each independently represent $NR^c$, a nitrogen atom, or a carbon atom. $R^c$ has the same definition as R of $X^2$ and $X^3$, and the preferred embodiments thereof are also the same.

In General Formula (8), $R^{11}$ and $Y^1$ may be each independently bonded to each other to form a 5-membered ring (for example, a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring, and a benzothiophene ring), a 6-membered ring (for example, a cyclohexane ring, a piperidine ring, a piperazine ring, a morpholine ring, a tetrahydropyran ring, a dioxane ring, a pentamethylene sulfide ring, a dithiane ring, a benzene ring, a pyridazine ring, a quinoline ring, and a quinazoline ring), or a 7-membered ring (for example, a cycloheptane ring and a hexamethylene imine ring) together with a carbon atom.

In General Formula (8), $R^{16}$ and $Y^2$ may be each independently bonded to each other to form a 5-membered ring (for example, a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring, and a benzothiophene ring), a 6-membered ring (for example, a cyclohexane ring, a piperidine ring, a piperazine ring, a morpholine ring, a tetrahydropyran ring, a dioxane ring, a pentamethylene sulfide ring, a dithiane ring, a benzene ring, a piperidine ring, a piperazine ring, a pyridazine ring, a quinoline ring, and a quinazoline ring), or a 7-membered ring (for example, a cycloheptane ring or a hexamethylene imine ring) together with a carbon atom.

In General Formula (8), in the case where the 5-, 6-, and 7-membered rings formed by mutual bonding of $R^{11}$ and $Y^1$ as well as $R^{16}$ and $Y^2$ are substitutable rings, the rings may be substituted with the substituents described in the section of the substituent group A which will be described later. In the case where the rings are substituted with two or more substituents, these substituents may be the same as or different from each other.

In General Formula (8), it is preferable that $R^{11}$ and $R^{16}$ are each independently a monovalent substituent of which an -Es' value as a steric parameter is 1.5 or more. The -Es' value is more preferably 2.0 or more, still more preferably 3.5 or more, and particularly preferably 5.0 or more.

Here, the -Es' value as a steric parameter is a parameter which represents a steric bulkiness of a substituent. As the value, the -Es' values disclosed in the document (J. A. Macphee, et al, Tetrahedron, Vol. 34, pp 3553-3562, and Chemistry Special Edition 107, Structure-activity Correlation and Drug Design, edited by Toshio Fujita, published on Feb. 20, 1986 (Kagaku-Doujin Publishing Company, Inc.)) are used.

In General Formula (8), $X^1$ represents a group which can be bonded to Ma. Specific examples thereof include the same groups as represented by $X^1$ in General Formula (7), and the preferred embodiments are also the same.

a represents 0, 1, or 2.

With respect to a preferred embodiment of the compound represented by General Formula (8), $R^{12}$ to $R^{15}$ are each independently one in the preferred embodiment cited in the description of $R^5$ to $R^8$ in General Formula (M), $R^{17}$ is one in the preferred embodiment cited in the description of $R^{10}$ in General Formula (M), Ma is Zn, Cu, Co, or V=O, $X^2$ is NR (in which R represents a hydrogen atom or an alkyl group), a nitrogen atom, or an oxygen atom, $X^3$ is NR (in which R represents a hydrogen atom or an alkyl group) or an oxygen atom, $Y^1$ is $NR^c$ (in which $R^c$ represents a hydrogen atom or an alkyl group), a nitrogen atom, or a carbon atom, $Y^2$ is a nitrogen atom or a carbon atom, $R^{11}$ and $R^{16}$ are each independently an alkyl group, an aryl group, a heterocyclic group, an alkoxy group, or an alkylamino group, $X^1$ is a group bonded via an oxygen atom, and a is 0 or 1. $R^{11}$ and $Y^1$ may be bonded to each other to form a 5- or 6-membered ring, or $R^{16}$ and $Y^2$ may be bonded to each other to form a 5- or 6-membered ring.

With respect to a more preferred embodiment of the compound represented by General Formula (8), $R^{12}$ to $R^{15}$ are each independently one in the preferred embodiment cited in the description of $R^5$ to $R^8$ in the compound represented by General Formula (M), $R^{17}$ is one in the preferred embodiment cited in the description of $R^{10}$ in General Formula (M), Ma is Zn, $X^2$ independently an alkyl group, an aryl group, a heterocyclic group, an alkoxy group, or an alkylamino group, $X^1$ is a group bonded via an oxygen atom, and a is 0 or 1. $R^{11}$ and $Y^1$ may be bonded to each other to form a 5- or 6-membered ring, or $R^{16}$ and $Y^2$ may be bonded to each other to form a 5- or 6-membered ring.

From the viewpoint of coloring ability, the molar absorption coefficient of the dipyrromethene metal complex compound represented by General Formulae (7) and (8) is preferably as high as possible. Further, from the viewpoint of improving color purity, the maximum absorption wavelength λmax is preferably from 520 nm to 580 nm, and more preferably from 530 nm to 570 nm. If the value is within this range, it is possible to manufacture a color filter having excellent color reproducibility by using the colored composition of the present invention.

Furthermore, an absorbance at the maximum absorption wavelength ($\lambda_{max}$) of the dye having a dye structure derived from a dipyrromethene dye is preferably 1,000 times or more, more preferably 10,000 times or more, and still more preferably 100,000 times or more than the absorbance at 450 nm. If the ratio is within this range, particularly in the case where a blue color filter is manufactured using the colored composition of the present invention, a color filter having a higher transmittance can be formed. Incidentally, the maximum absorption wavelength and the molar absorption coefficient are measured by a Cary 5 spectrophotometer (manufactured by Varian, Inc.).

From the viewpoint of solubility, it is preferable that the melting points of the dipyrromethene metal complex compounds represented by General Formulae (7) and (8) are not too high.

The dipyrromethene metal complex compounds represented by General Formulae (7) and (8) can be synthesized by the methods described in U.S. Pat. No. 4,774,339A, U.S. Pat. No. 5,433,896A, JP2001-240761A, JP2002-155052A, JP3614586B, Aust. J. Chem., 1965, 11, 1835-1845, J. H. Boger, et al., Heteroatom Chemistry, Vol. 1, No. 5, 389 (1990), and the like. Specifically, the method described in paragraphs "0131" to "0157" of JP2008-292970A can be applied.

Specific examples of the dipyrromethene dye are shown below, but the present invention is not limited thereto. Further, in the formulae, X represents a weakly nucleophilic anion.

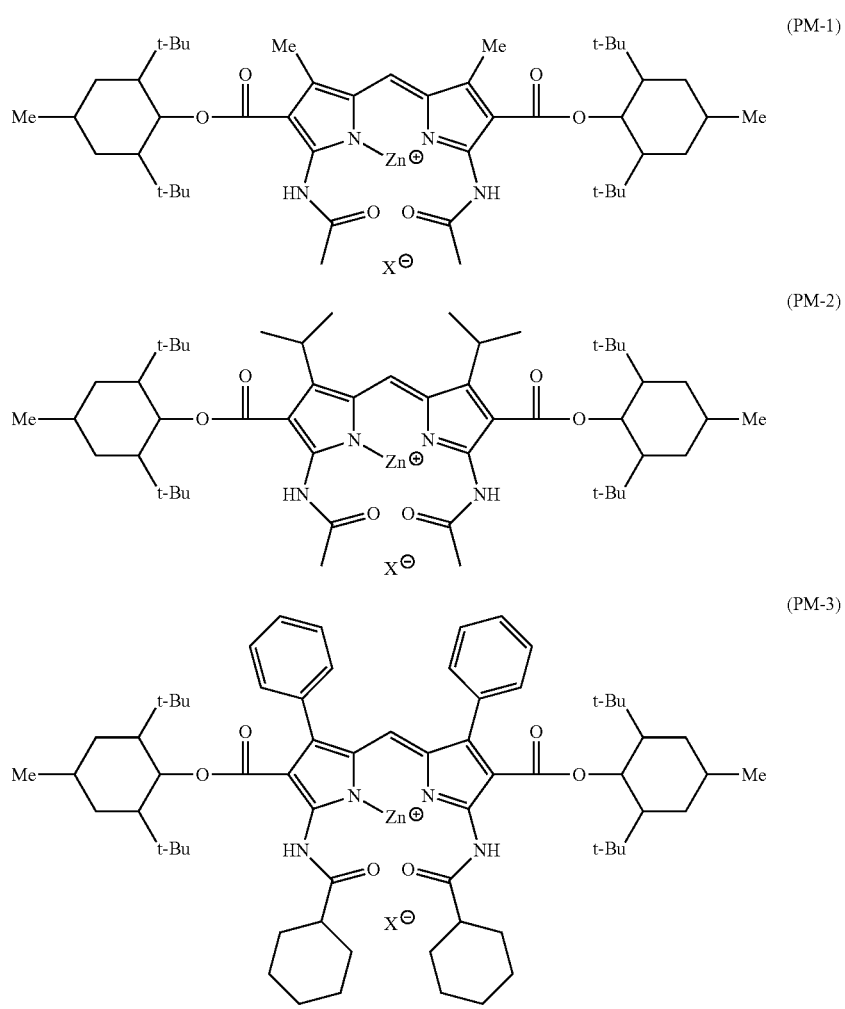

-continued
(PM-4)
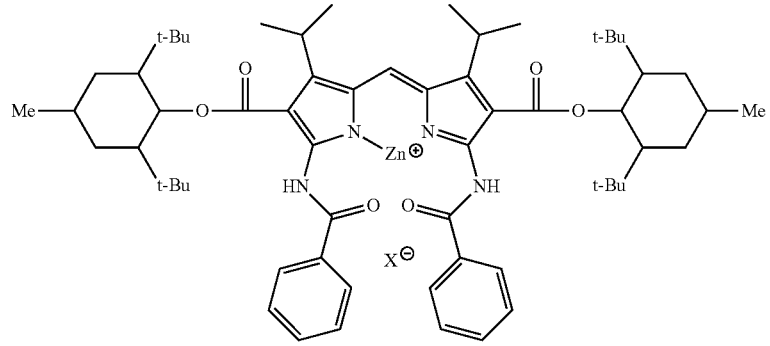
(PM-5)
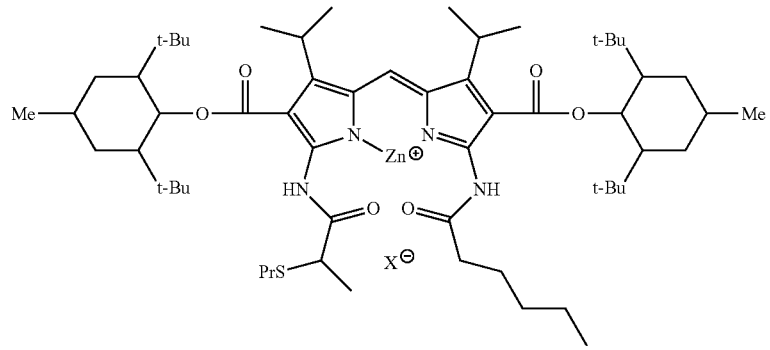
(PM-6)
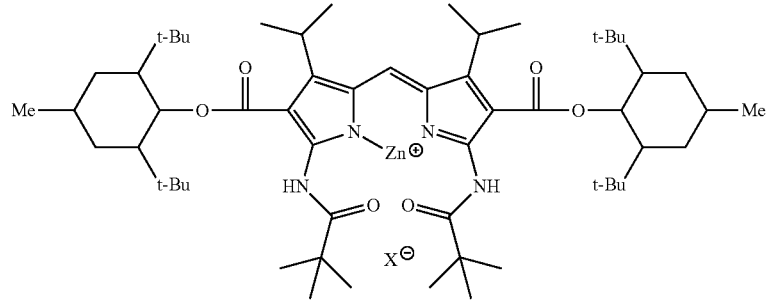
(PM-7)
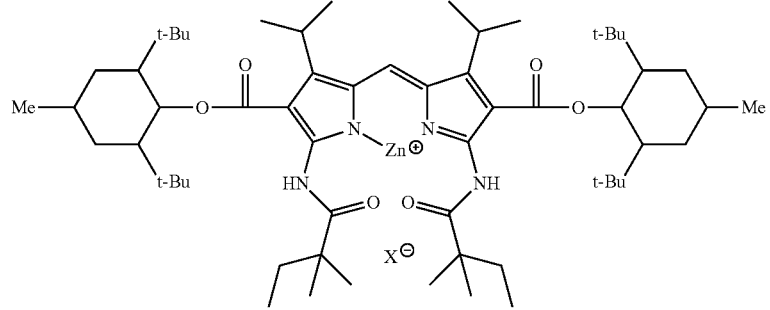

-continued (PM-8)

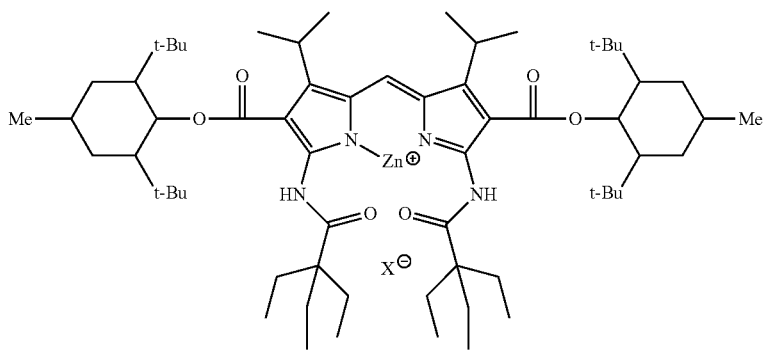

(PM-9)

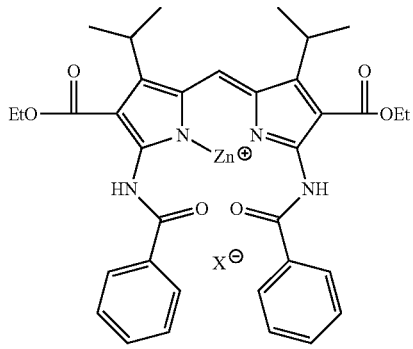

(PM-10)

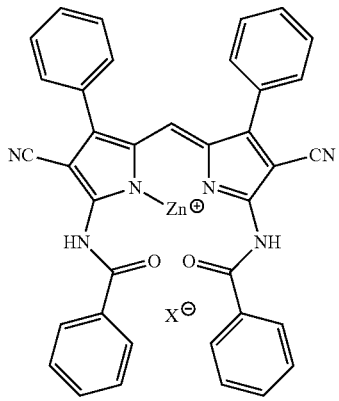

Among the specific examples, (PM-8) and (PM-10) are particularly preferable from the viewpoints of color characteristics and heat resistance.

<<<Carbonium Dye>>>

Among the carbonium dyes, a triarylmethane dye and a xanthene dye are preferable.

Triarylmethane Dye

One of the embodiments of the cation having a dye structure according to the present invention is one having a partial structure derived from a triarylmethane dye (triarylmethane compound). The dye has a partial structure derived from a compound (triarylmethane compound) represented by the following General Formula (TP) as the dye structure. The triarylmethane compounds in the present invention collectively refer to compounds having a dye structure containing a triarylmethane skeleton in a molecule thereof General Formula (TP)

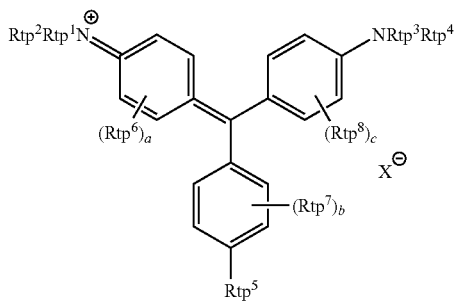

(In General Formula (TP), $Rtp^1$ to $Rtp^4$ each independently represent a hydrogen atom, an alkyl group, or an aryl group. $Rtp^5$ represents a hydrogen atom, an alkyl group, an aryl group, or $NRtp^9Rtp^{10}$ (in which $Rtp^9$ and $Rtp^{10}$ represent a hydrogen atom, an alkyl group, or an aryl group). $Rtp^6$, $Rtp^7$, and $Rtp^8$ represent substituents. a, b, and c represent an integer of 0 to 4. In the case where a, b, and c are 2 or more, $Rtp^6$, $Rtp^7$, and $Rtp^8$ may be linked to each other to form a ring. $X^-$ represents an anionic structure.)

$Rtp^1$ to $Rtp^6$ are preferably a hydrogen atom, a linear or branched alkyl group having 1 to 5 carbon atoms, or a phenyl group. $Rtp^5$ is preferably a hydrogen atom or $NRtp^9Rtp^{10}$, and particularly preferably $NRtp^9Rtp^{10}$. $Rtp^9$ and $Rtp^{10}$ are preferably a hydrogen atom, a linear or branched alkyl group having 1 to 5 carbon atoms, or a phenyl group. As the substituents represented by $Rtp^6$, $Rtp^7$, and $Rtp^8$, the substituents exemplified in the section of the substituent group A which will be described later can be used. In particular, a linear or branched alkyl group having 1 to 5 carbon atoms, an alkenyl group having 1 to 5 carbon atoms, an aryl group having 6 to 15 carbon atoms, a carboxyl group, or a sulfo group is preferable, and a linear or branched alkyl group having 1 to 5 carbon atoms, an alkenyl group having 1 to 5 carbon atoms, a phenyl group, or a carboxyl group is more preferable. In particular, $Rtp^6$ and $Rtp^8$ are preferably an alkyl group having 1 to 5 carbon atoms, and $Rtp^7$ is preferably an alkenyl group (particularly preferably a phenyl group found by linking two adjacent alkenyl groups to each other), a phenyl group, or a carboxyl group.

a, b, or c each independently represents an integer of 0 to 4. In particular, a and b are preferably 0 or 1, and c is preferably 0 to 2.

Specific examples of the compounds represented by General Formula (TP) are shown below, but the present invention is not limited thereto. X represents a weakly nucleophilic anion (which will be the same hereinafter unless otherwise specified).
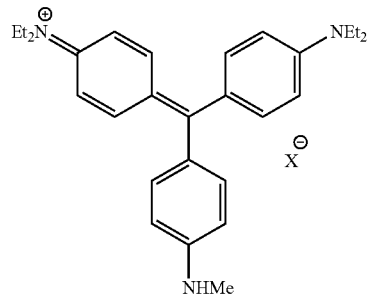
(tp-1)
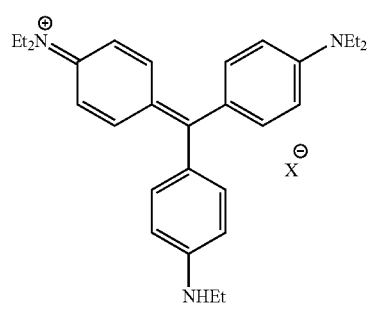
(tp-2)
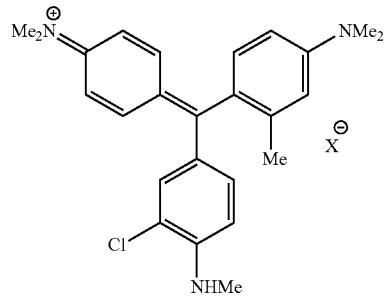
(tp-3)
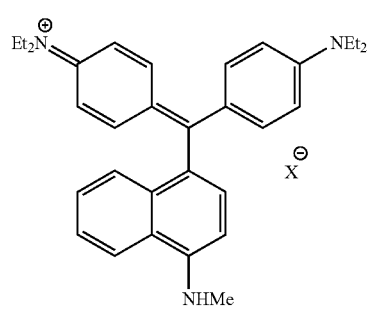
(tp-4)
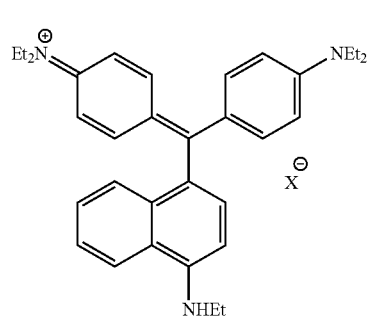
(tp-5)
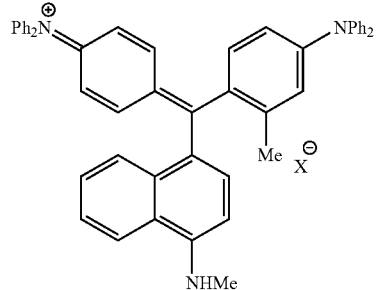
(tp-6)
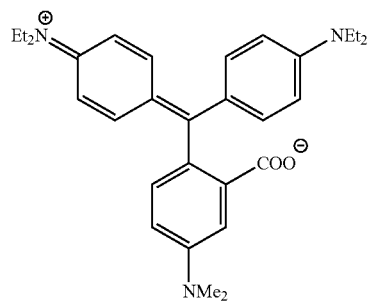
(tp-7)
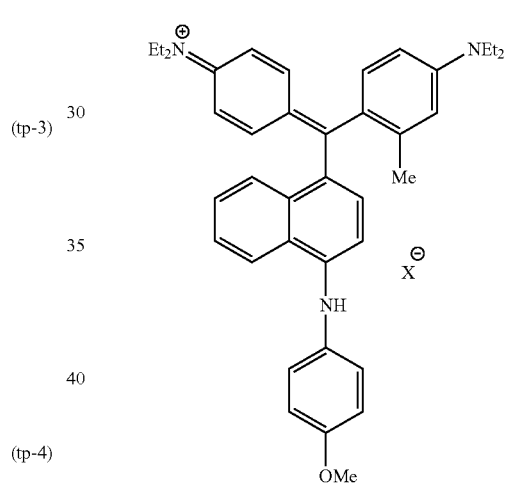
(tp-8)
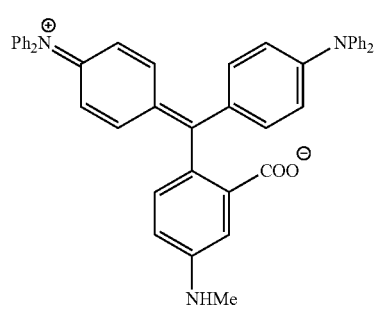
(tp-9)
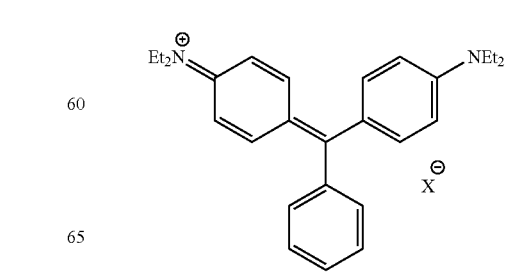
(tp-10)

-continued (tp-11) 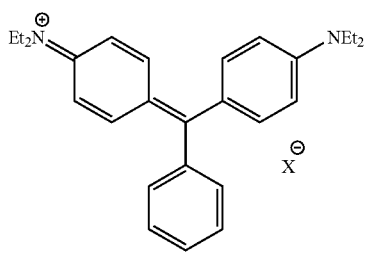

(tp-12) 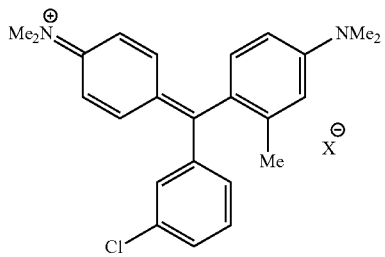

(tp-13) 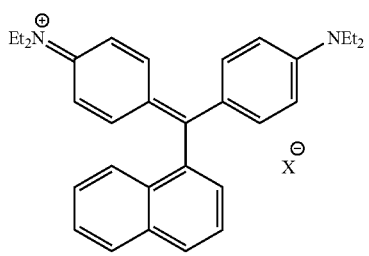

(tp-14) 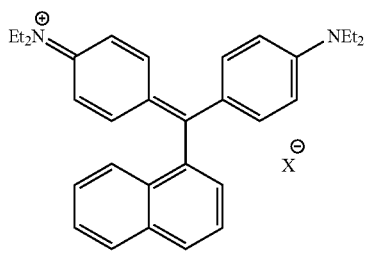

(tp-15) 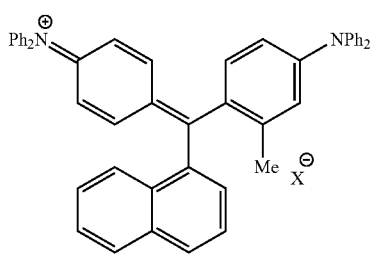

(tp-16) 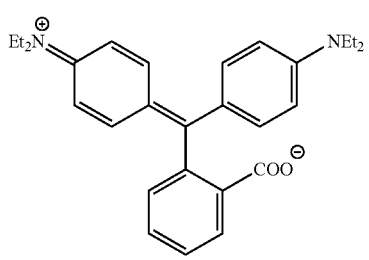

-continued (tp-17) 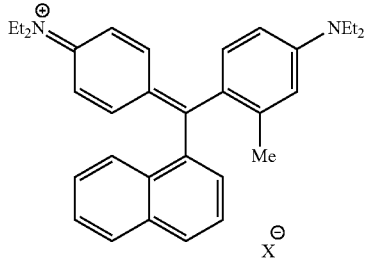

(tp-18) 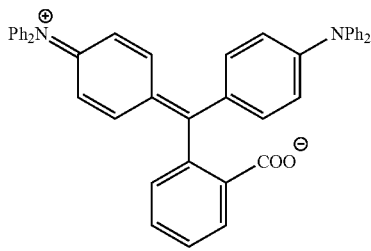

Among the above specific examples, from the viewpoints of color characteristics and heat resistance, (tp-4), (tp-5), (tp-6), and (tp-8) are particularly preferable.

Xanthene Dye

A preferred embodiment of the cation having a dye structure in the present invention is one having a partial structure derived from a xanthene dye (xanthene compound). The dye has a partial structure derived from a xanthene compound represented by the following General Formula (J) as the dye structure.

General Formula (J)

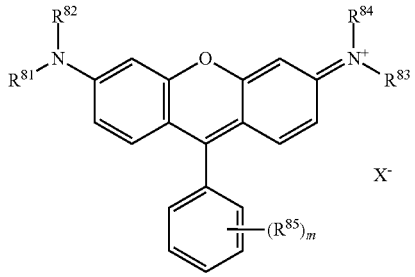

(In General Formula (J), $R^{81}$, $R^{82}$, $R^{83}$, and $R^{84}$ each independently represent a hydrogen atom or a monovalent substituent. $R^{85}$'s each independently represent a monovalent substituent, and m represents an integer of 0 to 5. X⁻ represents an anionic structure.)

The substituents which may be contained in $R^{81}$ to $R^{84}$ and $R^{85}$ in General Formula (J) have the same definitions as the substituents exemplified in the section of the substituent group A which will be described later.

In General Formula (J), $R^{81}$ and $R^{82}$, $R^{83}$ and $R^{84}$, and $R^{85}$'s in a case where m is 2 or more may be each independently bonded to each other to form a 5-, 6-, or 7-membered saturated ring or a 5-, 6-, or 7-membered unsaturated ring. In the case where the formed 5-, 6-, or 7-membered ring is a group which can be further substituted, the ring may be substituted with the substituents described for $R^{81}$ to $R^{85}$. In the case where the ring is substituted with two or more substituents, these substituents may be the same as or different from each other.

In General Formula (J), in the case where $R^{81}$ and $R^{82}$, $R^{83}$ and $R^{84}$, and $R^{85}$'s in a case where m is 2 or more are bonded to each other to form 5-, 6-, and 7-membered saturated rings not having a substituent or form 5-, 6-, and 7-membered unsaturated rings, examples of the 5-, 6-, and 7-membered saturated rings not having a substituent or the 5-, 6-, and 7-membered unsaturated rings include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring, and preferably a benzene ring and a pyridine ring.

$R^{82}$ and $R^{83}$ are particularly preferably a hydrogen atom or a substituted or unsubstituted alkyl group, and $R^{81}$ and $R^{84}$ are particularly preferably a substituted or unsubstituted alkyl group or phenyl group. Further, $R^{85}$ is preferably a halogen atom, a linear or branched alkyl group having 1 to 5 carbon atoms, a sulfo group, a sulfonamide group, a carboxyl group, or an amide group, and more preferably a sulfo group, a sulfonamide group, a carboxyl group, or an amide group. $R^{85}$ is preferably bonded to an adjacent portion of carbon linked to a xanthene ring. The substituent contained in the phenyl group represented by $R^{81}$ and $R^{84}$ is particularly preferably a hydrogen atom, a halogen atom, a linear or branched alkyl group having 1 to 5 carbon atoms, a sulfo group, a sulfonamide group, or a carboxyl group.

The compounds having xanthene skeletons represented by General Formula (J) may be synthesized using methods disclosed in documents. Specifically, the methods disclosed in Tetrahedron Letters, 2003, vol. 44, No. 23, pp. 4355 to 4360; Tetrahedron Letters, 2005, vol. 61, No. 12, pp. 3097 to 3106; and the like can be applied.

Specific examples of the xanthene compounds are shown below, but the present invention is not limited thereto.

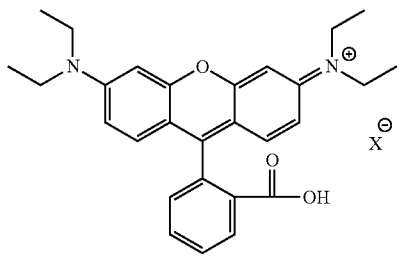

(A-xt-1)

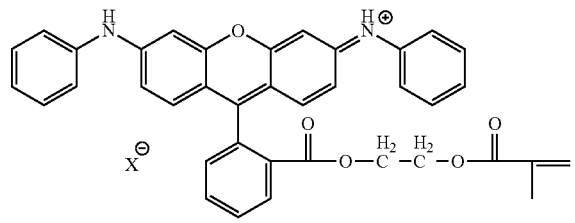

(A-xt-2)

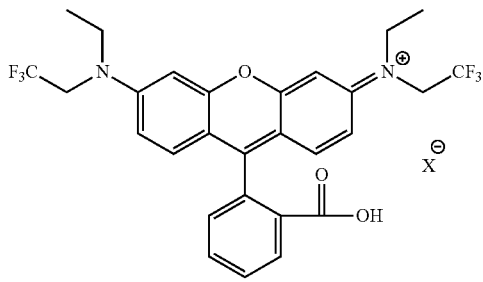

(A-xt-3)

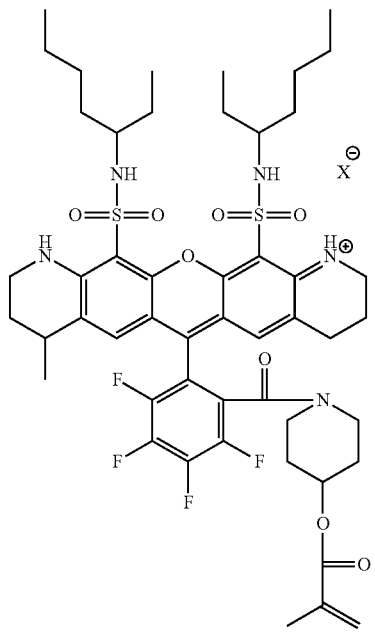

(A-xt-4)

-continued
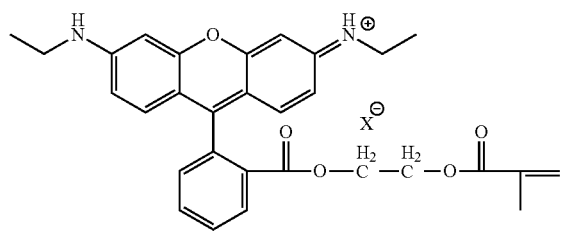
(A-xt-5)
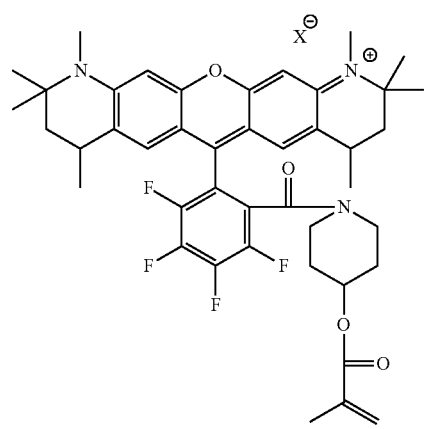
(A-xt-6)
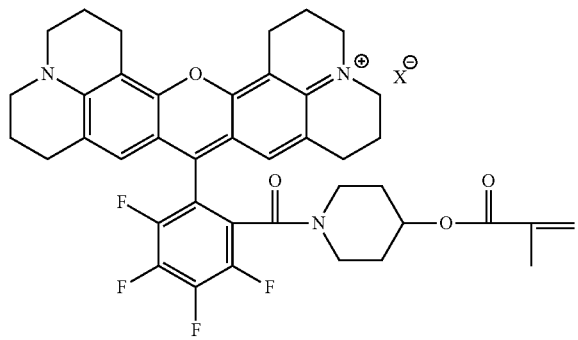
(A-xt-7)
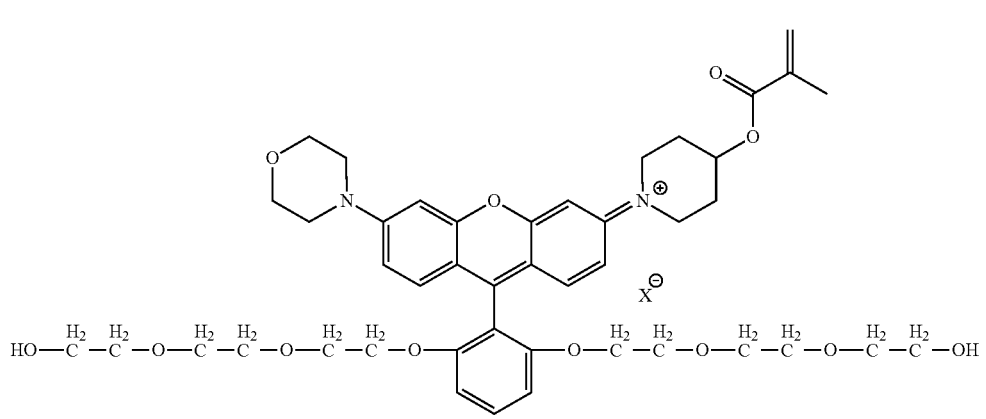
(A-xt-8)
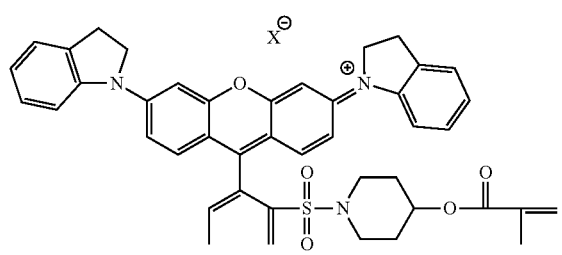
(A-xt-9)
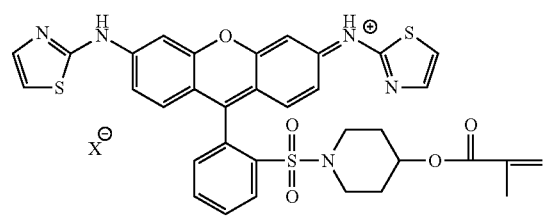
(A-xt-10)

-continued

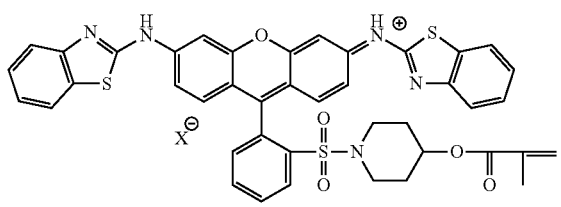
(A-xt-11)

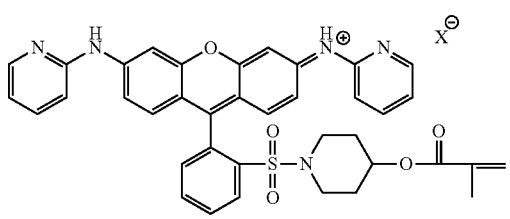
(A-xt-12)

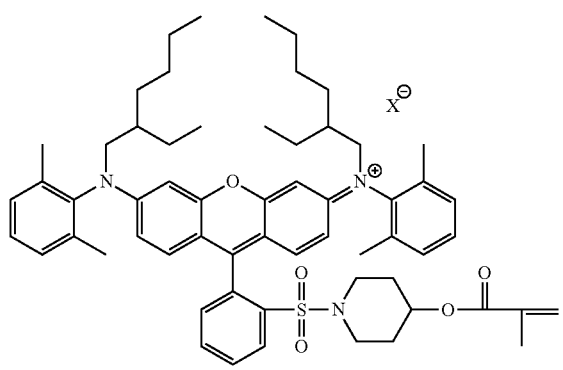
(A-xt-13)

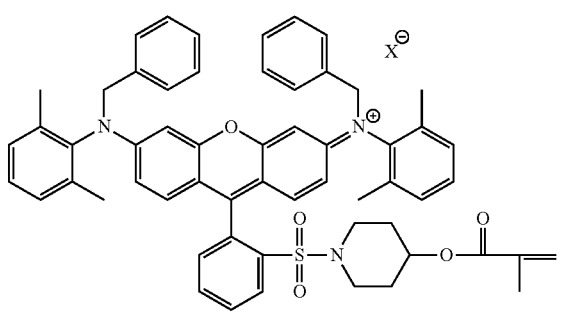
(A-xt-14)

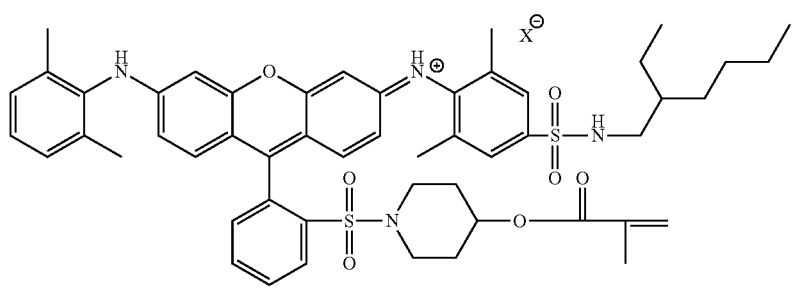
(A-xt-15)

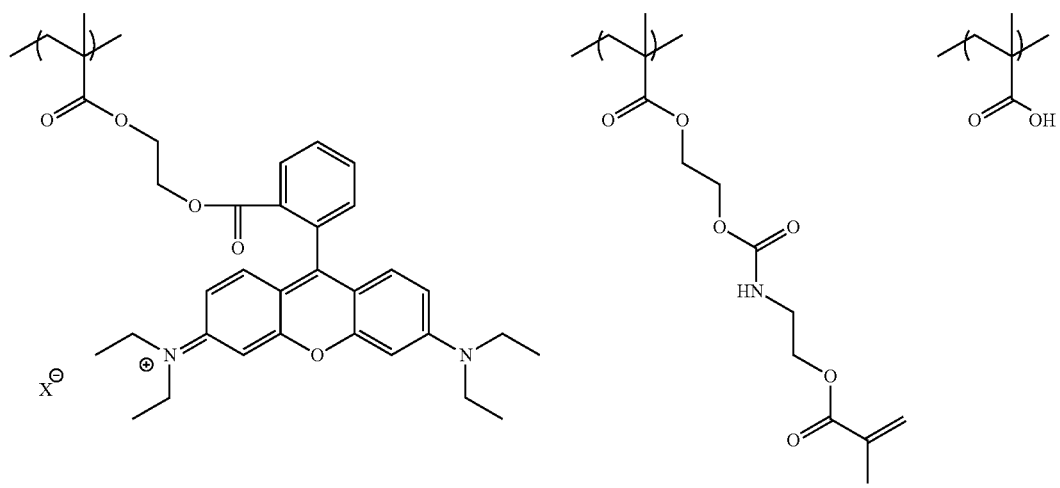
(A-xt-16)

<<<Cyanine Dye>>>

One of the embodiments of a cation having a dye structure according to the present invention is one having a partial structure derived from a cyanine dye (cyanine compound). Examples of the dye include a dye which has a partial structure derived from a compound (cyanine compound) represented by the following General Formula (PM) as the dye structure. The cyanine compounds in the present invention collectively refer to compounds having a dye structure containing a cyanine skeleton in a molecule thereof General Formula (PM)

$$\left[ \underset{Z1}{\bigcirc} -(CH=CH)_{l}-CH= \underset{Z2}{\bigcirc} \right]^{\oplus} X^{\ominus}$$

(In General Formula (PM), a ring Z1 and a ring Z2 each independently represent a heterocycle which may have a substituent. l represents an integer of 0 to 3, and $X^-$ represents an anionic structure.)

Examples of the ring Z1 and the ring Z2 each independently include oxazole, benzoxazole, oxazoline, thiazole, thiazoline, benzothiazole, indolenine, benzoindolenine, and 1,3-thiadiazine.

The substituents which may be contained in the ring Z1 and the ring Z2 are the same substituents as exemplified in the section of the substituent group A which will be described later. $X^-$ represents a weakly nucleophilic anion with non-nucleophilicity.

The compound represented by General Formula (PM) is preferably a compound represented by the following General Formula (PM-2).

General Formula (PM-2)

$$\underset{R^1}{\overset{(R^3)_a}{\underset{Z^5}{\bigcirc}}\overset{A^1}{\underset{N^+}{\bigvee}}}-(CH=CH)_n-CH=\underset{R^2}{\overset{(R^3)_b}{\underset{Z^6}{\bigcirc}}\overset{A^2}{\underset{N}{\bigvee}}} \quad X^-$$

(In General Formula (PM-2), the ring $Z^5$ and the ring $Z^6$ each independently represent a benzene ring which may have a substituent or a naphthalene ring which may have a substituent.)

$X^-$ represents a weakly nucleophilic anionic structure.

n represents an integer of 0 to 3.

$A^1$ and $A^2$ each independently represent an oxygen atom, a sulfur atom, a selenium atom, a carbon atom, or a nitrogen atom.

$R^1$ and $R^2$ each independently represent a monovalent aliphatic hydrocarbon group having 1 to 20 carbon atoms which may have a substituent.

$R^3$ and $R^4$ each independently represent a hydrogen atom, a monovalent aliphatic hydrocarbon group having 1 to 6 carbon atoms, or represent a divalent aliphatic hydrocarbon group having 2 to 6 carbon atoms, which is formed when one $R^3$ and one $R^4$ are combined with each other.

a and b each independently represent an integer of 0 to 2.

Specific examples of the cyanine compound are shown below, but the present invention is not limited thereto. X represents a weakly nucleophilic anion.

(pm-1)

(pm-2)

(pm-3)

(pm-4)

(pm-5)

(pm-6)

(pm-7)

(pm-8)

(pm-9)

(pm-10)

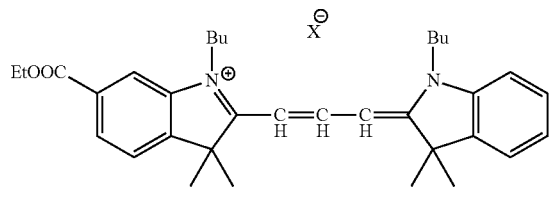

(pm-11)

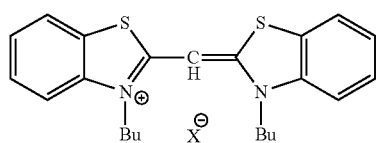

(pm-12)

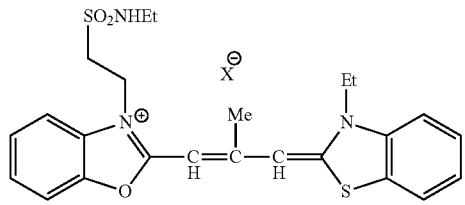

(pm-13)

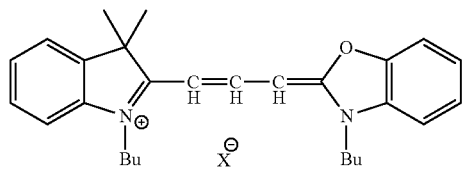

(pm-14)

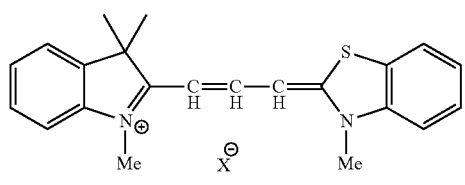

(pm-15)

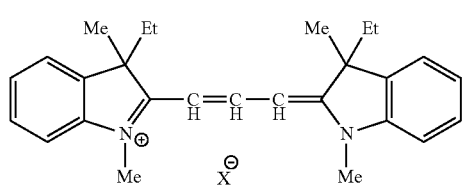

(pm-16)

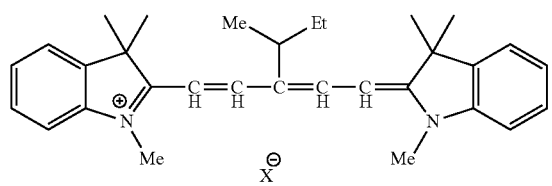

(pm-17)

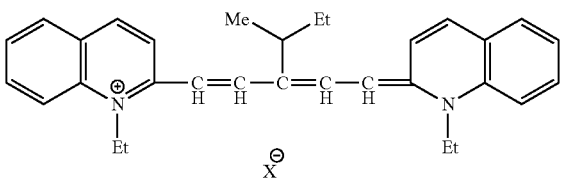

Among the specific examples, structures represented by (pm-1) to (pm-6), and (pm-9) are preferable, and among these, dye structures represented by (pm-1) and (pm-2) are particularly preferable from the viewpoints of color characteristics and heat resistance.

<<<Subphthalocyanine Dye>>>

One of the embodiments of a cation having a dye structure according to the present invention is one having a subphthalocyanine dye structure. Examples of the dye include a dye having a subphthalocyanine dye structure represented by the following General Formula (SP) as a dye structure. The subphthalocyanine dyes in the present invention collectively refer to compounds having a dye structure including a subphthalocyanine skeleton in a molecule thereof. In the present invention, the following compound forms a cationic structure, but, for example, a boron atom in General Formula (SP) can form a cationic structure.

General Formula (SP)

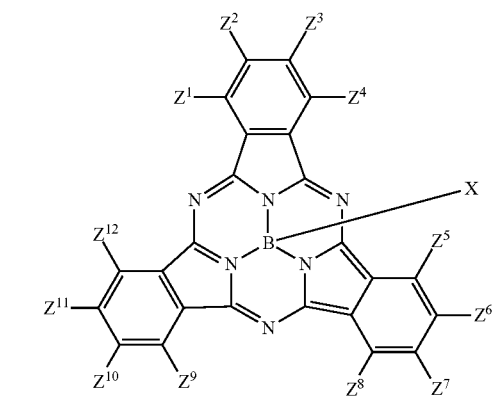

(In General Formula (SP), $Z^1$ to $Z^{12}$ each independently represent a hydrogen atom, an alkyl group, an aryl group, a hydroxyl group, a mercapto group, an amino group, an alkoxy group, an aryloxy group, or a thioether group. X represents a weakly nucleophilic anion with non-nucleophilicity.)

General Formula (SP) will be described in detail.

The alkyl group which may be contained in $Z^1$ to $Z^{12}$ in General Formula (SP) represents a linear or branched substituted or unsubstituted alkyl group. In particular, $Z^1$ to $Z^{12}$ preferably have 1 to 20 carbon atoms, and more preferably have 1 to 10 carbon atoms. Examples of the substituents which may be contained in $Z^1$ to $Z^{12}$ include the substituents exemplified in the section of the substituent group A which will be described later, and among those, a fluorine atom, a hydroxyl group, and a mercapto group are particularly preferable.

Specific examples of the subphthalocyanine dye are shown below, but the present invention is not limited thereto.

(SP-1)
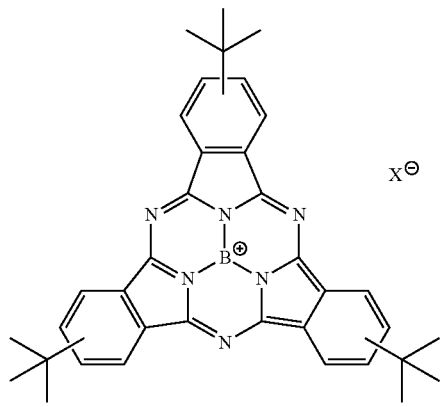
(SP-2)
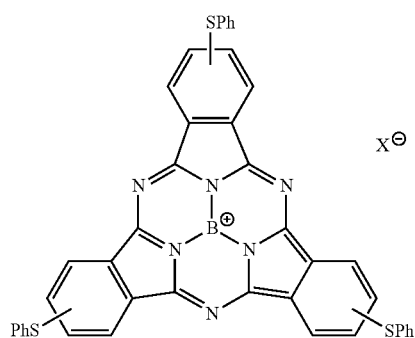
(SP-3)
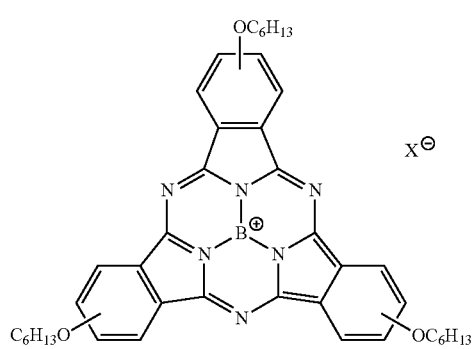
(SP-4)
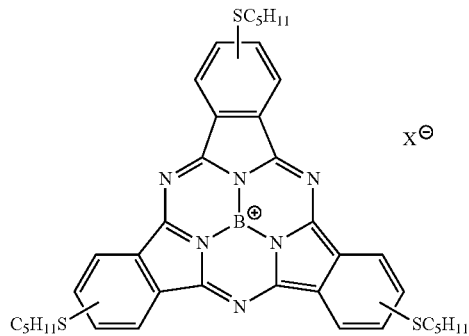
(SP-5)
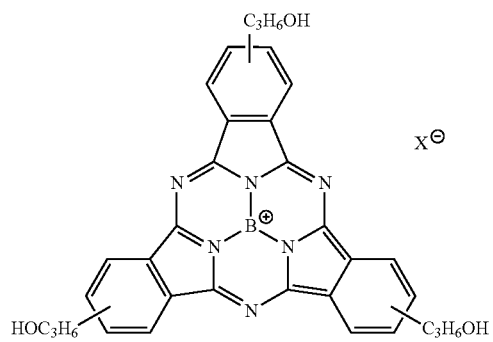
(SP-6)
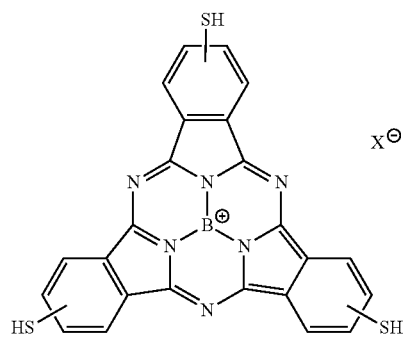
(SP-7)
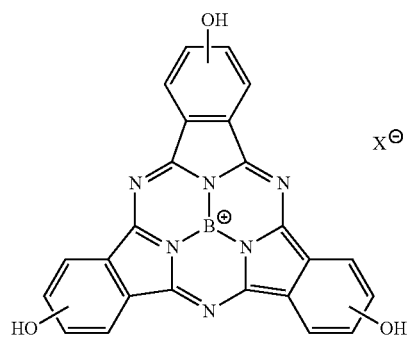
(SP-8)
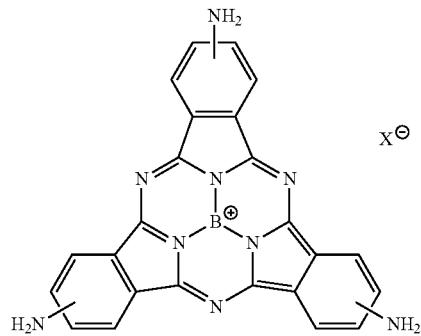

-continued

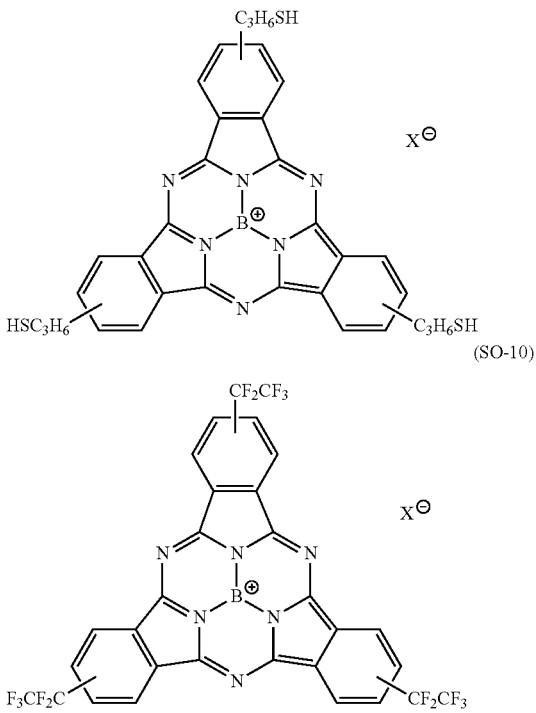

(SP-9)

(SO-10)

Among the above specific examples, (SP-2), (SP-3), (SP-4), (SP-5), (SP-6), and (SP-7) are particularly preferable from the viewpoints of color characteristics and heat resistance.

For a cation having a dye structure according to the present invention, a hydrogen atom in the dye structure may be substituted with a substituent selected from the following substituent group A as long as there is no deviation from the object of the present invention.

<<Squarylium Dye>>

The cation having a dye structure used in the present invention may have a squarylium dye structure. As the squarylium dye, a dye represented by the following General Formula (K) is preferable.

General Formula (K)

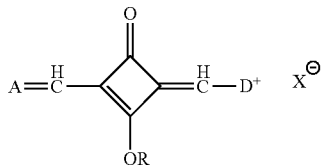

(In the formula, A and D each independently represent an aryl group or a heterocyclic group, R represents an alkyl group or an aryl group, and $X^-$ represents a weakly nucleophilic anionic structure.)

In General Formula (K), A and D each independently represent an aryl group or a heterocyclic group, and D is in a cationic structure. The aryl group is preferably an aryl group having 6 to 48 carbon atoms, and more preferably an aryl group having 6 to 24 carbon atoms, and examples thereof include phenyl and naphthyl. The heterocyclic group is preferably a heterocyclic group of a 5- or 6-membered ring, and examples thereof include pyroyl, imidazoyl, pyrazoyl, thienyl, pyridyl, pyrimidyl, pyridazyl, triazol-1-yl, thienyl, furyl, and thiadiazoyl. A and B may be a condensed ring of an aryl group and a heterocyclic group.

R represents an alkyl group or an aryl group. The alkyl group is preferably a linear, branched, or cyclic alkyl group preferably having 1 to 36 carbon atoms, and more preferably having 1 to 12 carbon atoms, for example, a methyl group, an ethyl group, a propyl group, an isopropyl group, a butyl group, an isobutyl group, a tert-butyl group, a hexyl group, a 2-ethylhexyl group, a dodecyl group, a cyclopropyl group, a cyclopentyl group, a cyclohexyl group, and a 1-adamantyl group. Examples of the aryl group include an aryl group preferably having 6 to 36 carbon atoms, and more preferably having 6 to 18 carbon atoms, for example, a phenyl group and a naphthyl group.

As the compound represented by General Formula (K), in particular, a compound represented by the following General Formula (K-1) or the following General Formula (K-2) is preferable.

General Formula (K-1)

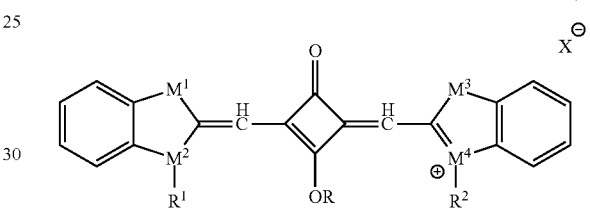

(In General Formula (K-1), $M^1$, $M^2$, $M^3$ and $M^4$ each independently represent an oxygen atom, a sulfur atom, or a nitrogen atom, and R, $R^1$, and $R^2$ each independently represent an alkyl group or an aryl group. $X^-$ represents a weakly nucleophilic anionic structure.)

In General Formula (K-1), $M^1$, $M^2$, $M^3$ and $M^4$ each independently represent an oxygen atom, a sulfur atom, or a nitrogen atom, among which a sulfur atom and a nitrogen atom are preferable. $M^1$ and $M^3$ are preferably the same atoms, and $M^2$ and $M^4$ are preferably the same atoms.

R, $R^1$, and $R^2$ in General Formula (K-1) have the same definitions as R in General Formula (K), and preferred ranges thereof are also the same.

General Formula (K-2)

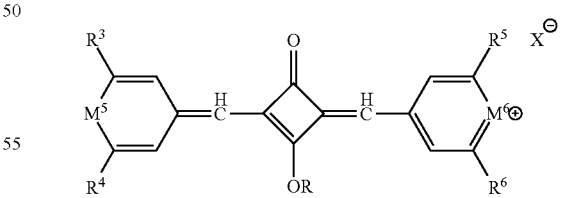

(In General Formula (K-2), $M^5$ and $M^6$ each independently represent an oxygen atom, a sulfur atom, or a nitrogen atom, and R, $R^1$, $R^2$, $R^3$, $R^4$, $R^5$, and $R^6$ each independently represent an alkyl group or an aryl group. $X^-$ represents a weakly nucleophilic anionic structure.)

In General Formula (K-2), $M^5$ and $M^6$ have the same definitions as $M^1$ to $M^4$ in General Formula (K-1), and preferred ranges thereof are also the same. $M^5$ and $M^6$ are preferably the same atoms.

R, R¹, R², R³, R⁴, R⁵, and R⁶ in General Formula (K-2) have the same definitions as R in General Formula (K), and preferred ranges thereof are also the same.

As the compound represented by General Formula (K-1), a compound represented by the following General Formula (K-3) is preferable, and as the compound represented by General Formula (K-2), a compound represented by General Formula (K-4) is preferable.

General Formula (K-3)

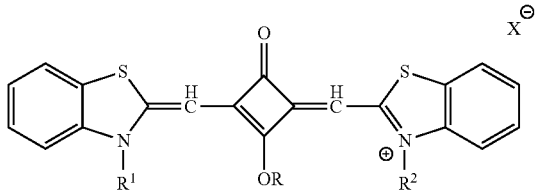

(In General Formula (K-3), R, R¹, and R² each independently represent an alkyl group or an aryl group. X⁻ represents a weakly nucleophilic anionic structure.)

R, R¹, and R² in General Formula (K-3) have the same definitions as R in General Formula (K), and preferred ranges thereof are also the same.

General Formula (K-4)

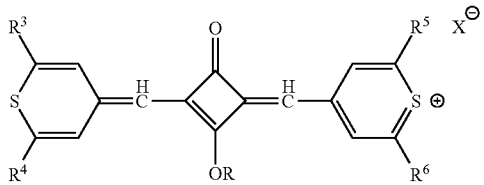

(In General Formula (K-4), R, R¹, R², R³, R⁴, R⁵ and R⁶ each independently represent an alkyl group or an aryl group. X⁻ represents a weakly nucleophilic anionic structure.)

R, R¹, R², R³, R⁴, R⁵, and R⁶ in General Formula (K-4) have the same definitions as R in General Formula (K), and preferred ranges thereof are also the same.

Specific examples of the squarylium compound represented by General Formula (K) are shown below, but the present invention is not limited thereto. X⁻ represents a weakly nucleophilic anionic structure.

(sm-1)

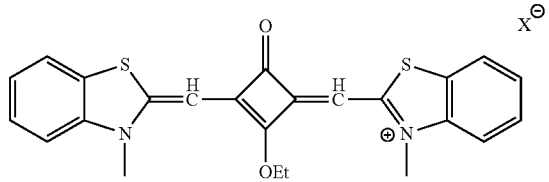

(sm-2)

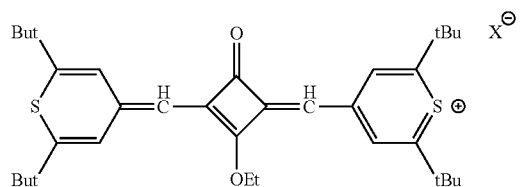

For the dye according to the present invention, a hydrogen atom in the dye structure may be substituted with a substituent selected from the following substituent group A as long as there is no deviation from the object of the present invention.

Substituent Group A:

Examples of the substituent which may be contained in the dye include a halogen atom, an alkyl group, a cycloalkyl group, an alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoylamino group, an alkylsulfonylamino or arylsulfonylamino group, a mercapto group, an alkylthio group, an arylthio group, a heterocyclic thio group, a sulfamoyl group, a sulfo group, an alkylsulfinyl or arylsulfinyl group, an alkylsulfonyl or arylsulfonyl group, an acyl group, an aryloxycarbonyl group, an alkoxycarbonyl group, a carbamoyl group, an arylazo or heterocyclic azo group, an imide group, a phosphino group, a phosphinyl group, a phosphinyloxy group, a phosphinylamino group, and a silyl group. These will be described in detail below.

Examples of the substituent include a halogen atom (for example, a fluorine atom, a chlorine atom, a bromine atom, and an iodine atom), a linear or branched alkyl group (a linear or branched substituted or unsubstituted alkyl group, and preferably an alkyl group having 1 to 30 carbon atoms, for example, methyl, ethyl, n-propyl, isopropyl, tert-butyl, n-octyl, 2-chloroethyl, 2-cyanoethyl, and 2-ethylhexyl), a cycloalkyl group (preferably a substituted or unsubstituted cycloalkyl group having 3 to 30 carbon atoms, for example, cyclohexyl and cyclopentyl, or a polycycloalkyl group, for example, a group having a polycyclic structure such as a bicycloalkyl group (preferably a substituted or unsubstituted bicycloalkyl group having 5 to 30 carbon atoms, for example, a bicyclo[1,2,2]heptan-2-yl group, and a bicyclo[2,2,2]octan-3-yl group), and a tricycloalkyl group; among these, a monocyclic cycloalkyl group and a bicycloalkyl group are more preferable, and a monocyclic cycloalkyl group is particularly preferable), a linear or branched alkenyl group (a linear or branched substituted or unsubstituted alkenyl group, which is preferably an alkenyl group having 2 to 30 carbon atoms, for example, vinyl, allyl, prenyl, geranyl, and oleyl), a cycloalkenyl group (preferably a substituted or unsubstituted cycloalkenyl group having 3 to 30 carbon atoms, for example, 2-cyclopenten-1-yl and 2-cyclohexen-1-yl, or a polycyclic alkenyl group, for example, a bicycloalkenyl group (preferably a substituted or unsubstituted bicycloalkenyl group having 5 to 30 carbon atoms, for example, bicyclo[2,2,1]hepto-2-en-1-yl and bicyclo[2,2,2]octo-2-en-4-yl), or a tricycloalkenyl group. Among these, a monocyclic cycloalkenyl group is particularly preferable), an alkynyl group (preferably a substituted or unsubstituted alkynyl group having 2 to 30 carbon atoms, for example, an ethynyl group, a propargyl group, and a trimethylsilylethynyl group), an aryl group (preferably a substituted or unsubstituted aryl group having 6 to 30 carbon atoms, for example, phenyl, p-tolyl, naphthyl, m-chlorophenyl, and o-hexadecanoylaminophenyl), a heterocyclic group (preferably a substituted or unsubstituted, saturated or unsaturated, aromatic or non-aromatic, and monocyclic or ring-fused 5- to 7-membered heterocyclic group, more preferably a heterocyclic group of which ring-constituting atoms are selected from carbon atoms, nitrogen atoms, and sulfur atoms, and which has at least any one of hetero atoms including a nitrogen atom, an oxygen atom, and a sulfur atom, and still more preferably a 5- or 6-membered aromatic heterocyclic group having 3 to 30 carbon atoms, for example, 2-furyl, 2-thienyl, 2-pyridyl, 4-pyridyl, 2-pyrimidinyl, and 2-benzothiazolyl), a cyano group, a hydroxyl group, a nitro group, a carboxyl group, an alkoxy group (preferably a substituted or unsubstituted alkoxy group having 1 to 30 carbon atoms, for example, methoxy, ethoxy, isopropoxy, tert-butoxy, n-octyloxy, and 2-methoxyethoxy), an aryloxy group (preferably a substituted or unsubstituted aryloxy group having 6 to 30 carbon atoms, for example, phenoxy, 2-methylphenoxy, 2,4-di-tert-amylphenoxy, 4-tert-butylphenoxy, 3-nitrophenoxy, and 2-tetradecanoylaminophenoxy), a silyloxy group (preferably a silyloxy group having 3 to 20 carbon atoms, for example, trimethylsilyloxy and tert-butyldimethylsilyloxy), a heterocyclic oxy group (preferably a substituted or unsubstituted heterocyclic oxy group having 2 to 30 carbon atoms, a heterocyclic moiety is preferably the heterocyclic moiety explained for the heterocyclic group described above, the heterocyclic oxy group is, for example, 1-phenyltetrazole-5-oxy or 2-tetrahydropyranyloxy), an acyloxy group (preferably a formyloxy group, a substituted or unsubstituted alkylcarbonyloxy group having 2 to 30 carbon atoms, and a substituted or unsubstituted arylcarbonyloxy group having 6 to 30 carbon atoms, for example, formyloxy, acetyloxy, pivaloyloxy, stearoyloxy, benzoyloxy, and p-methoxyphenylcarbonyloxy), a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy, N,N-di-n-octylaminocarbonyloxy, and N-n-octylcarbamoyloxy), an alkoxycarbonyloxy group (preferably a substituted or unsubstituted alkoxycarbonyloxy group having 2 to 30 carbon atoms, for example, methoxycarbonyloxy, ethoxycarbonyloxy, tert-butoxycarbonyloxy, and n-octylcarbonyloxy), an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, and p-n-hexadecyloxyphenoxycarbonyloxy), an amino group (preferably an amino group, a substituted or unsubstituted alkylamino group having 1 to 30 carbon atoms, a substituted or unsubstituted arylamino group having 6 to 30 carbon atoms, and a heterocyclic amino group having 0 to 30 carbon atoms, for example, amino, methylamino, dimethylamino, anilino, N-methyl-anilino, diphenylamino, and N-1,3,5-triazin-2-ylamino), an acylamino group (preferably a formylamino group, a substituted or unsubstituted alkylcarbonylamino group having 1 to 30 carbon atoms, and a substituted or unsubstituted arylcarbonylamino group having 6 to 30 carbon atoms, for example, formylamino, acetylamino, pivaloylamino, lauroylamino, benzoylamino, and 3,4,5-tri-n-octyloxyphenyl carbonylamino), an aminocarbonylamino group (preferably a substituted or unsubstituted aminocarbonylamino group having 1 to 30 carbon atoms, for example, carbamoylamino, N,N-dimethylaminocarbonylamino, N,N-diethylaminocarbonylamino, and morpholinocarbonylamino), an alkoxycarbonylamino group (preferably a substituted or unsubstituted alkoxycarbonylamino group having 2 to 30 carbon atoms, for example, methoxycarbonylamino, ethoxycarbonylamino, tert-butoxycarbonylamino, n-octadecyloxycarbonylamino, and N-methyl-methoxycarbonylamino), an aryloxycarbonylamino group (preferably a substituted or unsubstituted aryloxycarbonylamino group having 7 to 30 carbon atoms, for example, phenoxycarbonylamino, p-chlorophenoxycarbonylamino, and m-n-octyloxyphenoxycarbonylamino), a sulfamoylamino group (preferably a substituted or unsubstituted sulfamoylamino group having 0 to 30 carbon atoms, for example, sulfamoylamino, N,N-dimethylaminosulfonylamino, and N-n-octylaminosulfonylamino), an alkylsulfonylamino or arylsulfonylamino group (preferably a substituted or unsubstituted alkylsulfonylamino group having 1 to 30 carbon atoms, or a substituted or unsubstituted arylsulfonylamino group having 6 to 30 carbon atoms, for example, methylsulfonylamino, butylsulfonylamino, phenylsulfonylamino, 2,3,5-trichlorophenylsulfonylamino, and p-methylphenylsulfonylamino), a mercapto group, an alkylthio group (preferably a substituted or unsubstituted alkylthio group having 1 to 30 carbon atoms, for example, methylthio, ethylthio, and n-hexadecylthio), an arylthio group (preferably a substituted or unsubstituted arylthio group having 6 to 30 carbon atoms, for example, phenylthio, p-chlorophenylthio, and m-methoxyphenylthio), a heterocyclic thio group (preferably a substituted or unsubstituted heterocyclic thio group having 2 to 30 carbon atoms, in which a heterocyclic moiety is preferably the heterocyclic moiety explained for the heterocyclic group described above, for example, 2-benzothiazolylthio and 1-phenyltetrazol-5-ylthio), a sulfamoyl group (preferably a substituted or unsubstituted sulfamoyl group having 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl, and N—(N'-phenylcarbamoyl)sulfamoyl), a sulfo group, an alkylsulfinyl or arylsulfinyl group (preferably a substituted or unsubstituted alkylsulfinyl group having 1 to 30 carbon atoms or a substituted or unsubstituted arylsulfinyl group having 6 to 30 carbon atoms, for example, methylsulfinyl, ethylsulfinyl, phenylsulfinyl, and p-methylphenylsulfinyl), an alkylsulfonyl or arylsulfonyl group (preferably a substituted or unsubstituted alkylsulfonyl group having 1 to 30 carbon atoms or a substituted or unsubstituted arylsulfonyl group having 6 to 30 carbon atoms, for example, methylsulfonyl, ethylsulfonyl, phenylsulfonyl, and p-methylphenylsulfonyl), an acyl group (preferably a formyl group, a substituted or unsubstituted alkylcarbonyl group having 2 to 30 carbon atoms, or a substituted or unsubstituted arylcarbonyl group having 7 to 30 carbon atoms, for example, acetyl, pivaloyl, 2-chloroacetyl, stearoyl, benzoyl, and p-n-octyloxyphenylcarbonyl), an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, and p-tert-butylphenoxycarbonyl), an alkoxycarbonyl group (preferably a substituted or unsubstituted alkoxycarbonyl group having 2 to 30 carbon atoms, for example, methoxycarbonyl, ethoxycarbonyl, tert-butoxycarbonyl, and n-octadecyloxycarbonyl), a carbamoyl group (preferably substituted or unsubstituted carbamoyl having 1 to 30 carbon atoms, for example, carbamoyl, N-methylcarbamoyl, N,N-dimethylcarbamoyl, N,N-di-n-octylcarbamoyl, and N-(methylsulfonyl)carbamoyl), an arylazo or heterocyclic azo group (preferably a substituted or unsubstituted arylazo group having 6 to 30 carbon atoms, or a substituted or unsubstituted heterocyclic azo group having 3 to 30 carbon atoms (in which a heterocyclic moiety is preferably the heterocyclic moiety explained for the heterocyclic group described above), for example, phenylazo, p-chlorophenylazo, and 5-ethylthio-1,3,4-thiadiazol-2-ylazo), an imide group (preferably a substituted or unsubstituted imide group having 2 to 30 carbon atoms, for example, N-succinimide and N-phthalimide), a phosphino group (preferably a substituted or unsubstituted phosphino group having 2 to 30 carbon atoms, for example, dimethylphosphino, diphenylphosphino, and methylphenoxyphosphino), a phosphinyl group (preferably a substituted or unsubstituted phosphinyl group having 2 to 30 carbon atoms, for example, phosphinyl, dioctyloxyphosphinyl, and diethoxyphosphinyl), a phosphinyloxy group (preferably a substituted or unsubstituted phosphinyloxy group having 2 to 30 carbon atoms, for example, diphenoxyphosphinyloxy and dioctyloxyphosphinyloxy), a phosphinylamino group (preferably a substituted or unsubstituted phosphinylamino group having 2 to 30 carbon atoms, for example, dimethoxyphosphinylamino and dimethylaminophosphinylamino), and a silyl group (preferably a substituted or unsubstituted silyl group having 3 to 30 carbon atoms, for example, trimethylsilyl, tert-butyldimethylsilyl, and phenyldimethylsilyl).

Among the above functional groups, in the functional groups having hydrogen atoms, the portion of hydrogen atoms in the functional groups may be substituted with any one of the above groups. Examples of the functional groups which can be introduced as substituents include an alkylcarbonylaminosulfonyl group, an arylcarbonylaminosulfonyl group, an alkylsulfonylaminocarbonyl group, and an arylsulfonylaminocarbonyl group, and specific examples thereof include a methylsulfonylamino carbonyl group, a p-methylphenylsulfonylaminocarbonyl group, an acetylaminosulfonyl group, and a benzoylaminosulfonyl group.

<<Other Functional Groups or Other Repeating Units>>

The dye multimer in the present invention may have other functional groups or other repeating units, in addition to those above.

Specifically, the dye structure of the cation having a dye structure may have other functional groups, and the site having the repeating unit containing a weakly nucleophilic anionic structure of the polymer anion may have other repeating units.

Examples of such other functional groups include a polymerizable group, an acid group, and an alkali-soluble group. Further, examples of such other repeating units include repeating units including at least one of a polymerizable group, an acid group, and an alkali-soluble group.

Details of these groups will be described in detail.

<<<Polymerizable Group Contained in Polymer Anion and/or Cation Having Dye Structure>>>

The polymer anion and/or the cation having a dye structure in the present invention preferably includes a polymerizable group.

In the present invention, it is preferable that the cation having a dye structure includes a polymerizable group. By adopting such a configuration, the heat resistance tends to be improved. One kind or two or more kinds of polymerizable group may be included.

As the polymerizable group, known polymerizable groups which can be crosslinked by a radical, an acid, or heat can be used, and examples thereof include a group having an ethylenically unsaturated bond, a cyclic ether group (an epoxy group or an oxetane group), and a methylol group. In particular, a group having an ethylenically unsaturated bond is preferable, a (meth)acryloyl group is more preferable, and a (meth)acryloyl group derived from glycidyl(meth)acrylate and 3,4-epoxy-cyclohexylmethyl(meth)acrylate is still more preferable.

It is also preferable that the polymerizable group is introduced into the polymer anion as a repeating unit having a polymerizable group, in addition to the repeating unit containing a weakly nucleophilic anionic structure. It is a more preferred embodiment that the polymer anion contains a repeating unit containing a weakly nucleophilic anionic structure and a repeating unit having an ethylenically unsaturated bond.

Examples of a method for introducing the polymerizable group include (1) a method in which a polymer anion and/or a cation having a dye structure is modified into a polymerizable group-containing compound, and introduced, and (2) a method in which a polymerizable compound having a weakly nucleophilic anionic structure (or a polymerizable compound having a structure which will become a precursor of a weakly nucleophilic anionic structure) and a polymerizable group-containing compound are copolymerized, and introduced.

The amount of the polymerizable groups contained in the dye structure is preferably from 0.1 mmol to 2.0 mmol, more preferably from 0.2 mmol to 1.5 mmol, and particularly preferably from 0.3 mmol to 1.0 mmol, with respect to 1 g of the dye structure.

Furthermore, in the case where the polymer anion contains a repeating unit having a polymerizable group, the amount of the repeating unit is preferably, for example, from 1 mole to 40 moles, and more preferably from 5 moles to 30 moles, with respect to 100 moles of the entire repeating units.

Specific examples of the repeating unit having a polymerizable group are shown below, but the present invention is not limited thereto.

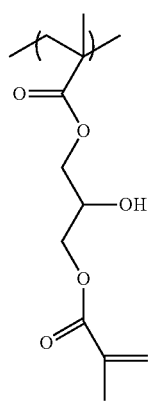

(G-1)

-continued
(G-2)
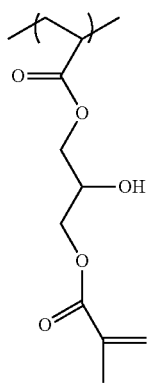
(G-3)
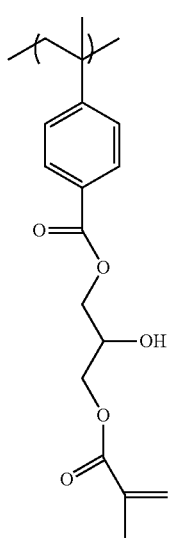
(G-4)
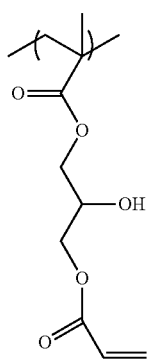
(G-5)
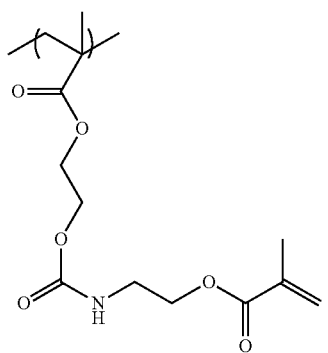
-continued
(G-6)
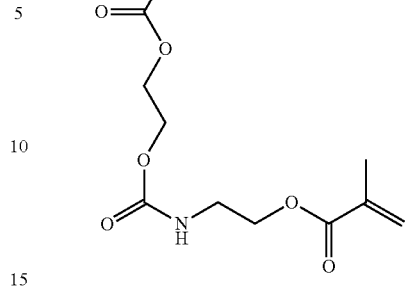
(G-7)
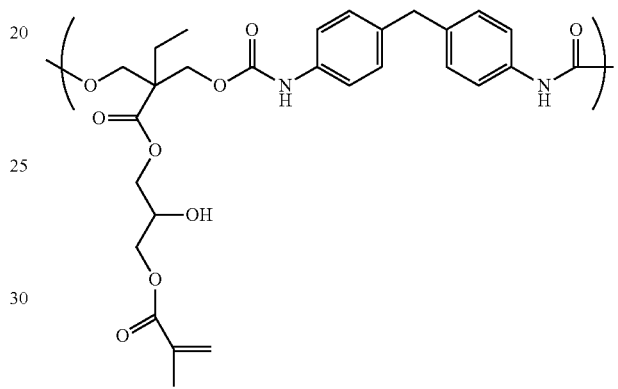
(G-8)
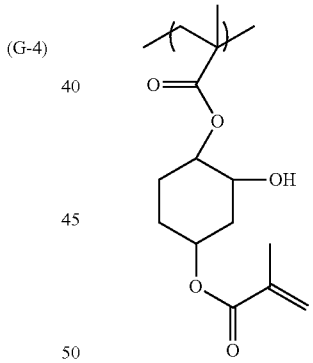
(G-9)
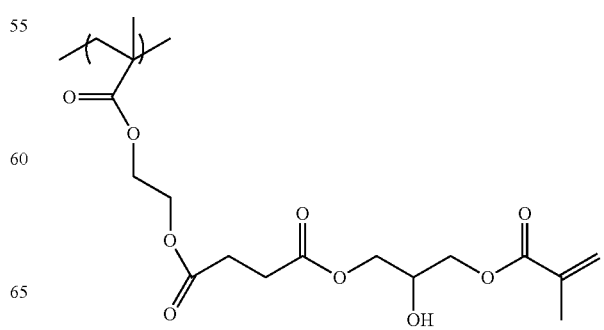

(G-10) 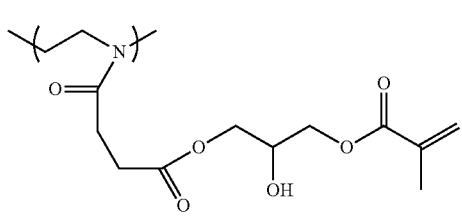

(G-11) 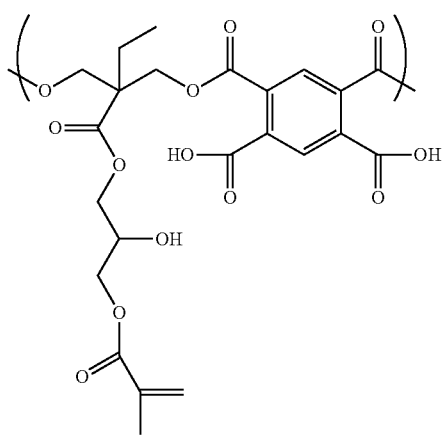

(G-12) 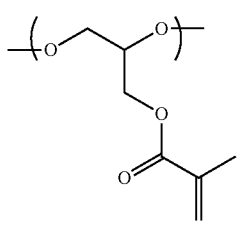

(G-13) 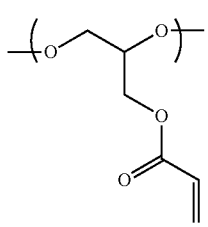

(G-14) 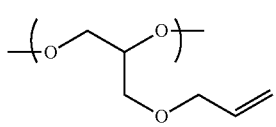

(G-15) 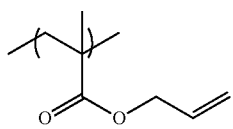

(G-16) 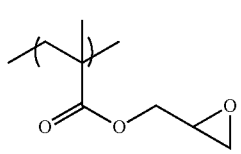

(G-17) 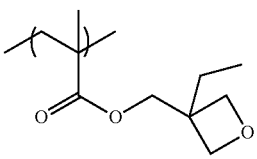

(B-18) 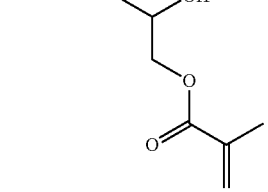

(B-19) 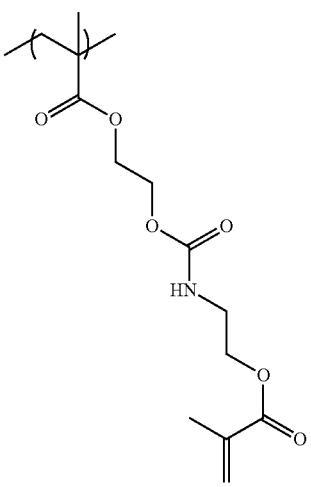

<<<Acid Group and Alkali-Soluble Group Contained in Polymer Anion and/or Cation Having Dye Structure>>>

Examples of the acid group which may be contained in the polymer anion and/or the cation having a dye structure in the present invention include a carboxylic acid group, a sulfonic acid group, and a phosphoric acid group. Further, examples of the alkali-soluble group include a phenolic hydroxyl group and a carboxylic acid.

In the present invention, it is preferable that an acid group and/or an alkali-soluble group is/are contained in a polymer anion as a repeating unit having an acid group and/or an alkali-soluble group.

The acid value of the repeating unit having an acid group is preferably from 5 mgKOH/g to 200 mgKOH/g, more preferably from 10 mgKOH/g to 180 mgKOH/g, and still more preferably from 20 mgKOH/g to 170 mgKOH/g.

In the present invention, the acid value of the polymer anion can be calculated from, for example, an average content of acid groups in the polymer anion. Further, it is possible to obtain a resin having a desired acid value by changing the content of monomer units containing an acid group constituting the polymer anion.

Examples of the method for introducing the alkali-soluble group into the cation having a dye structure include a method in which an alkali-soluble group is introduced into a dye monomer in advance. Examples of the method for introducing an alkali-soluble group into the polymer anion include a method of copolymerizing monomers (a caprolactone-modified derivative of (meth)acrylic acids and acrylic acids, a succinic anhydride-modified derivative of 2-hydroxyethyl(meth)acrylate, a phthalic anhydride-modified derivative of 2-hydroxyethyl(meth)acrylate, a 1,2-cyclohexane dicarboxylic acid anhydride-modified derivative of 2-hydroxyethyl(meth)acrylate, styrenecarboxylic acid, carboxylic acid-containing monomers such as itaconic acid, maleic acid, and norbornene carboxylic acid, phosphoric acid-containing monomers such as acid phosphoxyethyl methacrylate, and vinyl phosphonic acid, and sulfonic acid-containing monomers such as vinyl sulfonic acid and 2-acrylamide-2-methylsulfonic acid) other than a dye monomer having an alkali-soluble group.

The amount of the alkali-soluble groups contained in the dye multimer is preferably from 0.3 mmol to 2.0 mmol, more preferably from 0.4 mmol to 1.5 mmol, and particularly preferably from 0.5 mmol to 1.0 mmol, with respect to 1 g of the dye multimer.

Furthermore, in the case where the polymer anion contains a repeating unit having a weakly nucleophilic anionic structure and a repeating unit having an acid group, the proportion of the repeating units containing a repeating unit having an acid group is, for example, preferably from 1 mole to 60 moles, and more preferably from 10 moles to 50 moles, with respect to 100 moles of the repeating unit containing the polymer anion.

Examples of other functional groups contained in the polymer anion and/or the cation having a dye structure include a development accelerator such as a lactone, an acid anhydride, an amide, —COCH$_2$CO—, and a cyano group, or a hydrophobicity- or hydrophilicity-regulating group such as a long chain-alkyl group, a cyclic alkyl group, an aralkyl group, an aryl group, a polyalkylene oxide group, a hydroxyl group, a maleimide group, and an amino group, and the like. These can be appropriately introduced.

Examples of the method of introducing the functional group include a method of introducing the functional group in advance to the cation having a dye structure, and a method of copolymerizing a monomer having the functional group.

Specific examples of other functional groups are shown, but the present invention is not limited thereto.

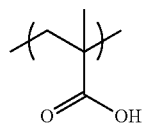
(B-1)

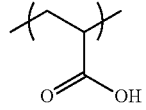
(B-2)

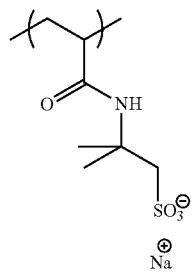
(B-3)

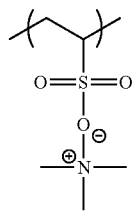
(B-4)

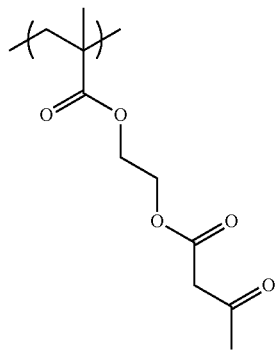
(B-5)

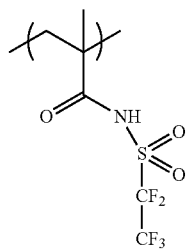
(B-6)

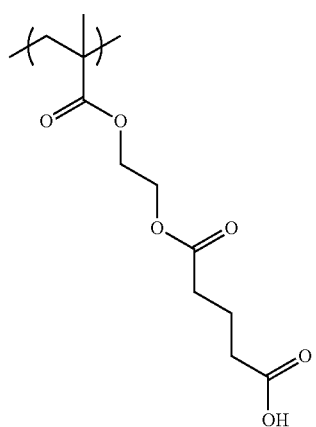
(B-7)

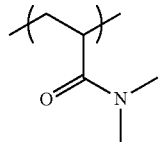
(B-8)

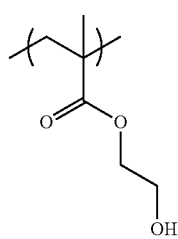
(B-9)

(B-10) 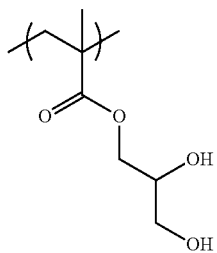
(B-11) 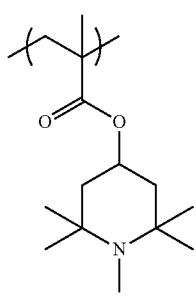
(B-12) 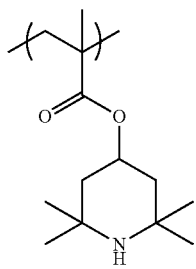
(B-13) 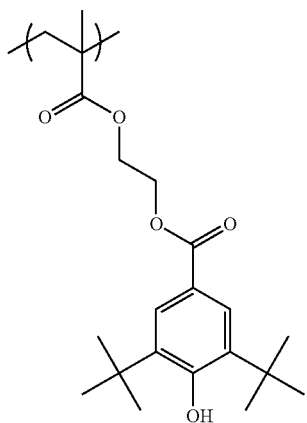
(B-14) 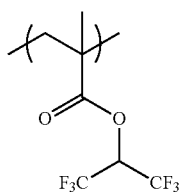
(B-15) 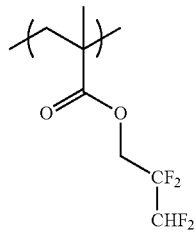
(B-16) 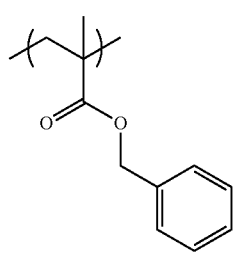
(B-17) 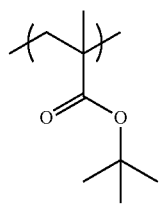
(B-20) 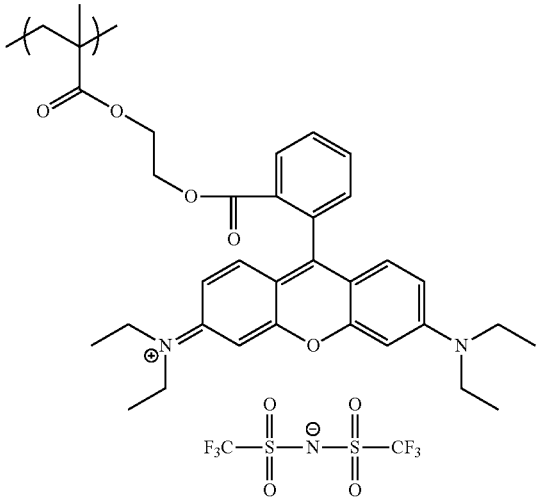

-continued (B-21)
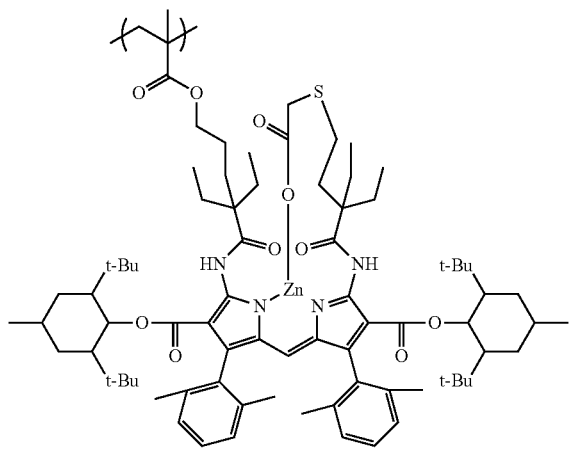

(B-22)
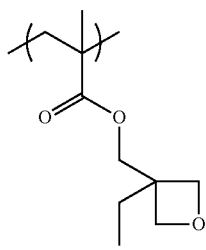

(B-23)
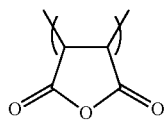

Furthermore, the maximum absorption wavelength of the dye multimer in the present invention is preferably from 400 nm to 650 nm, and more preferably from 450 nm to 600 nm.

Moreover, the acid value of the dye multimer in the present invention is preferably from, 5 mgKOH/g to 200 mgKOH/g, and more preferably from 10 mgKOH/g to 180 mgKOH/g.

A part having a weakly nucleophilic anionic structure in a repeating unit preferably includes a repeating unit containing a weakly nucleophilic anionic structure and a repeating unit having a polymerizable group, and more preferably includes a repeating unit containing a weakly nucleophilic anionic structure, a repeating unit having a polymerizable group, and a repeating unit having an acid group.

The weight-average molecular weight of the dye multimer is preferably from 2,000 to 20,000, more preferably from 3,000 to 15,000, and particularly preferably from 4,000 to 10,000.

In the present specification, the weight-average molecular weight and the number-average molecular weight are defined as a value in terms of polystyrene by GPC measurement. In the present specification, the weight-average molecular weight (Mw) and the number-average molecular weight (Mn) can be determined by means of, for example, an HLC-8220 (manufactured by Tosoh Corporation) by using TSKgel Super AWM-H (manufactured by Tosoh Corporation, 6.0 mm ID×15.0 cm) as a column and a 10 mmol/L solution of lithium bromide in N-methylpyrrolidinone (NMP) as an eluant.

Moreover, a ratio [(Mw)/(Mn)] between the weight-average molecular weight (Mw) and number average molecular weight (Mn) of the dye multimer is preferably from 1.0 to 3.0, more preferably from 1.6 to 2.5, and particularly preferably from 1.6 to 2.0.

The glass transition temperature (Tg) of the dye multimer according to the present invention is preferably 50° C. or higher, and more preferably 100° C. or higher. Further, a 5% weight reduction temperature measured by thermogravimetric analysis (TGA measurement) is preferably 120° C. or higher, more preferably 150° C. or higher, and still more preferably 200° C. or higher. If the temperature is within this range, when the colored composition of the present invention is applied to the manufacture of a color filter or the like, change in the concentration caused by a heating process can be decreased.

In addition, the absorption coefficient (hereinafter described as $\in'$, $\in'=\in$/average molecular weight, unit: L/g·cm) with respect to unit weight of the dye multimer according to the present invention is preferably 30 or more, more preferably 60 or more, and still more preferably 100 or more. If the absorption coefficient is within this range, in the case where a color filter is manufactured using the colored composition of the present invention, a color filter having good color reproducibility can be manufactured.

The molar absorption coefficient of the dye multimer used in the colored composition of the present invention is preferably as high as possible from the viewpoint of coloring ability.

The dye multimer according to the present invention is preferably a compound which dissolves in the following organic solvent.

Examples of the organic solvent include esters (for example, methyl 3-ethoxypropionate, ethyl 3-ethoxypropionate, ethyl lactate, butyl acetate, and methyl 3-methoxypropionate), ethers (for example, methyl cellosolve acetate, ethyl cellosolve acetate, propylene glycol monomethyl ether, and propylene glycol monomethyl ether acetate), ketones(methyl ethyl ketone, cyclohexanone, 2-heptanone, and 3-heptanone), and aromatic hydrocarbons (for example, toluene and xylene). The dye multimer dissolves in the amount of preferably from 1% by mass to 50% by mass, more preferably from 5% by mass to 40% by mass, and still more preferably from 10% by mass to 30% by mass, with respect to these solvents. If the solubility is within this range, when the colored composition of the present invention is applied to the manufacture of a color filter or the like, preferable coating surface states can be obtained or reduction in concentration caused by elution after coating of other colors can be decreased.

In the colored composition of the present invention, the dye multimer may be used alone or in combination of two or more kinds thereof. In the case of using two or more kinds, the total amount thereof preferably corresponds to the content which will be described later.

The content of the dye multimer in the colored composition of the present invention is determined after consideration of its content ratio with respect to a pigment which will be described later.

The mass ratio between the cations having a dye structure to the pigment (cations having a dye structure/pigment) is preferably from 0.1 to 5, more preferably from 0.2 to 2, and still more preferably from 0.3 to 1.

The colored composition of the present invention may include known dyes other than the (A) dye represented by General Formula (I). For example, the dyes disclosed in JP1989-90403A (JP-S64-90403A), JP1989-91102A (JP-S64-91102A), JP1989-94301A (JPH01-94301A), JP1994-11614A (JP-H06-11614A), JP2592207B, U.S. Pat. No.

4,808,501A, U.S. Pat. No. 5,667,920A, U.S. Pat. No. 505,950A, U.S. Pat. No. 5,667,920A, JP1993-333207A (JP-H05-333207A), JP1994-35183A (JP-H06-35183A), JP1994-51115A (JP-H06-51115A), and JP1994-194828A (JP-H06-194828A) can be used. With respect to the chemical structure, dyes such as a pyrazoleazo based-dye, a pyrromethene based-dye, an anilinoazo based-dye, a triphenylmethane based-dye, an anthraquinone based-dye, a benzylidene based-dye, an oxonol based-dye, a pyrazoletriazole azo based-dye, a pyridoneazo based-dye, a cyanine based-dye, a phenothiazine based-dye, and a pyrrolopyrazoleazomethine-based dye can be used.

The colored composition of the present invention is used for formation of a colored layer of the color filter. The colored composition used in the present invention preferably includes, in addition to the dye multimer (A), a curable compound (B), and a pigment (C). Examples of the curable compound (B) include a polymerizable compound and an alkali-soluble resin (including an alkali-soluble resin containing a polymerizable group), and the curable compound (B) is suitably selected according to the purpose or production method therefor. Further, the colored composition of the present invention preferably includes a photopolymerization initiator (D).

For example, in the case of forming a colored layer by a photoresist, the colored composition of the present invention is preferably a composition including the dye multimer (A), the alkali-soluble resin as a curable compound, the pigment (C), and the photopolymerization initiator (D) in the present invention. Further, the colored composition may include components such as a surfactant and a solvent.

In addition, in the case of forming a colored layer by dry etching, the colored composition is a composition including the dye multimer (A), the polymerizable compound as a curable compound, the pigment (C), and the photopolymerization initiator (D) in the present invention. Further, the colored composition may include components such as a surfactant and a solvent.

Details thereof will be described below.

<Polymerizable Compound (B)>

The colored composition of the present invention preferably contains a polymerizable compound.

Known polymerizable compounds which can be crosslinked by a radical, an acid, or heat can be used. Examples thereof include polymerizable compounds having an ethylenically unsaturated bond, a cyclic ether (epoxy or oxetane), methylol, or the like. From the viewpoint of sensitivity, the polymerizable compound is suitably selected from compounds having at least one and preferably two or more terminal ethylenically unsaturated bonds. Among these, polyfunctional polymerizable compounds having 4 or more functional groups are preferable, and polyfunctional polymerizable compounds having 5 or more functional groups are more preferable.

Such compound groups are widely known in the industrial field of the relevant art and can be used in the present invention without particular limitation. These may be in any type of chemical form such as a monomer, a prepolymer, that is, a dimer, a trimer, an oligomer, a mixture thereof, and a multimer thereof. The polymerizable compound in the present invention may be used alone or in combination of two or more kinds thereof.

More specifically, examples of the monomer and prepolymer include unsaturated carboxylic acids (for example, acrylic acid, methacrylic acid, itaconic acid, crotonic acid, isocrotonic acid, maleic acid, and the like) or esters thereof, amides, and multimers of these, and among these, an ester of an unsaturated carboxylic acid and an aliphatic polyhydric alcohol compound, amides of an unsaturated carboxylic acid and an aliphatic polyamine compound, and multimers of these are preferable. Moreover, products of an addition reaction between unsaturated carboxylic esters or amides having a nucleophilic substituent such as a hydroxyl group, an amino group, or a mercapto group and monofunctional or polyfunctional isocyanates or epoxies; products of a dehydration condensation reaction between unsaturated carboxylic esters or amides having a nucleophilic substituent such as a hydroxyl group, an amino group, or a mercapto group and monofunctional or polyfunctional carboxylic acids; and the like are also suitably used. In addition, products of an addition reaction between unsaturated carboxylic esters or amides having an electrophilic substituent such as an isocyanate group or an epoxy group and monofunctional or polyfunctional alcohols, amines, or thiols, and products of a substitution reaction between unsaturated carboxylic esters or amides having an eliminatable substituent such as a halogen group or tosyloxy group and monofunctional or polyfunctional alcohols, amines, or thiols are also suitable. As other examples, instead of the above unsaturated carboxylic acid, vinyl benzene derivatives of unsaturated phosphonic acid, styrene, and the like and compound groups substituted with vinyl ether, allyl ether, or the like can also be used.

As these specific compounds, the compounds described in paragraph Nos. "0095" to "0108" of JP2009-288705A can also be suitably used in the present invention.

Moreover, as the polymerizable compound, a compound which has at least one addition-polymerizable ethylene group and has an ethylenically unsaturated group having a boiling point of 100° C. or higher under normal pressure is also preferable. Examples of the compound include a monofunctional acrylate or methacrylate such as polyethylene glycol mono(meth)acrylate, polypropylene glycol mono (meth)acrylate, and phenoxyethyl(meth)acrylate; a compound which is obtained by adding ethylene oxide or propylene oxide to a polyfunctional alcohol, and then (meth) acrylating the resultant, such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta (meth)acrylate, dipentaerythritol hexa(meth)acrylate, hexanediol(meth)acrylate, trimethylolpropane tri(acryloyloxypropyl) ether, tri(acryloyloxyethyl) isocyanurate, glycerin, and trimethylolethane; the urethane(meth)acrylates described in JP1973-41708B (JP-S48-41708B), JP1975-6034B (JP-S50-6034B), and JP1976-37193A (JP-S51-37193A); the polyester acrylates described in JP1973-64183A (JP-S48-64183A), JP1974-43191B (JP-S49-43191B), and JP1977-30490B (JP-S52-30490B); a polyfunctional acrylate or methacrylate such as epoxy acrylate as a product of a reaction between an epoxy resin and (meth)acrylic acid; and a mixture thereof.

Other examples thereof include a polyfunctional (meth) acrylate which is obtained by reacting a polyfunctional carboxylic acid with a compound having a cyclic ether group such as glycidyl(meth)acrylate, and an ethylenically unsaturated group.

Furthermore, as other preferred polymerizable compounds, the compounds having a fluorene ring and an ethylenically unsaturated group having 2 or more functional groups described in JP2010-160418A, JP2010-129825A, and JP4364216B, and a cardo resin can also be used.

Moreover, as the compound which has a boiling point of 100° C. or higher under normal pressure and has at least one addition-polymerizable ethylenically unsaturated group, compounds described in paragraph Nos. "0254" to "0257" of JP2008-292970A are also suitable.

In addition to those above, radically polymerizable monomers represented by the following General Formulae (MO-1) to (MO-5) can also be used. Incidentally, in the formulae, in the case where T is an oxyalkylene group, the terminal at a carbon atom side binds to R.

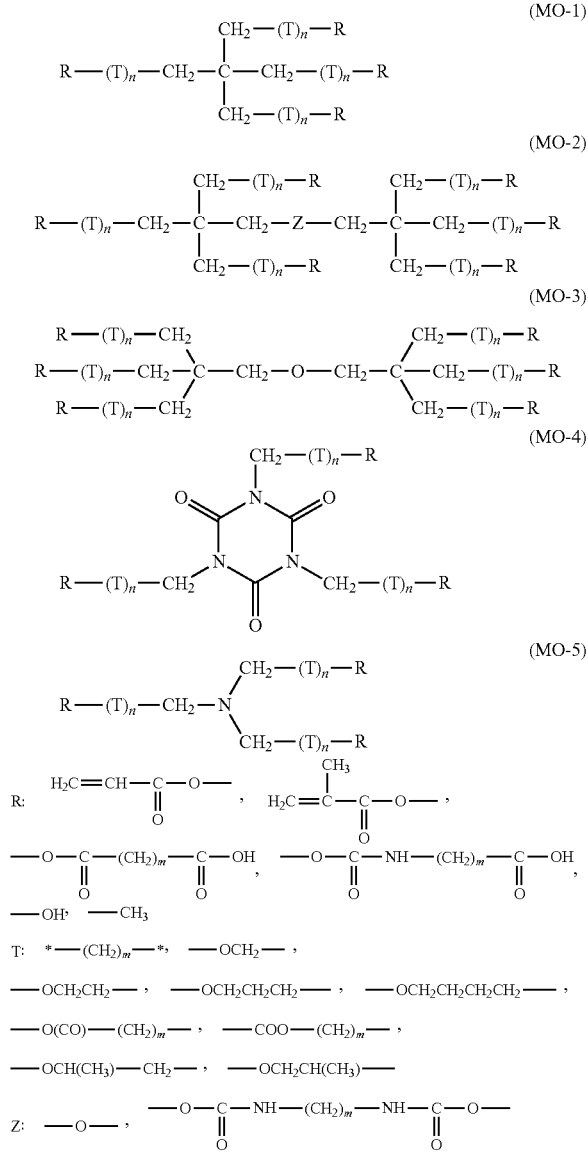

In General Formulae, n is 0 to 14, and m is 1 to 8. A plurality of R's and T's which are present in the same molecule may be the same as or different from each other.

In each of the polymerizable compounds represented by General Formulae (MO-1) to (MO-5), at least one of the plurality of R's represents a group represented by —OC(=O)CH=CH$_2$ or —OC(=O)C(CH$_3$)=CH$_2$.

As specific examples of the polymerizable compounds represented by General Formulae (MO-1) to (MO-5), the compounds described in paragraph Nos. "0248" to "0251" of JP2007-269779A can also be suitably used in the present invention.

In addition, a compound which is obtained by adding ethylene oxide or propylene oxide to the polyfunctional alcohol, which is described as General Formulae (1) and (2) in JP1998-62986A (JP-H10-62986A) together with the specific examples thereof, and then (meth)acrylating the resultant can also be used as a polymerizable compound.

Among these, as the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd.), and a structure in which ethylene glycol or a propylene glycol residue is interposed between these (meth)acryloyl groups are preferable. Oligomer types of these can also be used.

The polymerizable compound may have an acid group such as a carboxyl group, a sulfonic acid group, and a phosphoric acid group, which is a polyfunctional monomer. If an ethylenic compound has an unreacted carboxyl group as in a case of the mixture as described above, it can be used as is, but if desired, a hydroxyl group of the aforementioned ethylenic compound may be reacted with a non-aromatic carboxylic anhydride so as to introduce an acid group thereinto. In this case, specific examples of the non-aromatic carboxylic anhydride used include tetrahydrophthalic anhydride, alkylated tetrahydrophthalic anhydride, hexahydrophthalic anhydride, alkylated hexahydrophthalic anhydride, succinic anhydride, and maleic anhydride.

In the present invention, as a monomer having an acid group, a polyfunctional monomer which is an ester obtained between an aliphatic polyhydroxy compound and an unsaturated carboxylic acid and provides an acid group by reacting an unreacted hydroxyl group of the aliphatic polyhydroxy compound with a non-aromatic carboxylic anhydride is preferable. A monomer in which the aliphatic polyhydroxy compound in the ester is pentaerythritol and/or dipentaerythritol is particularly preferable. Examples of commercially available products thereof include M-510 and M-520, which are polybasic modified acryl oligomers manufactured by TOAGOSEI, CO., LTD.

These monomers may be used alone, but since it is difficult to use a single compound in production, two or more kinds thereof may be used as a mixture. Moreover, if desired, a polyfunctional monomer not having an acid group and a polyfunctional monomer having an acid group may be used in combination therewith as the monomers.

The acid value of the polyfunctional monomer having an acid group is preferably from 0.1 mg KOH/g to 40 mg KOH/g, and particularly preferably from 5 mg KOH/g to 30 mg KOH/g. If the acid value of the polyfunctional monomer is too low, the development solubility characteristics deteriorate. If the acid value is too high, difficulty is caused in the production and handleability, hence a photopolymerization performance deteriorates, which leads to deterioration of curability such as surface smoothness of pixels. Therefore, in the case where a combination of two or more kinds of polyfunctional monomers having different acid groups is used, or when a combination of polyfunctional monomers not having an acid group is used, it is preferable to adjust the acid value such that the acid groups as all the polyfunctional monomers fall within the above range.

Furthermore, it is also a preferred embodiment that a polyfunctional compound having a caprolactone structure is contained as a polymerizable compound.

The polyfunctional monomer having a caprolactone structure is not particularly limited as long as it has a caprolactone structure in a molecule thereof, and examples thereof include ε-caprolactone-modified polyfunctional (meth)acrylates which are obtained by esterifying polyhydric alcohols such as trimethylolethane, ditrimethylolethane, trimethylolpropane, ditrimethylolpropane, pentaerythritol, dipentaerythritol, tripentaerythritol, glycerin, diglycerol, and trimethylolmelamine with (meth)acrylic acid and ε-caprolactone. Among these, a polyfunctional monomer having a caprolactone structure represented by the following General Formula (Z-1) is preferable.

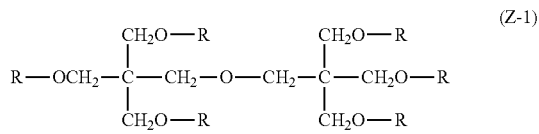
(Z-1)

In General Formula (Z-1), all of six R's are a group represented by the following General Formula (Z-2). Alternatively, one to five out of six R's are a group represented by the following General Formula (Z-2), and the remainder are a group represented by the following General Formula (Z-3).

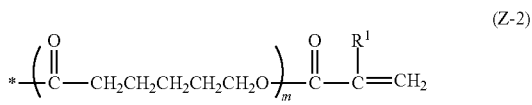
(Z-2)

In General Formula (Z-2), $R^1$ represents a hydrogen atom or a methyl group, m represents a number of 1 or 2, and "*" represents a direct bond.

(Z-3)

In General Formula (Z-3), $R^1$ represents a hydrogen atom or a methyl group, and "*" represents a direct bond.

The polyfunctional monomer having such a caprolactone structure is commercially available from Nippon Kayaku Co., Ltd., as a KAYARAD DPCA series, and examples thereof include DPCA-20 (a compound in which m=1 in Formulae (1) to (3), the number of the groups represented by Formula (2)=2, and all of $R^1$'s are hydrogen atoms), DPCA-30 (a compound in which m=1 in Formulae (1) to (3), the number of the groups represented by Formula (2)=3, and all of $R^1$'s are hydrogen atoms), DPCA-60 (a compound in which m=1 in Formulae (1) to (3), the number of the groups represented by Formula (2)=6, and all of $R^1$'s are hydrogen atoms), and DPCA-120 (a compound in which m=2 in Formulae (1) to (3), the number of the groups represented by Formula (2)=6, and all of $R^1$'s are hydrogen atoms).

In the present invention, the polyfunctional monomer having a caprolactone structure can be used alone or as a mixture of two or more kinds thereof.

Moreover, the specific monomer in the present invention is preferably at least one kind selected from a group of compounds represented by the following General Formula (Z-4) or General Formula (Z-5).

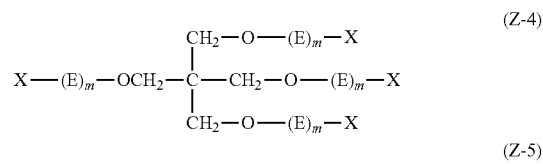
(Z-4)

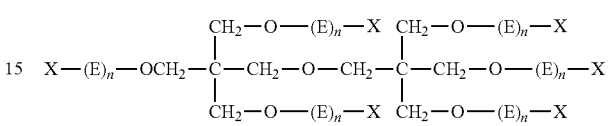
(Z-5)

In General Formulae (Z-4) and (Z-5), E's each independently represent $-((CH_2)_y CH_2 O)-$ or $-((CH_2)_y CH(CH_3)O)-$, y's each independently represent an integer of 0 to 10, and X's each independently represent an acryloyl group, a methacryloyl group, a hydrogen atom, or a carboxyl group.

In General Formula (Z-4), the sum of the acryloyl group and the methacryloyl group is 3 or 4, m's each independently represent an integer of 0 to 10, and the sum of the respective m's is an integer of 0 to 40. Here, in the case where the sum of the respective m's is 0, any one of X's is a carboxyl group.

In General Formula (Z-5), the sum of the acryloyl group and the methacryloyl group is 5 or 6, n's each independently represent an integer of 0 to 10, and the sum of the respective n's is an integer of 0 to 60. Here, in the case where the sum of the respective n's is 0, one of X's is a carboxyl group.

In General Formula (Z-4), m is preferably an integer of 0 to 6, and more preferably an integer of 0 to 4. Further, the sum of the respective m's is preferably an integer of 2 to 40, more preferably an integer of 2 to 16, and particularly preferably an integer of 4 to 8.

In General Formula (Z-5), n is preferably an integer of 0 to 6, and more preferably an integer of 0 to 4. Furthermore, the sum of the respective n's is preferably an integer of 3 to 60, more preferably an integer of 3 to 24, and particularly preferably an integer of 6 to 12.

In addition, $-((CH_2)_y CH_2 O)-$ or $-((CH_2)_y CH(CH_3)O)-$ in General Formula (Z-4) or General Formula (Z-5) is preferably in the form in which the terminal at an oxygen atom side binds to X.

The compound represented by General Formula (Z-4) or General Formula (Z-5) may be used alone or in combination of two or more kinds thereof. In particular, a form in which all of six X's in General Formula (Z-5) are an acryloyl group is preferable.

Moreover, the total content of the compound represented by General Formula (Z-4) or General Formula (Z-5) in the polymerizable compounds is preferably 20% by mass or more, and more preferably 50% by mass or more.

The compound represented by General Formula (Z-4) or General Formula (Z-5) can be synthesized by steps known in the related art, which includes a step of binding ethylene oxide or propylene oxide to pentaerythritol or dipentaerythritol by a ring-opening addition reaction to form a ring-opening skeleton, and a step of reacting, for example, (meth)acryloyl chloride with a terminal hydroxyl group of the ring-opening skeleton to introduce a (meth)acryloyl group. Since the respective steps are well-known, a person skilled in the art can easily synthesize the compound represented by General Formula (Z-4) or General Formula (Z-5).

Among the compounds represented by General Formula (Z-4) or General Formula (Z-5), a pentaerythritol derivative and/or a dipentaerythritol derivative is/are more preferable.

Specific examples of the compounds include compounds represented by the following Formulae (a) to (f) (hereinafter also referred to as "exemplary compounds (a) to (f)"). Among these, the exemplary compounds (a), (b), (e), and (f) are preferable.

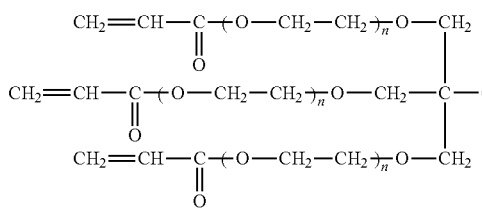
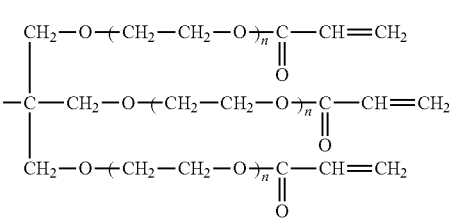

(a)

(the sum of the respective $n$'s is 6)

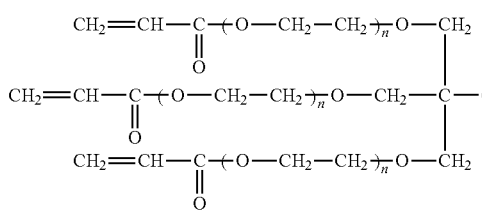
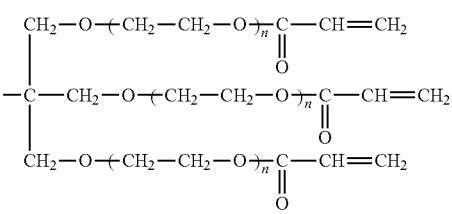

(b)

(the sum of the respective $n$'s is 12)

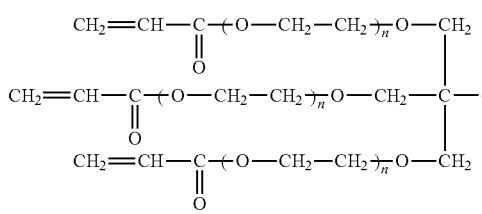
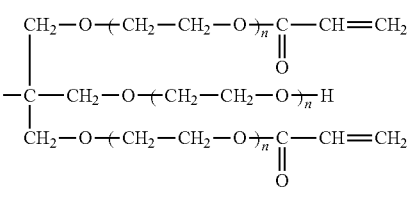

(c)

(the sum of the respective $n$'s is 12)

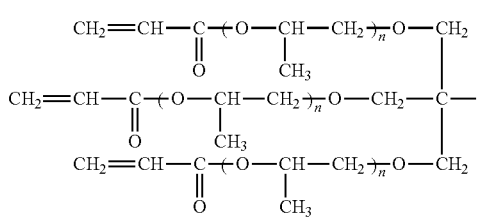
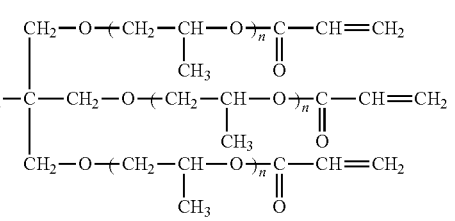

(d)

(the sum of the respective $n$'s is 6)

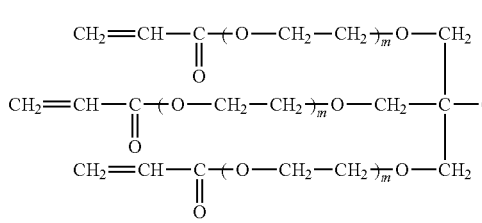
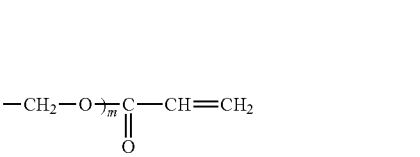

(e)

(the sum of the respective $m$'s is 4)

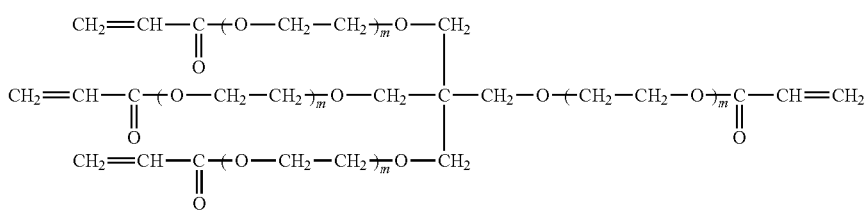

(f)

(the sum of the respective m's is 12)

Examples of commercially available products of the polymerizable compounds represented by General Formula (Z-4) or General Formula (Z-5) include SR-494 which is a tetrafunctional acrylate having four ethyleneoxy chains, manufactured by Sartomer, and DPCA-60 which is a hexafunctional acrylate having six pentyleneoxy chains and TPA-330 which is a trifunctional acrylate having three isobutyleneoxy chains, manufactured by Nippon Kayaku Co., Ltd.

Moreover, as the polymerizable compounds, the urethane acrylates described in JP1973-41708B (JP-S48-41708B), JP1976-37193A (JP-S51-37193A), JP1990-32293B (JP-H02-32293B), and JP1990-16765B (JP-H02-16765B) or urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also preferable. Furthermore, if addition-polymerizable compounds, which have an amino structure or a sulfide structure in a molecule and are described in JP1988-277653A (JP-S63-277653A), JP1988-260909A (JP-S63-260909A), and JP1989-105238A (JP-H01-105238A), are used as the polymerizable compounds, a curable composition which is extremely excellent in photosensitization speed can be obtained.

Examples of commercially available products of the polymerizable compounds include urethane oligomers UAS-10 and UAB-140 (manufactured by Sanyo-Kokusaku Pulp, Co., Ltd.), UA-7200 (manufactured by SHIN-NAKAMURA CHEMICAL CO., LTD.), DPHA-40H (manufactured by Nippon Kayaku Co., Ltd.), and UA-306H, UA-306T, UA-306I, AH-600, T-600, and AI-600 (manufactured by KYOEISHA CHEMICAL CO., LTD.).

As the cyclic ether (epoxy or oxetane), examples of a bisphenol A type epoxy resin, which have an epoxy group, include JER-827, JER-828, JER-834, JER-1001, JER-1002, JER-1003, JER-1055, JER-1007, JER-1009, and JER-1010 (all manufactured by Japan Epoxy Resins Co., Ltd.), and EPICLON 860, EPICLON 1050, EPICLON 1051, and EPICLON 1055 (all manufactured by DIC Corporation); examples of a bisphenol F type epoxy resin include JER-806, JER-807, JER-4004, JER-4005, JER-4007, and JER-4010 (all manufactured by Japan Epoxy Resins Co., Ltd.), EPICLON 830 and EPICLON 835 (both manufactured by DIC Corporation), and LCE-21 and RE-602S (all manufactured by Nippon Kayaku Co., Ltd.); examples of a phenol novolac type epoxy resin include JER-152, JER-154, JER-157 S70, and JER-157 S65 (all manufactured by Japan Epoxy Resins Co., Ltd.), and EPICLON N-740, EPICLON N-770, and EPICLON N-775 (all manufactured by DIC Corporation); examples of a cresol novolac type epoxy resin include EPICLON N-660, EPICLON N-665, EPICLON N-670, EPICLON N-673, EPICLON N-680, EPICLON N-690, and EPICLON N-695 (all manufactured by DIC Corporation), and EOCN-1020 (manufactured by Nippon Kayaku Co., Ltd.); and examples of an aliphatic epoxy resin include ADEKA RESIN EP-4080S, ADEKA RESIN EP-4085S, and ADEKA RESIN EP-4088S (all manufactured by ADEKA CORPORATION), CELLOXIDE 2021P, CELLOXIDE 2081, CELLOXIDE 2083, CELLOXIDE 2085, EHPE-3150 (condensation products of 1,2-epoxy-4-(2-oxiranyl)cyclohexane of 2,2-bis(hydroxy methyl)-1-butanol), EPOLEAD PB 3600, and EPOLEAD PB 4700 (all manufactured by Daicel Chemical Industries, Ltd.), DENACOL EX-211L, EX-212L, EX-214L, EX-216L, EX-321L, and EX-850L (all manufactured by Nagase ChemteX Corporation), ADEKA RESIN EP-4000S, ADEKA RESIN EP-4003S, ADEKA RESIN EP-40105, and ADEKA RESIN EP-40115 (all manufactured by ADEKA CORPORATION), NC-2000, NC-3000, NC-7300, XD-1000, EPPN-501, and EPPN-502 (all manufactured by ADEKA CORPORATION), and JER-1031S (manufactured by Japan Epoxy Resins Co., Ltd.). Such polymerizable compounds are suitable for a case of forming a pattern by a dry etching method.

Details of how to use these polymerizable compounds, such as the structure, whether the polymerizable compounds are used singly or used in combination thereof, and the amount of the polymerizable compounds added, can be arbitrarily set according to the designed final performance of the colored composition. For example, from the viewpoint of sensitivity, a structure in which the content of an unsaturated group per molecule is large is preferable, and in many cases, it is preferable that the polymerizable compound has 2 or more functional groups. Moreover, from the viewpoint of enhancing the strength of a cured film formed of the colored composition, it is preferable that the polymerizable compound has 3 or more functional groups. In addition, a method for adjusting both the sensitivity and the strength by using a combination of compounds which differ in the number of functional groups and have different polymerizable groups (for example, an acrylic ester, a methacrylic ester, a styrene-based compound, and a vinylether-based compound) is also effective. Further, it is preferable to use polymerizable compounds having 3 or more functional groups and differing in the length of an ethylene oxide chain since the developability of the colored composition can be adjusted, and excellent pattern formability is obtained.

In addition, from the viewpoints of the compatibility with other components (for example, a photopolymerization initiator, a substance to be dispersed, and an alkali-soluble resin) contained in the colored composition, and the dispersibility, how to select and use the polymerizable compound is an important factor. For example, if a low-purity compound is used or a combination of two or more kinds thereof is used, the compatibility can be improved in some cases. In addition, from the viewpoint of improving the adhesiveness of the composition to a hard surface of a support or the like, specific structures may be selected in some cases.

In the case where the polymerizable compound is blended into the colored composition of the present invention, the content of the polymerizable compound is preferably from 0.1% by mass to 90% by mass, more preferably from 1.0% by mass to 60% by mass, and particularly preferably from 2.0% by mass to 40% by mass, with respect to the total solid contents of the colored composition.

The composition of the present invention may include one kind or two or more kinds of polymerizable compound. In the case where the composition includes two or more kinds of polymerizable compound, the total amount thereof is preferably within this range.

<Pigment (C)>

It is preferable that the colored composition of the present invention further contains a pigment (C).

As the pigment which is used in the present invention, various inorganic or organic pigments known in the related art can be used, and the organic pigments are preferably used. As the pigment, one having a high transmittance is preferable.

Examples of the inorganic pigment include metal compounds represented by a metal oxide, a metal complex salt, or the like, and specific examples thereof include metal oxides of iron, cobalt, aluminum, cadmium, lead, copper, titanium, magnesium, chromium, zinc, antimony, and the like, and complex oxides of metals.

Examples of the organic pigment include:

C. I. Pigment Yellow 11, 24, 31, 53, 83, 93, 99, 108, 109, 110, 138, 139, 147, 150, 151, 154, 155, 167, 180, 185, 199;

C. I. Pigment Orange 36, 38, 43, 71;

C. I. Pigment Red 81, 105, 122, 149, 150, 155, 171, 175, 176, 177, 209, 220, 224, 242, 254, 255, 264, 270;

C. I. Pigment Violet 19, 23, 32, 39;

C. I. Pigment Blue 1, 2, 15, 15:1, 15:3, 15:6, 16, 22, 60, 66;

C. I. Pigment Green 7, 36, 37, 58;

C. I. Pigment Brown 25, 28; and

C. I. Pigment Black 1, 7.

Examples of the pigment which can be preferably used in the present invention include the following ones, but the present invention is not limited thereto:

C. I. Pigment Yellow 11, 24, 108, 109, 110, 138, 139, 150, 151, 154, 167, 180, 185, C. I. Pigment Orange 36, 71;

C. I. Pigment Red 122, 150, 171, 175, 177, 209, 224, 242, 254, 255, 264,

C. I. Pigment Violet 19, 23, 32,

C. I. Pigment Blue 15:1, 15:3, 15:6, 16, 22, 60, 66,

C. I. Pigment Green 7, 36, 37, 58, and

C. I. Pigment Black 1, 7.

These organic pigments can be used alone or in various combinations for spectral adjustment or improvement of color purity. Specific examples of the combination are shown below. For example, as a red pigment, an anthraquinone-based pigment, a perylene-based pigment, or a diketopyrrolopyrrole-based pigment can be used alone or as a mixture of at least one kind of these with a disazo-based yellow pigment, an isoindoline-based yellow pigment, a quinophthalone-based yellow pigment, or a perylene-based red pigment. Examples of the anthraquinone-based pigment include C. I. Pigment Red 177, examples of the perylene-based pigment include C. I. Pigment Red 155, and C. I. Pigment Red 224, and examples of the diketopyrrolopyrrole-based pigment include C. I. Pigment Red 254. In view of chromatic resolving properties, a mixture of the above pigments with C. I. Pigment Yellow 139 is preferable. The mass ratio between the red pigment and the yellow pigment is preferably 100:5 to 100:50. If the mass ratio is 100:4 or less, it is difficult to reduce the light transmittance at 400 nm to 500 nm, and if it is 100:51 or more, a dominant wavelength moves closer to a short wavelength, so a color separating power cannot be improved in some cases. In particular, the mass ratio is optimally in a range of 100:10 to 100:30. Moreover, in a case of a combination of red pigments, the mass ratio can be adjusted according to the required spectrum.

In addition, as a green pigment, a halogenated phthalocyanine-based pigment can be used alone or as a mixture of this pigment with a disazo-based yellow pigment, a quinophthalone-based yellow pigment, an azomethine-based yellow pigment, or an isoindoline-based yellow pigment. As an example of such pigments, a mixture of C. I. Pigment Green 7, 36, or 37 with C. I. Pigment Yellow 83, C. I. Pigment Yellow 138, C. I. Pigment Yellow 139, C. I. Pigment Yellow 150, C. I. Pigment Yellow 180, or C. I. Pigment Yellow 185 is preferable. The mass ratio between the green pigment and the yellow pigment is preferably from 100:5 to 100:150. The mass ratio is particularly preferably in a range of 100:30 to 100:120.

As a blue pigment, a phthalocyanine-based pigment can be used alone or as a mixture of this pigment with a dioxazine-based violet pigment. For example, a mixture of C. I. Pigment Blue 15:6 with C. I. Pigment Violet 23 is preferable. The mass ratio between the blue pigment and the violet pigment is preferably from 100:0 to 100:100 and more preferably 100:10 or less.

Moreover, as a pigment for a black matrix, carbon, titanium black, iron oxide, or titanium oxide may be used alone or as a mixture, and a combination of carbon with titanium black is preferable. The mass ratio between carbon and titanium black is preferably in a range of 100:0 to 100:60.

For the colored composition of the present invention, it is preferable to blend pigments other than black one, with a blue pigment being preferable.

In the case where the colored composition is used for a color filter, the primary particle size of the pigment is preferably 100 nm or less from the viewpoint of color unevenness or contrast. From the viewpoint of dispersion stability, the primary particle size is preferably 5 nm or more. The primary particle size of the pigment is more preferably from 5 nm to 75 nm, still more preferably from 5 nm to 55 nm, and particularly preferably from 5 nm to 35 nm.

The primary particle size of the pigment can be measured by a known method such as electron microscopy.

Among these, the pigment is preferably a pigment selected from an anthraquinone pigment, a diketopyrrolopyrrole pigment, a phthalocyanine pigment, a quinophthalone pigment, an isoindoline pigment, an azomethine pigment, and a dioxazine pigment. In particular, C. I. Pigment Red 177 (anthraquinone pigment), C. I. Pigment Red 254 (diketopyrrolopyrrole pigment), C. I. Pigment Green 7, 36, 58, C. I. Pigment Blue 15:6 (phthalocyanine pigment), C. I. Pigment Yellow 138 (quinophthalone pigment), C. I. Pigment Yellow 139, 185 (isoindoline pigments), C. I. Pigment Yellow 150 (azomethine pigment), and C. I. Pigment Violet 23 (dioxazine pigment) are particularly preferable.

In the case where a pigment is blended into the composition of the present invention, the content of the pigment is preferably from 10% by mass to 70% by mass, more preferably from 20% by mass to 60% by mass, and still more preferably from 25% by mass to 50% by mass, with respect to the total amount of components excluding a solvent, contained in the colored composition.

The composition of the present invention may include one kind or two or more kinds of pigment. In the case where the composition includes two or more kinds of pigment, the total amount thereof is preferably within this range.

<Photopolymerization Initiator (D)>

From the viewpoint of further improving sensitivity, it is preferable that the colored composition of the present invention contains a photopolymerization initiator.

The photopolymerization initiator is not particularly limited as long as the photopolymerization initiator has a function of initiating polymerization of the polymerizable compound, and can be appropriately selected from known photopolymerization initiators. For example, photopolymerization initiators sensitive to light rays in a range from the ultraviolet region to visible light are preferable. In addition, the photopolymerization initiator may be either an activator which interacts with a photo-excited sensitizer in any way and generates active radicals or an initiator which initiates cationic polymerization according to the type of monomer.

Furthermore, it is preferable that the photopolymerization initiator contains at least one kind of compound having at least a molar absorption coefficient of about 50 in a range of about 300 nm to 800 nm (more preferably 330 nm to 500 nm).

Examples of the photopolymerization initiator include halogenated hydrocarbon derivatives (for example, a derivative having a triazine skeleton, and a derivative having an oxadiazole skeleton), acyl phosphine compounds such as acyl phosphine oxide, oxime compounds such as hexaaryl biimidazole and oxime derivatives, organic peroxides, thio compounds, ketone compounds, aromatic onium salts, ketoxime ethers, amino acetophenone compounds, and hydroxyacetophenone, among which oxime compounds are preferable.

Furthermore, from the viewpoint of exposure sensitivity, the compound is preferably a compound selected from a group consisting of a trihalomethyl triazine compound, a benzyl dimethyl ketal compound, an α-hydroxyketone compound, an α-aminoketone compound, an acyl phosphine compound, a phosphine oxide compound, a metallocene compound, an oxime compound, a triallyl imidazole dimer, an onium compound, a benzothiazole compound, a benzophenone compound, an acetophenone compound and a derivative thereof, a cyclopentadiene-benzene-iron complex and a salt thereof, a halomethyl oxadiazole compound, and a 3-aryl-substituted coumarin compound.

The compound is more preferably a trihalomethyl triazine compound, an α-aminoketone compound, an acyl phosphine compound, a phosphine oxide compound, an oxime compound, a triallyl imidazole dimer, an onium compound, a benzophenone compound, or an acetophenone compound, and particularly preferably at least one kind of compound selected from a group consisting of a trihalomethyl triazine compound, an α-aminoketone compound, an oxime compound, a triallyl imidazole compound, a benzophenone compound, a triaryl imidazole compound, and a benzimidazole compound. Further, the triarylimidazole compound may be a mixture thereof with benzimidazole.

Specifically, the trihalomethyltriazine compound is exemplified as follows. Incidentally, Ph is a phenyl group.

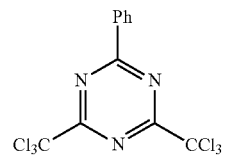

As the triarylimidazole compound and the benzimidazole compound, the following compounds are exemplified.

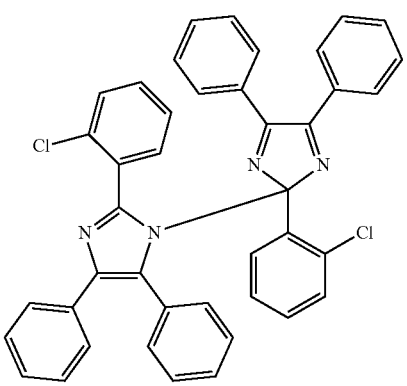

(1-6a)

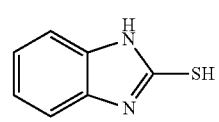

(1-6b)

As the trihalomethyltriazine compound, a commercially available product can also be used, and for example, TAZ-107 (manufactured by Midori Kagaku Co., Ltd.) can also be used.

Particularly, in the case where the colored composition of the present invention is used for the manufacture of a color filter included in a solid-state image sensor, a fine pattern needs to be formed in a sharp shape. Accordingly, it is important that the composition has curability and is developed without residues in an unexposed area. From this viewpoint, it is particularly preferable to use an oxime compound as a polymerization initiator. In particular, in the case where a fine pattern is formed in the solid-state image sensor, stepper exposure is used for exposure for curing. However, the exposure machine used at this time is damaged by halogen in some cases, so it is necessary to reduce the amount of a polymerization initiator added. In consideration of this point, in order to form a fine pattern as in a solid-state image sensor, it is particularly preferable to use an oxime compound as the photopolymerization initiator (D).

Examples of the halogenated hydrocarbon compound having a triazine skeleton include the compounds described in Wakabayashi, et al., Bull. Chem. Soc. Japan, 42, 2924 (1969), the compounds described in UK1388492B, the compounds described in JP1978-133428A (JP-S53-133428A), the compounds described in GE3337024B, the compound described in F. C. Schaefer, et al., J. Org. Chem.; 29, 1527 (1964), the compounds described in JP1987-58241A (JP-S62-58241A), the compounds described in JP1993-281728A (JP-H05-281728A), the compounds described in JP1993-34920A (JP-H05-34920A), and the compounds described in U.S. Pat. No. 4,212,976A, in particular, the compounds described in paragraph No. "0075" of JP2013-077009A.

In addition, as photopolymerization initiators other than those above, acridine derivatives are exemplified. Specific examples thereof include the compound described in paragraph No. "0076" of JP2013-077009A, the contents of which are incorporated herein.

Examples of the ketone compound include the compound described in paragraph No. "0077" of JP2013-077009A, the contents of which are incorporated herein.

As the photopolymerization initiator, a hydroxyacetophenone compound, an aminoacetophenone compound, and an acyl phosphine compound can also be suitably used. More specifically, for example, the aminoacetophenone-based initiator described in JP1998-291969A (JP-H10-291969A), and the acyl phosphine oxide-based initiator described in JP4225898B can also be used.

As the hydroxyacetophenone-based initiator, IRGACURE-184, DAROCUR-1173, IRGACURE-500, IRGACURE-2959, and IRGACURE-127 (product names, all manufactured by BASF) can be used. As the aminoacetophenone-based initiator, IRGACURE-907, IRGACURE-369, and IRGACURE-379 (product names, all manufactured by BASF) which are commercially available products can be used. In addition, as the aminoacetophenone-based initiator, the compound described in JP2009-191179A, of which an absorption wavelength matches a light source with a long wavelength of 365 nm, 405 nm, or the like can be used. Moreover, as the acyl phosphine-based initiator, IRGACURE-819 or DAROCUR-TPO (product names, both manufactured by BASF) which are commercially available products can be used.

Examples of the photopolymerization initiator more preferably include oxime compounds. As specific examples of the oxime compounds, the compound described in JP2001-233842A, the compound described in JP2000-80068A, or the compound described in JP2006-342166A can be used.

Examples of the oxime compound such as an oxime derivative, which is suitably used as the photopolymerization initiator in the present invention, include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Examples of the oxime compound include the compounds described in J. C. S. Perkin II (1979), pp. 1653-1660, J. C. S. Perkin II (1979), pp. 156-162, Journal of Photopolymer Science and Technology (1995), pp. 202-232, and JP2000-66385A; and the compounds described respectively in JP2000-80068A, JP2004-534797A, and JP2006-342166A.

As the commercially available product, IRGACURE-OXE01 (manufactured by BASF) and IRGACURE-OXE02 (manufactured by BASF) are also suitably used.

Furthermore, as oxime compounds other than the above, the compound described in JP2009-519904A in which oxime is linked to an N-position of carbazole, the compound described in U.S. Pat. No. 7,626,957B in which a heterosubstituent is introduced into a benzophenone site, the compounds described in JP2010-15025A and US2009/292039A in which a nitro group is introduced into a dye structure, the ketoxime compound described in WO2009/131189A, the compound described in U.S. Pat. No. 7,556,910B which contains a triazine skeleton and an oxime skeleton in the same molecule, the compound described in JP2009-221114A, which has maximum absorption at 405 nm and has excellent sensitivity to a light source of a g-ray, and the like may be used.

The cyclic oxime compounds described in JP2007-231000A and JP2007-322744A can also be suitably used. Among the cyclic oxime compounds, the cyclic oxime compounds ring-fused to a carbazole dye, which are described in JP2010-32985A and JP2010-185072A, are preferable from the viewpoint of high sensitivity since these compounds have high light absorptivity.

Furthermore, the compound described in JP2009-242469A, which is an oxime compound having an unsaturated bond in a specific moiety, can also be suitably used since this compound makes it possible to improve sensitivity by reproducing active radicals from polymerization-inactive radicals.

Particularly preferred examples of the oxime compounds include the oxime compound having a specific substituent described in JP2007-269779A and the oxime compound having a thioaryl group described in JP2009-191061A.

Specifically, the oxime compound which is a photopolymerization initiator is preferably a compound represented by the following General Formula (OX-1). Incidentally, the compound may be an oxime compound in which an N—O bond of oxime forms an (E) isomer, an oxime compound in which the N—O bond forms a (Z) isomer, or a mixture in which the N—O bonds form a mixture of an (E) isomer and a (Z) isomer.

(OX-1)

In General Formula (OX-1), R and B each independently represent a monovalent substituent, A represents a divalent organic group, and Ar represents an aryl group.

In General Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. Moreover, the above substituents may be further substituted with other substituents.

Examples of the substituents include a halogen atom, an aryloxy group, an alkoxycarbonyl or aryloxycarbonyl group, an acyloxy group, an acyl group, an alkyl group, and an aryl group.

The alkyl group is preferably an alkyl group having 1 to 30 carbon atoms, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group is preferably an aryl group having 6 to 30 carbon atoms, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-tolyl group, an m-tolyl group, a p-tolyl group, a xylyl group, an o-cumenyl group, an m-cumenyl group, a p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl group is preferably an acyl group having 2 to 20 carbon atoms, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group is preferably an alkoxycarbonyl group having 2 to 20 carbon atoms, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

As the heterocyclic group, an aromatic or aliphatic heterocycle having a nitrogen atom, an oxygen atom, a sulfur atom, or a phosphorus atom is preferable.

Specific examples of the heterocyclic group include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxantolyl group.

Specific examples of the alkylthiocarbonyl group include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

In General Formula (OX-1), the monovalent substituent represented by B represents an aryl group, a heterocyclic group, an arylcarbonyl group, or a heterocyclic carbonyl group. These groups may have one or more substituents, and examples of the substituents include the substituents described above. In addition, the substituents described above may be further substituted with other substituents.

Among these, the structures shown below are particularly preferable.

In the following structures, Y, X, and n have the same definitions as Y, X, and n, respectively, in General Formula (OX-2) which will be described later, and the preferred examples thereof are also the same.

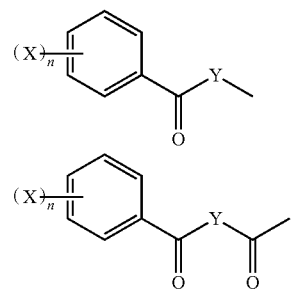

In Formula (OX-1), examples of the divalent organic group represented by A include an alkylene group having 1 to 12 carbon atoms, a cycloalkylene group, and an alkynylene group, and these groups may have one or more substituents. Examples of the substituents include the substituents described above. Further, the substituents described above may be further substituted with other substituents.

Among these, as A in Formula (OX-1), from the viewpoints of improving sensitivity and inhibiting coloring caused by elapse of time during heating, an unsubstituted alkylene group, an alkylene group substituted with an alkyl group (for example, a methyl group, an ethyl group, a tert-butyl group, and a dodecyl group), an alkylene group substituted with an alkenyl group (for example, a vinyl group and an allyl group), and an alkylene group substituted with an aryl group (for example, a phenyl group, a p-tolyl group, a xylyl group, a cumenyl group, a naphthyl group, an anthryl group, a phenanthryl group, and a styryl group) are preferable.

In Formula (OX-1), the aryl group represented by Ar is preferably an aryl group having 6 to 30 carbon atoms, and may have a substituent. Examples of the substituent include the same ones as the substituents introduced into the substituted aryl groups, which are exemplified above as specific examples of the aryl group which may have a substituent.

Among these, from the viewpoints of improving sensitivity and inhibiting coloration caused by elapse of time during heating, a substituted or unsubstituted phenyl group is preferable.

In Formula (OX-1), a structure "SAr" formed of Ar and S adjacent thereto in Formula (OX-1) is preferably the following structure from the viewpoint of sensitivity. Incidentally, Me represents a methyl group, and Et represents an ethyl group.

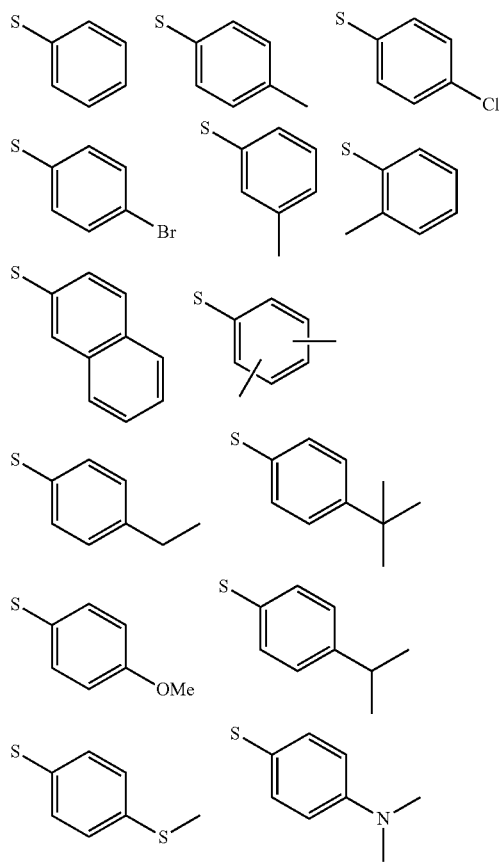

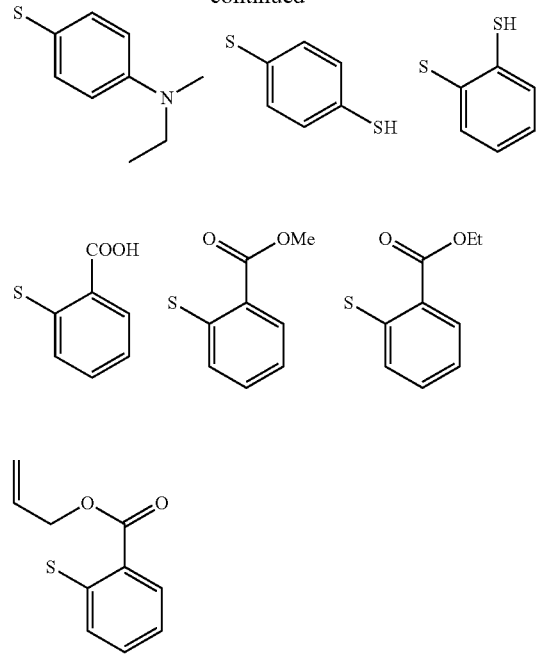

The oxime compound is preferably a compound represented by the following General Formula (OX-2).

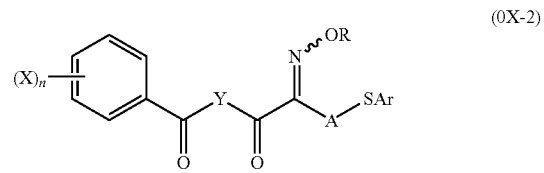

(OX-2)

In General Formula (OX-2), R and X each independently represent a monovalent substituent, A and Y each independently represent a divalent organic group, Ar represents an aryl group, and n represents an integer of 0 to 5. R, A, and Ar in General Formula (OX-2) have the same definitions as R, A, and Ar, respectively, in General Formula (OX-1), and the preferred examples thereof are also the same.

Examples of the monovalent substituent represented by X in General Formula (OX-2) include an alkyl group, an aryl group, an alkoxy group, an aryloxy group, an acyloxy group, an acyl group, an alkoxycarbonyl group, an amino group, a heterocyclic group, and a halogen atom. These groups may have one or more substituents, and examples of the substituents include the substituents described above. Moreover, the substituents described above may be further substituted with other substituents.

Among these, from the viewpoints of improving solubility in solvents and absorption efficiency in a long-wavelength region, X in General Formula (OX-2) is preferably an alkyl group.

Furthermore, n in Formula (2) represents an integer of 0 to 5 and preferably represents an integer of 0 to 2.

Examples of the divalent organic group represented by Y in General Formula (OX-2) include the following structures. In the following groups, "*" represents a position where Y binds to a carbon atom adjacent thereto in Formula (OX-2).

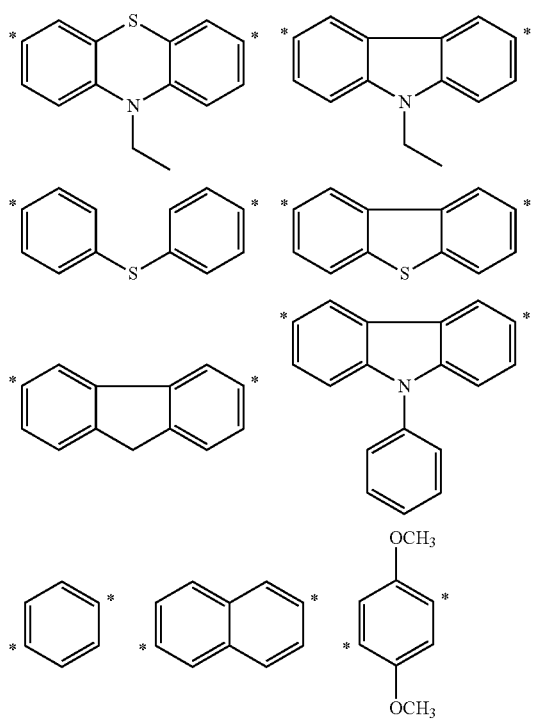

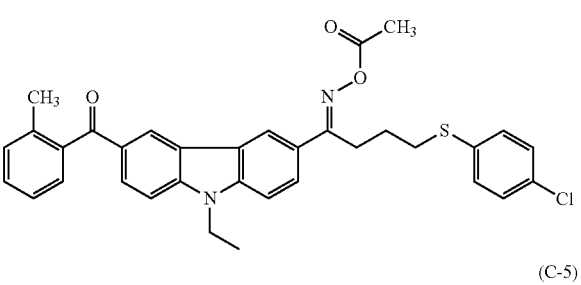

In General Formula (OX-3) or General Formula (OX-4), R and X each independently represent a monovalent substituent, A represents a divalent organic group, Ar represents an aryl group, and n represents an integer of 0 to 5.

R, X, A, Ar, and n in General Formula (OX-3) or General Formula (OX-4) have the same definitions as R, X, A, Ar, and n, respectively, in General Formula (OX-2), and the preferred examples thereof are also the same.

Specific examples (C-4) to (C-13) of the oxime compound which are preferably used are shown below, but the present invention is not limited thereto.

Among these, from the viewpoint of improving sensitivity, the following structures are preferable.

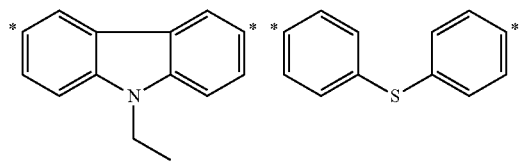

Moreover, the oxime compound is preferably a compound represented by the following General Formula (OX-3) or General Formula (OX-4).

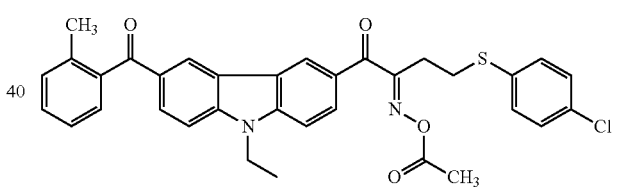

(C-4)

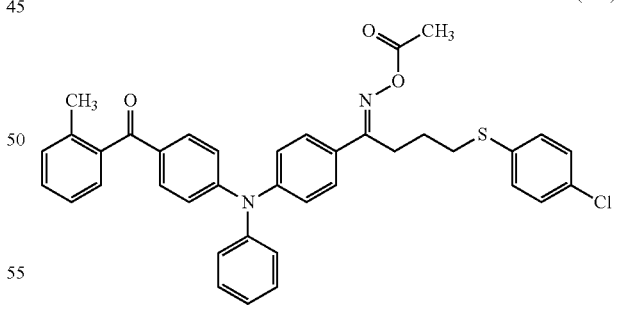

(C-5)

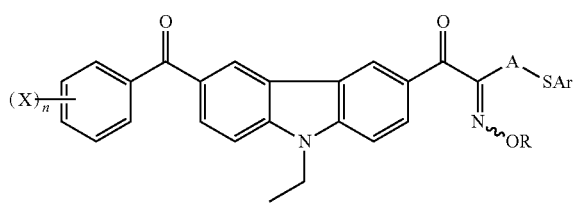

(C-6)

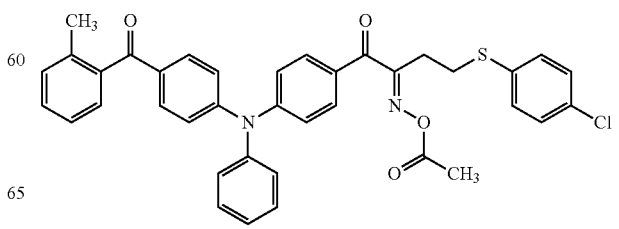

(C-7)

-continued

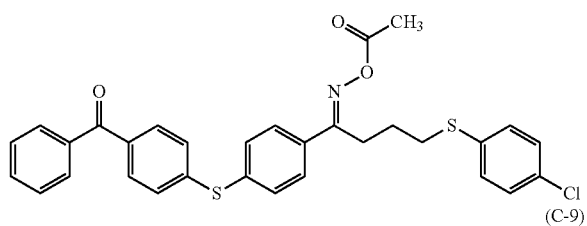
(C-8)

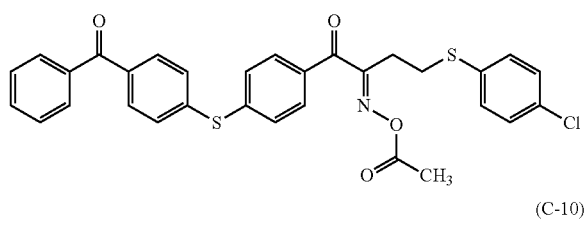
(C-9)

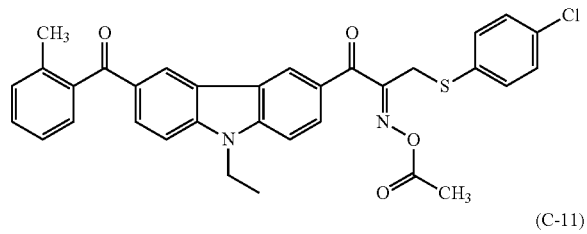
(C-10)

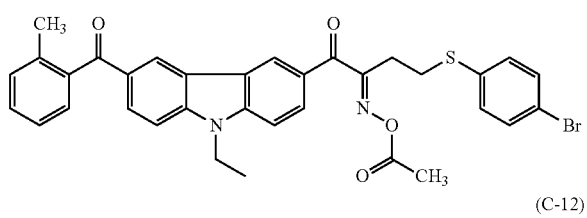
(C-11)

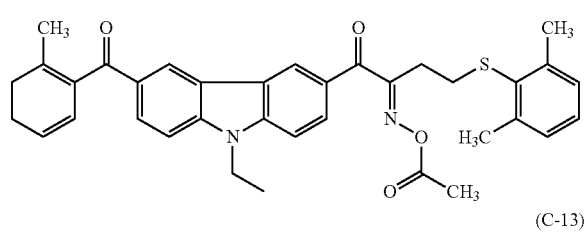
(C-12)

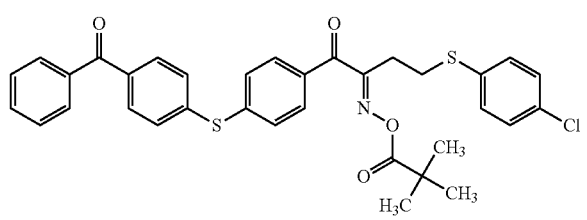
(C-13)

The oxime compound has a maximum absorption wavelength in a wavelength region of 350 nm to 500 nm and preferably has an absorption wavelength in a wavelength region of 360 nm to 480 nm, and an oxime compound showing a high absorbance at 365 nm and 455 nm is particularly preferable.

From the viewpoint of sensitivity, the molar absorption coefficient at 365 nm or 405 nm of the oxime compound is preferably from 1,000 to 300,000, and more preferably from 2,000 to 300,000, and particularly preferably from 5,000 to 200,000.

The molar absorption coefficient of the compound can be measured using a known method, but specifically, it is preferable to measure the molar absorption coefficient by means of, for example, a UV-visible spectrophotometer (Cary-5 spectrophotometer manufactured by Varian) by using an ethyl acetate solvent at a concentration of 0.01 g/L.

In the case where the colored composition of the present invention contains the photopolymerization initiator (D), the content of the photopolymerization initiator is preferably from 0.1% by mass to 50% by mass, more preferably from 0.5% by mass to 30% by mass, and still more preferably from 1% by mass to 20% by mass, with respect to the total solid contents of the colored composition. Within this range, improved sensitivity and pattern formability are obtained.

The composition of the present invention may include one kind or two or more kinds of photopolymerization initiator. In the case where the composition includes two or more kinds of the photopolymerization initiator, the total amount thereof is preferably within this range.

<Pigment Dispersant>

In the case where the colored composition of the present invention has a pigment, a pigment dispersant can be used in combination with other components, as desired.

Examples of the pigment dispersant which can be used in the present invention include polymer dispersants [for example, a polyamide amine and a salt thereof, a polycarboxylic acid and a salt thereof, a high-molecular-weight unsaturated acid ester, a modified polyurethane, a modified polyester, a modified poly(meth)acrylate, a (meth)acrylic copolymer, and a naphthalene sulfonate formalin condensate], surfactants such as a polyoxyethylene alkyl phosphoric ester, a polyoxyethylene alkylamine, and an alkanolamine; and pigment derivatives.

The polymer dispersants can be further classified into straight-chain polymers, terminal-modified polymers, graft polymers, and block polymers, according to the structure.

Examples of the terminal-modified polymers which have a moiety anchored to the pigment surface include a polymer having a phosphoric acid group in the terminal as described in JP1991-112992A (JP-H03-112992A), JP2003-533455A, and the like, a polymer having a sulfonic acid group in the terminal as described in JP2002-273191A, a polymer having a partial skeleton or a heterocycle of an organic dye as described in JP1997-77994A (JP-H09-77994), and the like. Moreover, a polymer obtained by introducing two or more moieties (acid groups, basic groups, partial skeletons of an organic dye, or heterocycles) anchored to the pigment surface into a polymer terminal as described in JP2007-277514A is also preferable since this polymer is excellent in dispersion stability.

Examples of the graft polymers having a moiety anchored to the pigment surface include polyester-based dispersants and the like, and specific examples thereof include a product of a reaction between a poly(lower alkyleneimine) and a polyester, which is described in JP1979-37082A (JP-S54-37082A), JP1996-507960A (JP-H08-507960A), JP2009-258668A, and the like, a product of a reaction between a polyallylamine and a polyester, which is described in JP1997-169821A (JP-H09-169821A) and the like, a copolymer of a macromonomer and a nitrogen atom monomer, which is described in JP1998-339949A (JP-H10-339949A), JP2004-37986A, WO2010/110491A, and the like, a graft polymer having a partial skeleton or a heterocycle of an organic dye, which is described in JP2003-238837A, JP2008-9426A, JP2008-81732A, and the like, and a copolymer of a macromonomer and an acid group-containing monomer, which is described in JP2010-106268A, and the like. In particular, an amphoteric dispersion resin having basic and acid groups, which is described in JP2009-203462A, is particularly preferable from the viewpoint of dispersibility of a pigment dispersion, dispersion stability, and developability which a colored composition using the pigment dispersion exhibits.

As the macromonomer used in production of a graft polymer having a moiety anchored to the pigment surface by radical polymerization, known macromonomers can be used. Examples thereof include macromonomers AA-6 (polymethyl methacrylate having a methacryloyl group as a terminal group), AS-6 (polystyrene having a methacryloyl group as a terminal group), AN-6S (a copolymer of styrene and acrylonitrile which has a methacryloyl group as a terminal group), and AB-6 (polybutyl acrylate having a methacryloyl group as a terminal group) manufactured by TOAGOSEI, CO., LTD.; Placcel FM 5 (a product obtained by adding 5 molar equivalents of s-caprolactone to 2-hydroxyethyl methacrylate) and FA10L (a product obtained by adding 10 molar equivalents of s-caprolactone to 2-hydroxyethyl acrylate) manufactured by DAICEL Corporation; a polyester-based macromonomer described in JP1990-272009A (JP-H02-272009A), and the like. Among these, from the viewpoint of dispersibility of the pigment, dispersion stability, and the developability which the colored composition using the pigment dispersion exhibits, the polyester-based macromonomer excellent in flexibility and solvent compatibility is particularly preferable. Further, a polyester-based macromonomer represented by the polyester-based macromonomer described in JP1990-272009A (JP-H02-272009A) is particularly preferable.

As the block polymer having a moiety anchored to the pigment surface, block polymers described in JP2003-49110A, JP2009-52010A, and the like are preferable.

Other pigment dispersants which can be used in the present invention can be obtained in the form of commercially available products, and specific examples thereof include "DA-7301" manufactured by Kusumoto Chemicals, Ltd., "Disperbyk-101 (polyamidamine phosphate), 107 (carboxylic ester), 110, 111 (copolymer including an acid group), 130 (polyamide), 161, 162, 163, 164, 165, 166, and 170 (polymeric copolymer)", and "BYK-P104 and P105 (high-molecular-weight unsaturated polycarboxylic acid)", manufactured by BYK-Chemie, "EFKA 4047, 4010 to 4050, 4050 to 4165 (polyurethane-based), EFKA 4330 to 4340 (block copolymer), 4400 to 4402 (modified polyacrylate), 5010 (polyesteramide), 5765 (high-molecular-weight polycarboxylic acid salt), 6220 (aliphatic polyester), 6745 (phthalocyanine derivative), and 6750 (azo pigment derivative)" manufactured by EFKA, "Ajisper PB821, PB822, PB880, and PB881" manufactured by Ajinomoto Fine-Techno Co., Inc., "Flowlen TG-710 (urethane oligomer)" and "Polyflow No. 50E, No. 300 (acrylic copolymer), manufactured by KYOEISHA CHEMICAL CO., LTD., "Disparlon KS-860, 873SN, 874, #2150 (aliphatic polyvalent carboxylic acid), #7004 (polyether ester), DA-703-50, DA-705, and DA-725", manufactured by Kusumoto Chemicals, Ltd., "Demol RN, N (naphthalene sulfonate formaldehyde condensate), MS, C, SN-B (aromatic sulfonate formaldehyde condensate)", "Homogenol L-18 (polymeric polycarboxylic acid)," "Emulgen 920, 930, 935, and 985 (polyoxyethylene nonyl phenyl ether)", and "Acetamine 86 (stearylamine acetate)", manufactured by Kao Corporation, "Solsperse 5000 (phthalocyanine derivative), 22000 (azo pigment derivative), 13240 (polyesteramine), 3000, 17000, and 27000 (polymers having a functional portion in the terminal portion), and 24000, 28000, 32000, and 38500 (graft polymers)", manufactured by Lubrizol Japan Ltd., "Nikkol T106 (polyoxyethylene sorbitan monooleate) and MYS-IEX (polyoxyethylene monostearate)" manufactured by NIKKO CHEMICALS Co., Ltd., "Hinoact T-8000E" and the like manufactured by Kawaken Fine Chemicals Co., Ltd., "organosiloxane polymer KP341" manufactured by Shin-Etsu Chemical Co., Ltd., "W001: a cationic surfactant" manufactured by Yusho Co., Ltd., nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan aliphatic ester, and anionic surfactants such as "W004, W005, and W017", "EFKA-46, EFKA-47, EFKA-47EA, EFKA polymer 100, EFKA polymer 400, EFKA polymer 401, and EFKA polymer 450" manufactured by MORISHITA & CO., LTD., polymer dispersants such as "Disperse aid 6, Disperse aid 8, Disperse aid 15, and Disperse aid 9100" manufactured by SAN NOPCO Ltd., "Adeka Pluronic L31, F38, L42, L44, L61, L64, F68, L72, P95, F77, P84, F87, P94, L101, P103, F108, L121, and P-123" manufactured by ADEKA Corporation, and "Ionet (product name) S-20" manufactured by Sanyo Chemical Industries, Ltd.

These pigment dispersants may be used alone or in combination of two or more kinds thereof. In the present invention, it is particularly preferable to use a combination of a pigment derivative and a polymer dispersant. Further, the pigment dispersant may be used in combination with an alkali-soluble resin, together with a terminal-modified polymer having a moiety anchored to the pigment surface, a graft polymer, or a block polymer. Examples of the alkali-soluble resin include a (meth)acrylic acid copolymer, an itaconic acid copolymer, a crotonic acid copolymer, a maleic acid copolymer, a partially esterified maleic acid copolymer, and an acidic cellulose derivative having a carboxylic acid in a side chain, and a (meth)acrylic acid copolymer is particularly preferable. In addition, the N-position-substituted maleimide monomers copolymer described in JP1998-300922A (JP-H10-300922A), the ether dimer copolymers described in JP2004-300204A, and the alkali-soluble resins containing a polymerizable group described in JP1995-319161A (JP-H07-319161A) are also preferable.

In the case where the colored composition contains a pigment dispersant, the total content of the pigment dispersant in the colored composition is preferably from 1 part by mass to 80 parts by mass, more preferably from 5 parts by mass to 70 parts by mass, and still more preferably from 10 parts by mass to 60 parts by mass, with respect to 100 parts by mass of the pigment. The composition of the present invention may include one kind or two or more kinds of pigment dispersant. In the case where the composition includes two or more kinds of the pigment dispersant, the total amount thereof is preferably within this range.

Specifically, in the case where a polymer dispersant is used, the amount of the polymer dispersant used is preferably from 5 parts by mass to 100 parts by mass, and more preferably from 10 parts by mass to 80 parts by mass, with respect to 100 parts by mass of the pigment.

Moreover, in the case where a pigment derivative is used in combination with other components, the amount of the pigment derivative used is preferably from 1 part by mass to 30 parts by mass, more preferably from 3 parts by mass to 20 parts by mass, and particularly preferably from 5 parts by mass to 15 parts by mass, with respect to 100 parts by mass of the pigment.

In the colored composition, from the viewpoint of curing sensitivity and color density, the total content of the coloring agent components and the pigment dispersant is preferably from 50% by mass to 90% by mass, more preferably from 55% by mass to 85% by mass, and still more preferably from 60% by mass to 80% by mass, with respect to the total solid contents constituting the colored composition.

<Alkali Soluble Resin (F)>

It is preferable that the colored composition of the present invention further contains an alkali-soluble resin.

The molecular weight of the alkali-soluble resin is not particularly determined, but Mw is preferably from 5000 to 100,000. Further, Mn is preferably from 1000 to 20,000.

The alkali-soluble resin can be appropriately selected from alkali-soluble resins which are linear organic high molecular-weight polymers and have at least one group enhancing alkali-solubility in a molecule (preferably, a molecule having an acrylic copolymer or a styrene-based copolymer as a main chain). From the viewpoint of heat resistance, a polyhydroxystyrene-based resin, a polysiloxane-based resin, an acrylic resin, an acrylamide-based resin, and an acryl/acrylamide copolymer resin are preferable. Further, from the viewpoint of controlling developability, an acryl-based resin, an acrylamide-based resin, and an acryl/acrylamide copolymer resin are preferable.

Examples of the group promoting alkali-solubility (hereinafter also referred to as an "acid group") include a carboxyl group, a phosphoric acid group, a sulfonic acid group, a phenolic hydroxyl group, and the like. The group promoting alkali-solubility is preferably a group which is soluble in an organic solvent and can be developed by an aqueous weak alkaline solution, and particularly preferred examples thereof include (meth)acrylic acid. These acid groups may be used alone or in combination of two or more kinds thereof.

Examples of the monomer which can give the acid group after polymerization include monomers having a hydroxyl group, such as 2-hydroxyethyl(meth)acrylate, monomers having an epoxy group, such as glycidyl(meth)acrylate, and monomers having an isocyanate group, such as 2-isocyanatoethyl(meth)acrylate. The monomers for introducing these acid groups may be used alone or in combination of two or more kinds thereof. In order to introduce the acid group into the alkali-soluble resin, for example, the monomer having the acid group and/or the monomer which can give the acid group after polymerization (hereinafter referred to as a "monomer for introducing an acid group" in some cases) may be polymerized as a monomer component.

Incidentally, in the case where a monomer which can give the acid group after polymerization is used as a monomer component to introduce the acid group, a treatment for giving the acid group, which will be described later, needs to be performed after polymerization.

For production of the alkali-soluble resin, for example, a method using known radical polymerization can be applied. Various polymerization conditions for producing the alkali-soluble resin by radical polymerization, such as a temperature, a pressure, the type and amount of a radical initiator, and the type of a solvent, can be easily set by those skilled in the art, and the conditions can also be determined experimentally.

As the linear organic high-molecular weight polymer used as the alkali-soluble resin, polymers having a carboxylic acid in a side chain are preferable, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin or the like such as a novolac resin, an acidic cellulose derivative having a carboxylic acid in a side chain, and a polymer obtained by adding an acid anhydride to a polymer having a hydroxyl group. In particular, a copolymer of (meth)acrylic acid and another monomer copolymerizable with the (meth)acrylic acid is suitable as the alkali-soluble resin. Examples of another monomer copolymerizable with (meth)acrylic acid include alkyl(meth)acrylate, aryl(meth)acrylate, and a vinyl compound. Examples of the alkyl(meth)acrylate and aryl (meth)acrylate include methyl(meth)acrylate, ethyl(meth) acrylate, propyl(meth)acrylate, butyl(meth)acrylate, isobutyl(meth)acrylate, pentyl(meth)acrylate, hexyl(meth) acrylate, octyl(meth)acrylate, phenyl(meth)acrylate, benzyl (meth)acrylate, tolyl(meth)acrylate, naphthyl(meth)acrylate, and cyclohexyl(meth)acrylate. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of the N-position-substituted maleimide monomer disclosed in JP1998-300922A (JP-H10-300922A) include N-phenylmaleimide and N-cyclohexylmaleimide. Incidentally, other monomers copolymerizable with (meth)acrylic acid may be used alone or in combination of two or more kinds thereof.

It is also preferable that the colored composition contains, as the alkali-soluble resin, a polymer (a) obtained by polymerizing monomer components including a compound represented by the following General Formula (ED) (hereinafter also referred to as an "ether dimer" in some cases) as an essential component.

General Formula (ED)

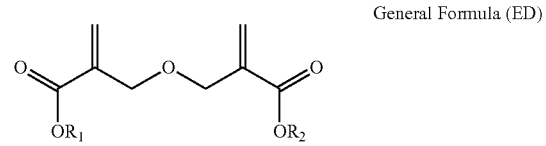

In General Formula (ED), $R_1$ and $R_2$ each independently represent a hydrogen atom or a hydrocarbon group having 1 to 25 carbon atoms, which may have a substituent.

Thus, the colored composition of the present invention can form a cured coating film which has extremely excellent heat resistance as well as transparency. In General Formula (ED) which represents the ether dimer, the hydrocarbon group having 1 to 25 carbon atoms, represented by $R_1$ and $R_2$, which may have a substituent, is not particularly limited, and examples thereof include linear or branched alkyl groups such as methyl, ethyl, n-propyl, isopropyl, n-butyl, isobutyl, tert-butyl, tert-amyl, stearyl, lauryl, and 2-ethylhexyl; aryl groups such as phenyl; alicyclic groups such as cyclohexyl, tert-butylcyclohexyl, dicyclopentadienyl, tricyclodecanyl, isobornyl, adamantyl, and 2-methyl-2-adamantyl; alkyl groups substituted with alkoxy such as 1-methoxyethyl and 1-ethoxyethyl; and alkyl groups substituted with an aryl group such as benzyl. Among these, from the viewpoint of heat resistance, substituents of primary or secondary carbon, which are not easily eliminated by an acid or heat, such as methyl, ethyl, cyclohexyl, and benzyl, are preferable.

Specific examples of the ether dimer include dimethyl-2, 2'-[oxybis(methylene)]bis-2-propenoate, diethyl-2,2'-[oxybis(methylene)]bis-2-propenoate, di(n-propyl)-2,2'-[oxybis (methylene)]bis-2-propenoate, di(isopropyl)-2,2'-[oxybis (methylene)]bis-2-propenoate, di(n-butyl)-2,2'-[oxybis (methylene)]bis-2-propenoate, di(isobutyl)-2,2'-[oxybis (methylene)]bis-2-propenoate, di(tert-butyl)-2,2'-[oxybis (methylene)]bis-2-propenoate, di(tert-amyl)-2,2'-[oxybis (methylene)]bis-2-propenoate, di(stearyl)-2,2'-[oxybis (methylene)]bis-2-propenoate, di(lauryl)-2,2'-[oxybis (methylene)]bis-2-propenoate, di(2-ethylhexyl)-2,2'-[oxybis (methylene)]bis-2-propenoate, di(1-methoxyethyl)-2,2'-[oxybis(methylene)]bis-2-propenoate, di(1-ethoxyethyl)-2, 2'-[oxybis(methylene)]bis-2-propenoate, dibenzyl-2,2'-[oxybis(methylene)]bis-2-propenoate, diphenyl-2,2'-[oxybis (methylene)]bis-2-propenoate, dicyclohexyl-2,2'-[oxybis (methylene)]bis-2-propenoate, di(tert-butylcyclohexyl)-2, 2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamantyl)-2,2'-[oxybis (methylene)]bis-2-propenoate. Among these, dimethyl-2,2'-[oxybis(methylene)]bis-2-propenoate, diethyl-2,2'-[oxybis (methylene)]bis-2-propenoate, dicyclohexyl-2,2'-[oxybis (methylene)]bis-2-propenoate, and dibenzyl-2,2'-[oxybis (methylene)]bis-2-propenoate are particularly preferable. These ether dimers may be used alone or in combination of two or more kinds thereof. The structure derived from the compound represented by General Formula (ED) may be copolymerized with other monomers.

Moreover, in order to improve the crosslinking efficiency of the colored composition in the present invention, an alkali-soluble resin having a polymerizable group may be used. As the polymer containing a polymerizable group as mentioned above, alkali-soluble resins and the like containing an allyl group, a (meth)acryl group, an allyloxyalkyl group, and the like on a side chain thereof are useful. Examples of the polymer containing the above polymerizable group include Dianal NR series (manufactured by Mitsubishi Rayon Co., Ltd.), Photomer 6173 (a polyurethane acrylic oligomer containing COOH, manufactured by Diamond Shamrock Co., Ltd.), Biscoat R-264 and KS Resist 106 (all manufactured by OSAKA. ORGANIC CHEMICAL INDUSTRY LTD.), Cyclomer P series and Placcel CF200 series (all manufactured by DAICEL Corporation), and Ebecryl 3800 (manufactured by DAICEL-UCB Co., Ltd.). As the alkali-soluble resin containing a polymerizable group, a polymerizable double bond-containing acryl-based resin modified with urethane, which is a resin obtained by reacting an isocyanate group and an OH group in advance to leave an unreacted isocyanate group and performing a reaction between a compound having a (meth)acryloyl group and an acryl-based resin having a carboxyl group, an unsaturated group-containing acryl resin which is obtained by a reaction between an acryl-based resin having a carboxyl group and a compound having both an epoxy group and a polymerizable double bond in a molecule, a polymerizable double bond-containing acryl-based resin which is obtained by a reaction between an acid pendant type epoxy acrylate resin, an acryl-based resin having an OH group, and a dibasic acid anhydride having a polymerizable double bond, a resin obtained by a reaction between an acryl-based resin having an OH group and a compound having isocyanate and a polymerizable group, a resin which is obtained by treating a resin, which has an ester group having an elimination group such as a halogen atom or a sulfonate group in an α-position or a β-position described in JP2002-229207A and JP2003-335814A on a side chain, with a base, and the like are preferable.

As the alkali-soluble resin, particularly, a benzyl(meth) acrylate/(meth)acrylic acid copolymer or a multicomponent copolymer including benzyl(meth)acrylate/(meth)acrylic acid/other monomers is suitable. Examples thereof also include a benzyl(meth)acrylate/(meth)acrylic acid/2-hydroxyethyl(meth)acrylate copolymer obtained by copolymerizing 2-hydroxyethyl methacrylate, a 2-hydroxypropyl (meth)acrylate/a polystyrene macromonomer/benzyl methacrylate/methacrylic acid copolymer described in JP1995-140654A (JP-H07-140654A), a 2-hydroxy-3-phenoxypropyl acrylate/a polymethyl methacrylate macromonomer/benzyl methacrylate/methacrylic acid copolymer, a 2-hydroxyethyl methacrylate/a polystyrene macromonomer/methyl methacrylate/methacrylic acid copolymer, and a 2-hydroxyethyl methacrylate/a polystyrene macromonomer/benzyl methacrylate/methacrylic acid copolymer, and particularly preferably a copolymer of benzyl methacrylate/methacrylic acid.

With respect to the alkali-soluble resin, reference can be made to the descriptions in paragraphs "0558" to "0571" of JP2012-208494A ("0685" to "0700" of the corresponding US2012/0235099A), the contents of which are incorporated herein.

Furthermore, it is preferable to use the copolymers (B) described in paragraph Nos. "0029" to "0063" of JP2012-32767A and the alkali-soluble resins used in Examples of the document; the binder resins described in paragraph Nos. "0088" to "0098" of JP2012-208474A and the binder resins used in Examples of the document; the binder resins described in paragraph Nos. "0022" to "0032" of JP2012-137531A and the binder resins in Examples of the document; the binder resins described in paragraph Nos. "0132" to "0143" of JP2013-024934A and the binder resins used in Examples of the document; the binder resins described in paragraph Nos. "0092" to "0098" of JP2011-242752A and used in Examples; or the binder resins described in paragraph Nos. "0030" to 0072" of JP2012-032770A, the contents of which are incorporated herein. More specifically, the following resins are preferable.

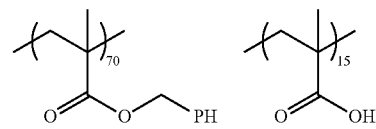

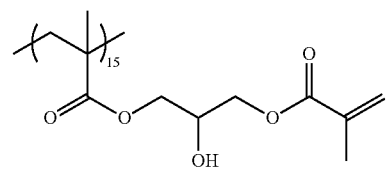

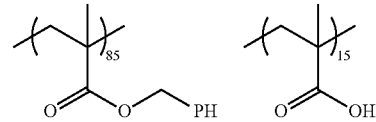

105
-continued
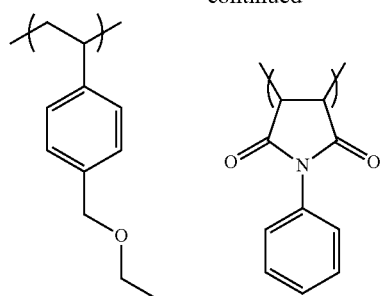
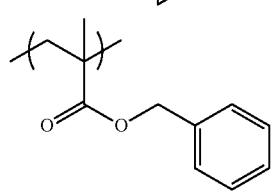
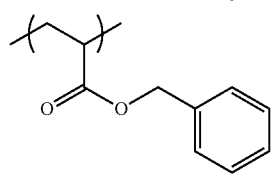
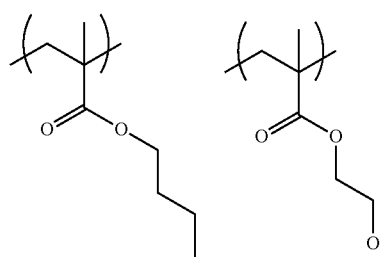
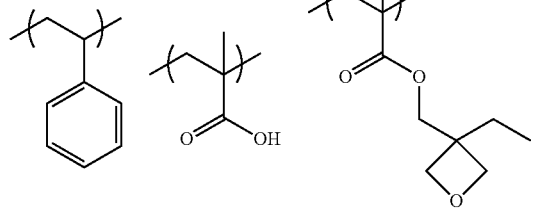
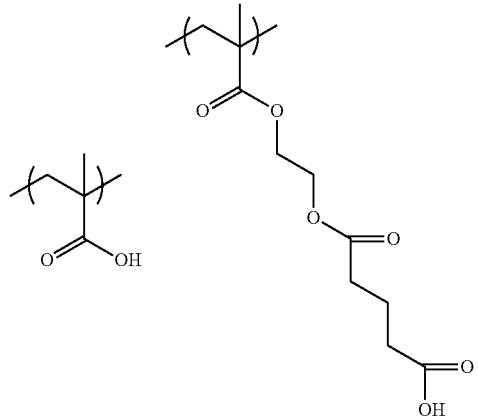
106
-continued
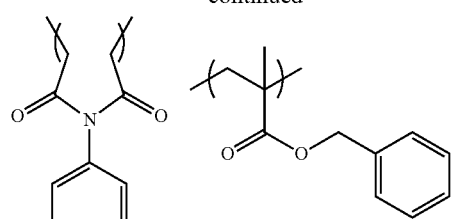
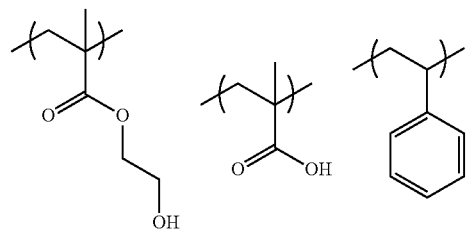
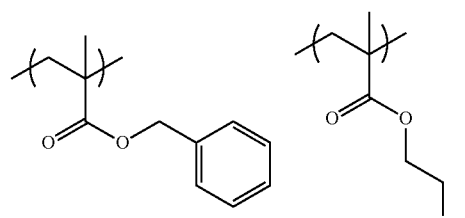
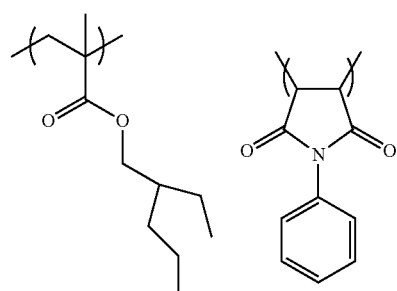
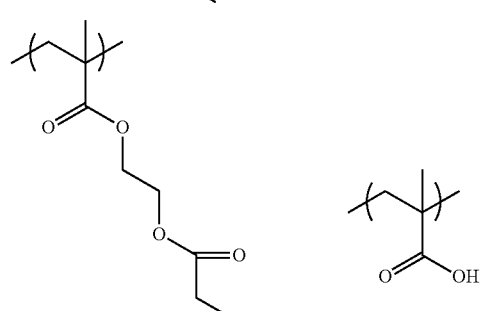
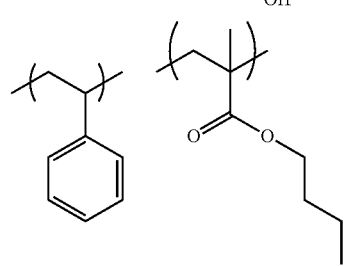

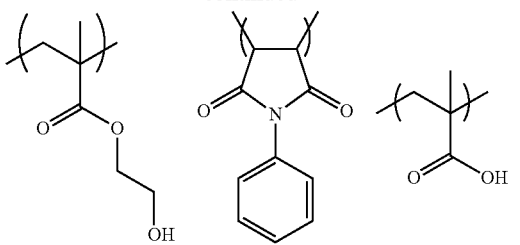
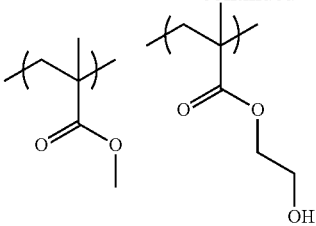

The acid value of the alkali-soluble resin is preferably from 30 mgKOH/g to 200 mgKOH/g, more preferably from 50 mgKOH/g to 150 mgKOH/g, and particularly preferably from 70 mgKOH/g to 120 mgKOH/g.

Furthermore, the weight-average molecular weight (Mw) of the alkali-soluble resin is preferably from 2,000 to 50,000, more preferably from 5,000 to 30,000, and particularly preferably from 7,000 to 20,000.

In the case where the colored composition contains an alkali-soluble resin, the content of the alkali-soluble resin is preferably from 1% by mass to 15% by mass, more preferably from 2% by mass to 12% by mass, and particularly preferably from 3% by mass to 10% by mass, with respect to the total solid contents of the colored composition.

The composition of the present invention may include one kind or two or more kinds of alkali-soluble resin. In the case where the composition includes two or more kinds of the alkali-soluble resin, the total amount thereof is preferably within this range.

<Other Components>

The colored composition of the present invention may further contain other components such as an organic solvent, a crosslinking agent, a polymerization inhibitor, a surfactant, an organic carboxylic acid, and an organic carboxylic anhydride in addition to the respective components described above, within a range which does not diminish the effects of the present invention.

<<Organic Solvent>>

The colored composition of the present invention may contain an organic solvent.

Basically, the organic solvent is not particularly limited as long as the solvent satisfies the solubility of the respective components or the coatability of the colored composition. In particular, it is preferable to select the organic solvent in consideration of the solubility, coatability, and safety of an ultraviolet absorber, the alkali-soluble resin, the dispersant, or the like. In addition, when the colored composition in the present invention is prepared, the composition preferably includes at least two kinds of organic solvent.

Suitable examples of the organic solvents include esters such as ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate (for example, methyl oxyacetate, ethyl oxyacetate, and butyl oxyacetate (for example, methyl methoxyacetate, ethyl methoxyacetate, butyl methoxyacetate, methyl ethoxyacetate, and ethyl ethoxyacetate)), alkyl 3-oxypropionate esters (for example, methyl 3-oxypropionate and ethyl 3-oxypropionate (for example, methyl 3-methoxypropionate, ethyl 3-methoxypropionate, methyl 3-ethoxypropionate, and ethyl 3-ethoxypropionate)), alkyl 2-oxypropionate esters (for example, methyl 2-oxypropionate, ethyl 2-oxypropionate, or propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methyl propionate and ethyl 2-oxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate; ketones such as methyl ethyl ketone, cyclohexanone, 2-heptanone, and 3-butanone; and aromatic hydrocarbons such as toluene and xylene.

From the viewpoint of the solubility of an ultraviolet absorber and the alkali-soluble resin, and improvement of the shape of the coated surface, it is also preferable to mix two or more kinds of these organic solvents. In this case, a mixed solution consisting of two or more kinds selected from the aforementioned methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether, and propylene glycol methyl ether acetate is particularly preferable.

From the viewpoint of coatability, the content of the organic solvent in the colored composition is set such that the concentration of the total solid contents of the composition becomes preferably 5% by mass to 80% by mass, more preferably 5% by mass to 60% by mass, and particularly preferably 10% by mass to 50% by mass.

The composition of the present invention may include one kind or two or more kinds of organic solvent. In the case where the composition includes two or more kinds of organic solvent, the total amount thereof is preferably within this range.

<<Crosslinking Agent>>

It is also possible to improve the hardness of the cured film obtained by curing the colored composition by using a crosslinking agent complementarily in the colored composition of the present invention.

The crosslinking agent is not particularly limited as long as it makes it possible to cure a film by a crosslinking reaction, and examples thereof include (a) an epoxy resin, (b) a melamine compound, a guanamine compound, a glycoluril compound, or a urea compound substituted with at least one substituent selected from a methylol group, an alkoxymethyl group, and an acyloxymethyl group, and (c) a phenol compound, a naphthol compound, or a hydroxyanthracene compound, which is substituted with at least one substituent selected from a methylol group, an alkoxymethyl group, and an acyloxymethyl group. Among these, a polyfunctional epoxy resin is preferable.

With regard to the details of specific examples and the like of the crosslinking agent, reference can be made to the description of paragraphs "0134" to "0147" of JP2004-295116A.

In the case where the colored composition of the present invention contains a crosslinking agent, the blending amount of the crosslinking agent is not particularly limited, but is preferably 2% by mass to 30% by mass, and more preferably 3% by mass to 20% by mass, with respect to the total solid contents of the composition.

The composition of the present invention may include one kind or two or more kinds of crosslinking agent. In the case where the composition includes two or more kinds of crosslinking agent, the total amount thereof is preferably within this range.

<<Polymerization Inhibitor>>

It is preferable to add a small amount of a polymerization inhibitor to the colored composition of the present invention in order to suppress the occurrence of unnecessary thermal polymerization of the polymerizable compound during production or storage of the colored composition.

Examples of the polymerization inhibitor which can be used in the present invention include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), and cerium(III) N-nitrosophenyl hydroxylamine.

In the case where the colored composition of the present invention contains a polymerization inhibitor, the amount of the polymerization inhibitor added is preferably about 0.01% by mass to about 5% by mass, with respect to the total mass of the composition.

The composition of the present invention may include one kind or two or more kinds of polymerization inhibitor. In the case where the composition includes two or more kinds of the polymerization inhibitor, the total amount thereof is preferably within this range.

<<Surfactant>>

From the viewpoint of further improving coatability, various surfactants may be added to the colored composition of the present invention. As the surfactants, it is possible to use various surfactants such as a fluorine-based surfactant, a nonionic surfactant, a cationic surfactant, an anionic surfactant, and a silicone-based surfactant.

Particularly, if the colored composition of the present invention contains a fluorine-based surfactant, liquid characteristics (particularly, fluidity) are further improved when the composition is prepared as a coating liquid, whereby evenness of the coating thickness or liquid saving properties can be further improved.

That is, in the case where a coating liquid obtained by applying the colored composition containing a fluorine-based surfactant is used to form a film, the surface tension between a surface to be coated and the coating liquid is reduced to improve wettability with respect to the surface to be coated, and enhance coatability with respect to the surface to be coated. Therefore, even in the case where a thin film of about several μm is formed of a small amount of liquid, the colored composition containing a fluorine-based surfactant is effective in that a film with a uniform thickness which exhibits a small extent of thickness unevenness can be more suitably formed.

The fluorine content in the fluorine-based surfactant is preferably 3% by mass to 40% by mass, more preferably 5% by mass to 30% by mass, and particularly preferably 7% by mass to 25% by mass. The fluorine-based surfactant in which the fluorine content is within this range is effective in terms of the uniformity of the thickness of the coating film or liquid saving properties, and the solubility of the surfactant in the colored composition is also good.

Examples of the fluorine-based surfactant include Megaface F171, Megaface F172, Megaface F173, Megaface F176, Megaface F177, Megaface F141, Megaface F142, Megaface F143, Megaface F144, Megaface R30, Megaface F437, Megaface F475, Megaface F479, Megaface F482, Megaface F554, Megaface F780, and Megaface F781 (all manufactured by DIC Corporation), Fluorad FC430, FC431, and FC171 (all manufactured by Sumitomo 3M), and Surflon S-382, Surflon SC-101, Surflon SC-103, Surflon SC-104, Surflon SC-105, Surflon SC1068, Surflon SC-381, Surflon SC-383, Surflon SC-393, and Surflon KH-40 (all manufactured by ASAHI GLASS Co., Ltd.).

Specific examples of the nonionic surfactant include glycerol, trimethylolpropane, trimethylolethane, and ethoxylates and propoxylates thereof (for example, glycerol propoxylate and glycerin ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (Pluronic L10, L31, L61, L62, 10R5, 17R2, and 25R2, and Tetronic 304, 701, 704, 901, 904, and 150R1 manufactured by BASF), and Solseperse 20000 (manufactured by Lubrizol Japan Ltd.).

Specific examples of the cationic surfactant include phthalocyanine derivatives (product name: EFKA-745 manufactured by MORISHITA SANGYO Corporation), organosiloxane polymer KP341 (manufactured by Shin-Etsu Chemical Co., Ltd.), (meth)acrylic acid-based (co)polymer Polyflow No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.).

Examples of the silicone-based surfactant include "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH30PA", and "Toray Silicone SH8400", manufactured by Dow Corning Toray Co., Ltd., "TSF-4440", "TSF-4300", "TSF-4445", "TSF-4460", and "TSF-4452", manufactured by Momentive Performance Materials Inc., "KP341", "KF6001", and "KF6002", manufactured by Shin-Etsu Chemiclal Co., Ltd., and "BYK307", "BYK323", and "BYK330", manufactured by BYK-Chemie.

In the case where the colored composition of the present invention contains a surfactant, the amount of the surfactant added is preferably 0.001% by mass to 2.0% by mass and more preferably 0.005% by mass to 1.0% by mass, with respect to the total mass of the colored composition.

The composition of the present invention may include one kind or two or more kinds of surfactant. In the case where the composition includes two or more kinds of the surfactant, the total amount thereof is preferably within this range.

<<Organic Carboxylic Acid and Organic Carboxylic Anhydride>>

The colored composition of the present invention may contain an organic carboxylic acid having a molecular weight of 1000 or less, and/or an organic carboxylic anhydride.

Specific examples of the organic carboxylic acid compound include an aliphatic carboxylic acid and an aromatic carboxylic acid. Examples of the aliphatic carboxylic acid include monocarboxylic acids such as formic acid, acetic acid, propionic acid, butyric acid, valeric acid, pivalic acid, caproic acid, glycolic acid, acrylic acid, and methacrylic acid, dicarboxylic acids such as oxalic acid, malonic acid, succinic acid, glutaric acid, adipic acid, pimelic acid, cyclohexanedicarboxylic acid, cyclohexenedicarboxylic acid, itaconic acid, citraconic acid, maleic acid, and fumaric acid, tricarboxylic acids such as tricarballylic acid, and aconitic acid, and the like. Examples of the aromatic carboxylic acid include carboxylic acids in which a carboxyl group is directly bonded to a phenyl group such as a benzoic acid and a phthalic acid, and carboxylic acids in which a phenyl group is bonded to a carboxyl group via a carbon bond. Among these, carboxylic acids having a molecular weight of 600 or less, particularly those having a molecular weight of 50 to 500, and specifically, maleic acid, malonic acid, succinic acid, and itaconic acid are preferable.

Examples of the organic carboxylic anhydride include aliphatic carboxylic anhydrides and aromatic carboxylic anhydrides. Specific examples thereof include aliphatic carboxylic anhydrides such as acetic anhydride, trichloroacetic anhydride, trifluoroacetic anhydride, tetrahydrophthalic anhydride, succinic anhydride, maleic anhydride, citraconic anhydride, itaconic anhydride, glutaric anhydride, 1,2-cyclohexenedicarboxylic anhydride, n-octadecylsuccinic anhydride, and 5-norbornene-2,3-dicarboxylic anhydride. Examples of the aromatic carboxylic anhydride include phthalic anhydride, trimellitic anhydride, pyromellitic anhydride, and naphthalic anhydride. Among these, those having a molecular weight of 600 or less, particularly having a molecular weight of 50 to 500, specifically, for example, maleic anhydride, succinic anhydride, citraconic anhydride, and itaconic anhydride are preferable.

If the colored composition of the present invention contains an organic carboxylic acid or an organic carboxylic anhydride, the amount of the organic carboxylic acids and/or the organic carboxylic anhydrizdes added is generally in a range of 0.01% by weight to 10% by weight, preferably 0.03% by weight to 5% by weight, and more preferably 0.05% by weight to 3% by weight in the total solid contents.

The composition of the present invention may include one kind or two or more kinds of each of an organic carboxylic acid and/or an organic carboxylic anhydride. In the case where the composition includes two or more kinds of the organic carboxylic acid and/or the organic carboxylic anhydride, the total amount thereof is preferably within this range.

By adding these organic carboxylic acids and/or the organic carboxylic anhydrides having a molecular weight of 1000 or less, it is possible to further reduce the amount of the residual undissolved substance of the colored composition while maintaining high pattern adhesiveness.

If desired, various additives such as a filler, an adhesion promoting agent, an antioxidant, an ultraviolet absorber, and an anti-aggregation agent can be blended into the colored composition. Examples of these additives include those described in paragraphs "0155" and "0156" of JP2004-295116A, the contents of which are incorporated herein.

The colored composition of the present invention can contain the sensitizer or the light stabilizer described in paragraph "0078" of JP2004-295116A, and the thermal polymerization inhibitor described in paragraph "0081" of JP2004-295116A.

The composition of the present invention may include one kind or two or more kinds of each of these components. In the case where the composition includes two or more kinds of each of these components, the total amount thereof is preferably within this range.

<Method for Preparing Colored Composition>

The colored composition of the present invention is prepared by mixing the aforementioned components together.

Furthermore, when the colored composition is prepared, the respective components constituting the colored composition may be mixed together at the same time or mixed together sequentially after being dissolved and dispersed in a solvent. Further, the order of adding the components and the operation conditions during the mixing are not particularly restricted. For example, all the components may be dissolved and dispersed in a solvent at the same time to prepare the composition. Alternatively, if desired, the respective components may be appropriately prepared as two or more solutions and dispersions and mixed at the time of use (at the time of coating) to prepare the composition.

The colored composition prepared as above can be provided for use after being filtered using a filter having a pore diameter of preferably about 0.01 μm to 3.0 μm, and more preferably about 0.05 μm to 0.5 μm, or the like.

The colored composition of the present invention is preferably used for forming a colored layer of a color filter. More specifically, since the colored composition of the present invention can form a cured film having excellent heat resistance and color characteristics, it is suitably used for forming a colored pattern (colored layer) of a color filter. Further, the colored composition of the present invention can be suitably used for forming a colored pattern of a color filter or the like used in a solid-state image sensor (for example, a CCD and a CMOS) or an image display device such as a liquid crystal display (LCD). Further, the composition can also be suitably used in an application of the manufacture of a printing ink, an ink jet ink, a coating material, or the like. Among these, the composition can be suitably used in an application of the manufacture of a color filter for a solid-state image sensor such as a CCD and a CMOS.

<Cured Film, Pattern Forming Method, Color Filter, and Method for Producing Color Filter>

Next, the cured film, the pattern forming method, and the color filter in the present invention will be described in detail by an explanation of production methods thereof.

The cured film of the present invention is formed by curing the colored composition of the present invention. Such a cured film is preferably used in a color filter.

In the pattern forming method of the present invention, the colored composition of the present invention is applied onto a support to form a colored composition layer, and an undesired area is removed to form a colored pattern.

The pattern forming method of the present invention can be suitably applied for forming a colored pattern (pixel) included in a color filter.

With the composition of the present invention, a color filter may be produced by forming a pattern using a so-called photolithography method and a pattern may be formed by a dry etching method.

That is, as a first method for producing a color filter of the present invention, a method for producing a color filter, including a step of applying the colored composition onto a support to form a colored composition layer, a step of patternwise exposing the colored composition layer, and a step of removing an unexposed area by development to form a colored pattern, is exemplified.

Furthermore, as a second method for producing a color filter of the present invention, a method for producing a color filter, including a step of applying the colored composition onto a support to form a colored composition layer, followed by curing, to form a colored layer, a step of forming a photoresist layer on the colored layer, a step of patterning the photoresist layer by exposure and development to obtain a resist pattern, and a step of dry-etching the colored layer using the resist pattern as an etching mask, is exemplified.

In the present invention, production using a photolithography method is more preferable.

Details of these will be described below.

The respective steps in the pattern forming method of the present invention will be described in detail below with reference to the method for producing a color filter for a solid-state image sensor, but the present invention is not limited to this method. Hereinafter, the color filter for a solid-state image sensor may be simply referred to as a "color filter" in some cases.

<<Step of Forming Colored Composition Layer>>

In the step of forming a colored composition layer, the colored composition of the present invention is provided on a support to form a colored composition layer.

As the support which can be used in the present step, for example, it is possible to use a substrate for a solid-state image sensor, which is formed by providing an image sensor (light-receiving element) such as a charge coupled device (CCD) or a complementary metal-oxide semiconductor (CMOS) on a substrate (for example, a silicon substrate).

The colored pattern of the present invention may be formed on the surface (front surface) on which an image sensor is formed or on the surface (back surface) where an image sensor is not formed, of a substrate for a solid-state image sensor.

A light shielding film may be disposed between the colored pattern in a solid-state image sensor or on the back surface of the substrate for a solid-state image sensor.

In addition, if desired, an undercoat layer may be disposed on the support in order to improve adhesiveness between the support and the upper layer, prevent diffusion of substances, or planarize the substrate surface. A solvent, an alkali-soluble resin, a polymerizable compound, a polymerization inhibitor, a surfactant, a photopolymerization initiator, or the like can be blended into the undercoat layer, and it is preferable that these respective components are properly selected from the components blended into the aforementioned composition of the present invention.

As the method for applying the colored composition of the present invention onto the support, various coating methods such as slit coating, ink jet coating, spin coating, cast coating, roll coating, and screen printing can be applied.

Drying (pre-baking) of the colored composition layer applied onto the support can be carried out using a hot plate, an oven, or the like at a temperature of 50° C. to 140° C. for 10 seconds to 300 seconds.

<Step of Forming Pattern by Photolithography Method>
<<Exposing Step>>

In the exposing step, the colored composition layer formed in the colored composition layer forming step is patternwise exposed through a mask having a predetermined mask pattern by using, for example, an exposure device such as a stepper. Thus, a cured film is obtained.

As radiation (light) usable in exposure, particularly, ultraviolet rays such as a g-ray and an i-ray are preferably used (particularly, an i-ray is preferably used). The irradiation dose (exposure dose) is preferably from 30 mJ/cm$^2$ to 1500 mJ/cm$^2$, more preferably from 50 mJ/cm$^2$ to 1000 mJ/cm$^2$, and particularly preferably from 80 mJ/cm$^2$ to 500 mJ/cm$^2$.

The film thickness of the cured film (colored film) is preferably from 1.0 μm or less, more preferably from 0.1 μm to 0.9 μm, and still more preferably from 0.2 μm to 0.8 μm.

It is preferable to set the film thickness to be 1.0 μm or less since a high degree of resolution and adhesiveness are obtained.

Moreover, in this step, a cured film having a small film thickness of 0.7 μm or less can be suitably formed. Further, if the obtained cured film is subjected to a development process in a pattern forming step which will be described later, it is possible to obtain a thin film having a colored pattern which exhibits excellent developability and reduced surface roughness and has an excellent pattern shape.

<<Developing Step>>

Thereafter, by performing an alkaline developing treatment, the colored composition layer in an area not irradiated with light in the exposing step is eluted into an aqueous alkaline solution, and as a result, only a photocured area remains.

As a developing liquid, an organic alkaline developing liquid not damaging an image sensor, a circuit, or the like in an underlayer is preferable. The development temperature is usually from 20° C. to 30° C., and the development time is from 20 seconds to 90 seconds in the related art. In order to further remove residues, development has recently been carried out for 120 seconds to 180 seconds in some cases. Further, in order to improve residue removal properties, a step of sufficiently shaking the developing liquid every 60 seconds and newly supplying a developing liquid is repeated plural times in some cases.

Examples of an alkaline agent used for the developing liquid include organic alkaline compounds such as aqueous ammonia, ethylamine, diethylamine, dimethyl ethanolamine, tetramethylammonium hydroxide, tetraethylammonium hydroxide, choline, pyrrole, piperidine, and 1,8-diazabicyclo-[5.4.0]-7-undecene. An aqueous alkaline solution obtained by diluting these alkaline agents with pure water so as to yield a concentration of the alkaline agent of 0.001% by mass to 10% by mass, and preferably 0.01% by mass to 1% by mass is preferably used as the developing liquid.

Incidentally, inorganic alkali may be used for the developing liquid, and as the inorganic alkali, for example, sodium hydroxide, potassium hydroxide, sodium carbonate, sodium hydrogen carbonate, sodium silicate, sodium metasilicate, and the like are preferable.

Furthermore, in the case where a developing liquid formed of such an aqueous alkaline solution is used, the pattern is generally cleaned (rinsed) with pure water after development.

Next, it is preferable to carry out a heating treatment (post-baking) after drying. If a multi-colored pattern is formed, the above steps can be sequentially repeated for each color to produce a cured coat. Thus, a color filter is obtained.

The post-baking is a heating treatment performed after development so as to complete curing, and in the post-baking, a thermal curing treatment is carried out usually at 100° C. to 240° C., and preferably at 200° C. to 240° C.

The post-baking treatment can be carried out on the coating film obtained after development in a continuous or batch manner, by using heating means such as a hot plate, a convection oven (a hot-air circulation type dryer), and a high-frequency heater under the conditions described above.

<<Case of Forming Pattern by Dry Etching Method>>

With the colored layer, the dry etching can be carried out with an etching gas, using a patterned photoresist layer as a mask. Specifically, a positive-type or negative-type radiation-sensitive composition is applied onto the colored layer and dried to form a photoresist layer. In the formation of the photoresist layer, it is preferable to further carry out a pre-baking treatment. In particular, as a process for forming a photoresist, a configuration in which a post-exposure heating treatment (PEB) or a post-development heating treatment (post-baking treatment) is carried out is preferable.

As the photoresist, for example, a positive-type radiation-sensitive composition is used. As the positive-type radiation-sensitive composition, a positive-type resist composition suitable for a positive-type photoresist, which responds to radiation, for example, an ultraviolet ray (a g-ray, an h-ray, or an i-ray), a far ultraviolet ray including an excimer laser and the like, an electron beam, an ion beam, or an X-ray, can be used. Among the radiations, a g-ray, an h-ray, or an i-ray is preferable, among which the i-ray is more preferable.

Specifically, as the positive-type radiation-sensitive composition, a composition containing a quinonediazide compound and an alkali-soluble resin is preferable. The positive-type radiation-sensitive composition containing a quinonediazide compound and an alkali-soluble resin utilizes a quinonediazide group being decomposed to generate a carboxyl group due to light irradiation at a wavelength of 500 nm or less, and as a result, the quinonediazide compound is shifted from an alkali-insoluble state to an alkali-soluble state. Since this positive-type photoresist is remarkably excellent in resolving power, it is used for the manufacture of an integrated circuit, for example, an IC and LSI. Examples of the quinonediazide compound include a naphthoquinonediazide compound. Examples of commercially available products thereof include "FHi622BC" (manufactured by FUJIFILM Electronics Materials Co., Ltd.).

The thickness of the photoresist layer is preferably from 0.1 μm to 3 μm, more preferably from 0.2 μm to 2.5 μm, and still more preferably from 0.3 μm to 2 μm. Incidentally, coating of the photoresist layer can be suitably carried out using the coating method described with respect to the above-described colored layer.

Next, a resist pattern (patterned photoresist layer) in which a resist through-hole group is disposed is formed by exposing and developing the photoresist layer. The formation of the resist pattern can be carried out by appropriately optimizing heretofore known techniques of photolithography without particular limitation. By providing the resist through-hole group in the photoresist layer by exposure and development, the resist pattern which is used as an etching mask in the subsequent etching is provided on the colored layer.

Exposure of the photoresist layer can be carried out by exposing a positive-type or negative-type radiation-sensitive composition to a g-ray, an h-ray, or an i-ray, and preferably to an i-ray through a predetermined mask pattern. After the exposure, a development treatment is carried out using a developing liquid to remove the photoresist corresponding to the region where a colored pattern is to be formed.

As the developing liquid, any developing liquid which does not affect a colored layer containing a dye and dissolves the exposed area of a positive resist or the uncured area of a negative resist may be used, and for example, a combination of various organic solvents or an aqueous alkaline solution is used. As the aqueous alkaline solution, an aqueous alkaline solution prepared by dissolving an alkaline compound to yield a concentration of 0.001% by mass to 10% by mass, and preferably 0.01% by mass to 5% by mass is suitable. Examples of the alkaline compound include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, and 1,8-diazabicyclo-[5,4.0]-7-undecene. Incidentally, in the case where an aqueous alkaline solution is used as the developing liquid, a cleaning treatment with water is generally carried out after development.

Next, the colored layer is patterned by dry etching so as to form a through-hole group in the colored layer using the resist pattern as an etching mask. Thus, a colored pattern is formed. The through-hole group is provided checkerwise in the colored layer. Thus, a first colored pattern having the through-hole group provided in the colored layer has a plurality of first quadrangular colored pixels checkerwise.

Specifically, the dry etching is carried out by dry etching the colored layer using the resist pattern as an etching mask. Representative examples of the dry etching include the methods described in JP1984-126506A (JP-S59-126506A) JP1984-46628A (JP-S59-46628A), JP1983-9108A (JP-S58-9108A), JP1983-2809A (JP-S58-2809A), JP1982-148706A (JP-S57-148706A), JP1986-41102A (JP-S61-41102A), or the like.

It is preferable that the dry etching is carried out in a configuration as described below from the viewpoint of forming a pattern cross-section closer to that of a rectangle or of further reducing damage to a support.

A configuration is preferable, which includes a first-stage etching of etching up to an area (depth) where the support is not revealed by using a mixed gas of a fluorine-based gas and an oxygen gas ($O_2$), a second-stage etching of preferably etching up to the vicinity of an area (depth) where the support is revealed by using a mixed gas of a nitrogen gas ($N_2$) and an oxygen gas ($O_2$) after the first-stage etching, and an over-etching carried out after the support has been revealed. A specific manner of the dry etching as well as the first-stage etching, the second-stage etching, and the over-etching will be described below.

The dry etching is carried out by determining the etching conditions in advance in the following manner.

(1) An etching rate (nm/min) in the first-stage etching and an etching rate (nm/min) in the second-stage etching are calculated, respectively. (2) A time for etching a predetermined thickness in the first-stage etching and a time for etching a predetermined thickness in the second-stage etching are calculated, respectively. (3) The first-stage etching is carried out according to the etching time calculated in (2) above. (4) The second-stage etching is carried out according to the etching time calculated in (2) above. Alternatively, an etching time is determined by endpoint detection, and the second-stage etching may be carried out according to the etching time determined. (5) The over-etching time is calculated in response to the total time of (3) and (4) above, and the over-etching is carried out.

The mixed gas used in the first-stage etching step preferably contains a fluorine-based gas and oxygen gas ($O_2$) from the viewpoint of processing an organic material of the film to be etched into a rectangle shape. The first-stage etching step may avoid damaging the support by adopting the configuration of etching up to an area where the support is not revealed. After the etching is carried out up to an area where the support is not revealed by the mixed gas of a fluorine-based gas and oxygen gas in the first-stage etching step, etching treatment in the second-stage etching step and etching treatment in the over-etching step are preferably carried out by using the mixed gas of nitrogen gas and oxygen gas from the viewpoint of avoiding damage to the support.

It is important that a ratio between the etching amount in the first-stage etching step and the etching amount in the second-stage etching step is determined so as not to deteriorate the linearity by the etching treatment in the first-stage etching step. Further, the proportion of the etching amount in the second-stage etching step with respect to the total etching amount (the sum of the etching amount in the first-stage etching step and the etching amount in the second-stage etching step) is preferably in a range of more than 0% and 50% or less, and more preferably from 10% to 20%. The etching amount means an amount determined by a difference between the remaining film thickness of the etched film and the film thickness of the film before the etching.

Furthermore, the etching preferably includes an over-etching treatment. The over-etching treatment is preferably carried out by determining an over-etching rate. The over-etching rate is preferably calculated from an etching treatment time which is carried out at first. Although the over-etching rate may be arbitrarily determined, it is preferably 30% or less, more preferably from 5% to 25%, and particularly preferably from 10% to 15%, of the etching processing time in the etching steps, from the viewpoint of etching resistance of the photoresist and preservation of the linearity of the etched pattern.

Next, the resist pattern (that is, the etching mask) remaining after the etching is removed. The removal of the resist pattern preferably includes a step of supplying a peeling solution or a solvent onto the resist pattern to bring the resist pattern into a removable state, and a step of removing the resist pattern using cleaning water.

The step of supplying a peeling solution or a solvent onto the resist pattern to bring the resist pattern into a removable state includes, for example, a step of paddle development by supplying a peeling solution or a solvent at least onto the resist pattern and leaving it for a predetermined time. The time for which the peeling solution or a solvent is left is not particularly limited, and is preferably from several tens of seconds to several minutes.

Moreover, the step of removing the resist pattern using cleaning water includes, for example, a step of removing the resist pattern by spraying cleaning water from a spray-type or shower-type spray nozzles onto the resist pattern. As the cleaning water, pure water is preferably used. The spray nozzles include spray nozzles having a spray area which covers the entire support and mobile spray nozzles having a mobile area which covers the entire support. In the case where the spray nozzles are mobile spray nozzles, the resist pattern can be more effectively removed by moving the mobile spray nozzles twice or more from the center of the support to the edge of the support to spray cleaning water in the step of removing the resist pattern.

The peeling solution generally contains an organic solvent and may further contain an inorganic solvent. Examples of the organic solvent include 1) a hydrocarbon-based compound, 2) a halogenated hydrocarbon-based compound, 3) an alcohol-based compound, 4) an ether- or acetal-based compound, 5) a ketone- or aldehyde-based compound, 6) an ester-based compound, 7) a polyhydric alcohol-based compound, 8) a carboxylic acid- or its acid anhydride-based compound, 9) a phenol-based compound, 10) a nitrogen-containing compound, 11) a sulfur-containing compound, and 12) a fluorine-containing compound. The peeling solution preferably contains a nitrogen-containing compound, and more preferably contains an acyclic nitrogen-containing compound and a cyclic nitrogen-containing compound.

The acyclic nitrogen-containing compound is preferably an acyclic nitrogen-containing compound having a hydroxyl group. Specific examples thereof include monoisopropanolamine, diisopropanolamine, triisopropanolamine, N-ethylethanolamine, N,N-dibutylethanolamine, N-butylethanolamine, monoethanolamine, diethanolamine, and triethanolamine, among which monoethanolamine, diethanolamine, and triethanolamine are preferable, and monoethanolamine ($H_2NCH_2CH_2OH$) is more preferable. Further, examples of the cyclic nitrogen-containing compound include isoquinoline, imidazole, N-ethylmorpholine, s-caprolactam, quinoline, 1,3-dimethyl-2-imidazolidinone, α-picoline, β-picoline, γ-picoline, 2-pipecoline, 3-pipecoline, 4-pipecoline, piperazine, piperidine, pyrazine, pyridine, pyrrolidine, N-methyl-2-pyrrolidone, N-phenyl morpholine, 2,4-lutidine, and 2,6-lutidine, among which N-methyl-2-pyrrolidone and N-ethyl morpholine are preferable, and N-methyl-2-pyrrolidone (NMP) is more preferable.

The peeling solution preferably includes both the acyclic nitrogen-containing compound and the cyclic nitrogen-containing compound, more preferably contains at least one selected from monoethanolamine, diethanolamine, and triethanolamine as the acyclic nitrogen-containing compound and at least one selected from N-methyl-2-pyrrolidone and N-ethyl morpholine as the cyclic nitrogen-containing compound, and still more preferably contains monoethanolamine and N-methyl-2-pyrrolidone.

In the removal with the peeling solution, it is sufficient that the resist pattern formed on the first colored pattern 12 is removed, and in a case where a deposit of an etching product is attached to the side wall of the first colored pattern 12, it is not always necessary to completely remove the deposit. The deposit means an etching product attached and deposited to the side wall of a colored layer.

For the peeling solution, it is preferable that the content of the acyclic nitrogen-containing compound is from 9 parts by mass to 11 parts by mass based on 100 parts by mass of the peeling solution, and the content of the cyclic nitrogen-containing compound is from 65 parts by mass to 70 parts by mass based on 100 parts by mass of the peeling solution. Further, the peeling solution is preferably one prepared by diluting a mixture of the acyclic nitrogen-containing compound and the cyclic nitrogen-containing compound with pure water.

Furthermore, the production method of the present invention may have a step known as a method for producing a color filter for a solid-state image sensor, if desired, as a step other than the above steps. For example, the method may include a curing step of curing the formed colored pattern by heating and/or exposure, if desired, after the colored composition layer forming step, the exposing step, and the pattern forming step are carried out.

Moreover, in the case of using the colored composition according to the present invention, a nozzle of an ejection portion or a piping portion of a coating device may become clogged, or the colored composition or a pigment may adhere to or be precipitated or dried inside the coating machine in some cases. Thus, in order to efficiently clean off the contamination caused by the colored composition according to the present invention, it is preferable to use the solvent relating to the present formulation described above as a cleaning liquid. In addition, the cleaning liquids described in JP1995-128867A (JP-H07-128867A), JP1995-146562A (JP-H07-146562A), JP1996-278637A (JP-H08-278637A), JP2000-273370A, JP2006-85140A, JP2006-291191A, JP2007-2101A, JP2007-2102A, JP2007-281523A, and the like can also be suitably used to clean and remove the colored composition according to the present invention.

Among the above, alkylene glycol monoalkyl ether carboxylates and alkylene glycol monoalkyl ethers are preferable.

These solvents may be used alone or as a mixture of two or more kinds thereof. In the case where two or more kinds thereof are mixed, it is preferable to mix a solvent having a hydroxyl group with a solvent not having a hydroxyl group. The mass ratio between the solvent having a hydroxyl group and the solvent not having a hydroxyl group is from 1/99 to 99/1, preferably from 10/90 to 90/10, and still more preferably from 20/80 to 80/20. A mixed solvent in which propylene glycol monomethyl ether acetate (PGMEA) is mixed with propylene glycol monomethyl ether (PGME) at a ratio of 60/40 is particularly preferable. Further, in order to improve the permeability of the cleaning liquid with respect to contaminants, it is preferable to add the aforementioned surfactants relating to the present formulation to the cleaning liquid.

Since the color filter of the present invention uses the colored composition of the present invention, exposure having an excellent exposure margin can be carried out, and the formed colored pattern (colored pixels) has an excellent pattern shape. Further, since the surface roughness of the pattern and the amount of residues in a developed area are inhibited, excellent color characteristics are exhibited.

The color filter of the present invention can be suitably used for a solid-state image sensor such as a CCD and a CMOS, and is particularly preferable for a CCD, a CMOS, and the like with a high resolution, having more than 1,000,000 pixels. The color filter for a solid-state image sensor of the present invention can be used as, for example, a color filter disposed between a light-receiving portion of each pixel constituting a CCD or a CMOS and a microlens for condensing light.

Furthermore, the film thickness of the colored pattern (colored pixel) in the color filter of the present invention is preferably 2.0 µm or less, more preferably 1.0 µm or less, and still more preferably 0.7 µm or less Moreover, the size (pattern width) of the colored pattern (colored pixel) is preferably 2.5 µm or less, more preferably 2.0 µm or less, and particularly preferably 1.7 µm or less.

<Solid-State Image Sensor>

The solid-state image sensor of the present invention includes the color filter of the present invention as described above. The constitution of the solid-state image sensor of the present invention is not particularly limited as long as the solid-state image sensor is constituted to include the color filter in the present invention and functions as a solid-state image sensor. However, for example, the solid-state image sensor can be constituted as below.

It is configured such that transfer electrodes consisting of a plurality of photodiodes and transfer electrodes formed of polysilicon or the like constituting a light-receiving area of a solid-state image sensor (a CCD image sensor, a CMOS image sensor, or the like) are arranged on a support; a light shielding film which is open only to the light-receiving portion of the photodiode and is formed of tungsten or the like is disposed on the photodiodes and the transfer electrodes; a device protecting film which is formed for covering the entire surface of the light shielding film and the light receiving portion of the photodiodes and is formed of silicon nitride or the like is disposed on the light shielding film; and the color filter for a solid-state image sensor of the present invention is disposed on the device protecting film.

In addition, the solid-state image sensor may have a constitution in which light-condensing means (for example, a microlens or the like, which shall apply hereinafter) is disposed on a portion positioned on the device protecting layer and under the color filter (side close to the support), a constitution in which light-condensing means is disposed on the color filter, and the like.

<Image Display Device>

The color filter of the present invention can be used not only for a solid-state image sensor, but also for an image display device such as a liquid crystal display device and an organic EL display device. In particular, the color filter is suitable for the applications of a liquid crystal display device. The liquid crystal display device including the color filter of the present invention can display a high-quality image showing a good tone and having excellent display characteristics.

The definition of display devices or details of the respective display devices are described in, for example, "Electronic Display Devices (Akio Sasaki, Kogyo Chosakai Publishing Co., Ltd., published in 1990)", "Display Devices (Toshiyuki Ibuki, Sangyo Publishing Co., Ltd., published in 1989), and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

The color filter of the present invention may be used for a liquid crystal display device using a color TFT system. Liquid crystal display devices using a color TFT system are described in, for example, "Color TFT Liquid Crystal Displays (KYORITSU SHUPPAN Co., Ltd., published in 1996)". Further, the present invention can be applied to a liquid crystal display device having an enlarged view angle, which uses an in-plane switching (IPS) driving system such as IPS and a pixel division system such as MVA, or to STN, TN, VA, OCS, FFS, R-OCB, and the like.

In addition, the color filter in the present invention can be provided to a Color-filter On Array (COA) system which is a bright and high-definition system. In the liquid crystal display device of the COA system, the characteristics required for a color filter layer need to include characteristics required for an interlayer insulating film, that is, a low dielectric constant and resistance to a peeling solution in some cases, in addition to the generally required characteristics as described above. In the color filter of the present invention, a dye having an excellent hue is used. Accordingly, the color purity, light-transmitting properties, and the like are excellent, and the tone of the colored pattern (pixels) is excellent. Consequently, a liquid crystal display device of a COA system which has a high resolution and is excellent in long-term durability can be provided. Further, in order to satisfy the characteristics required for a low dielectric constant, a resin coat may be provided on the color filter layer.

These image display systems are described in, for example, p. 43 of "EL, PDP, and LCD Display Technologies and Recent Trends in the Market (TORAY RESEARCH CENTER, Research Department, published in 2001)", and the like.

The liquid crystal display device including the color filter in the present invention is constituted with various members such as an electrode substrate, a polarizing film, a phase difference film, a backlight, a spacer, and a view angle compensation film, in addition to the color filter of the present invention. The color filter of the present invention can be applied to a liquid crystal display device constituted with these known members. These members are described in, for example, "'94 Market of Peripheral Materials And Chemicals of Liquid Crystal Displays (Kentaro Shima, CMC Publishing Co., Ltd., published in 1994)" and "2003 Current Situation of the Market Relating to Liquid Crystal and Prospects (Vol. 2) (Yoshikichi Hyo, Fuji Chimera Research Institute, Inc., published in 2003)".

The backlight is described in SID Meeting Digest 1380 (2005) (A. Konno, et al.), December Issue of Monthly "Display", 2005, pp. 18-24 (Yasuhiro Shima) and pp. 25-30 (Takaaki Hagi) of this document, and the like.

If the color filter in the present invention is used in a liquid crystal display device, high contrast can be realized when the color filter is combined with a three-wavelength tube of a cold cathode tube known in the related art. Further, if a light source of LED in red, green, and blue (RGB-LED) is used as a backlight, a liquid crystal display device having high luminance, high color purity, and good color reproducibility can be provided.

EXAMPLES

Hereinafter, the present invention will be described in more detail with reference to Examples, but the present invention is not limited to the Examples below as long as the object of the present invention is not impaired. Incidentally, "%" and "part(s)" are based on mass unless otherwise specified.

Synthesis Example 1

Synthesis of Dye Multimer (A) (S-1)

Synthesis of Monomer 1

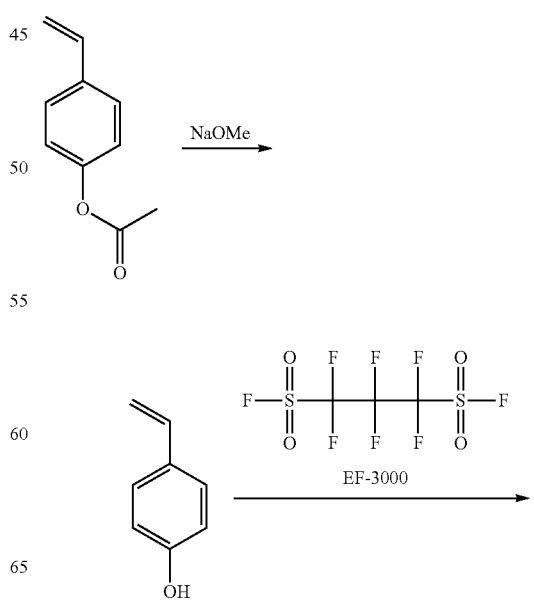

-continued

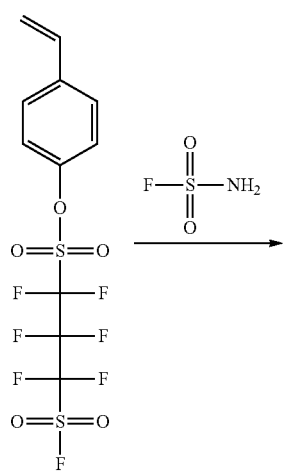

100 parts of 4-acetoxystyrene was dissolved in 300 parts of ethyl acetate, 50 parts of 28% solution of sodium methoxide in methanol was added dropwise to the solution, and the mixture was stirred at room temperature for 3 hours. Thereafter, the reaction solution was liquid-separated and washed three times with 200 parts of a 1 N aqueous hydrochloric acid solution, further liquid-separated and washed with 200 parts of saturated saline, then dried over magnesium sulfate, and filtered to obtain a filtrate. To this filtrate was added 207 parts of EF-3000 (manufactured by Mitsubishi Materials Corporation) and 99.5 parts of triethylamine, and the mixture was stirred for 1 hour while maintaining the temperature at 5° C. or lower. Thereafter, 102 parts of trifluoromethanesulfonamide and 331 parts of triethylamine were added thereto, and the mixture was stirred for 2 hours. The reaction solution was liquid-separated and washed three times with 300 parts of a 1 N aqueous hydrochloric acid solution, liquid-separated and washed three times with 300 parts of saturated saline, dried over sodium sulfate, and filtered, and the filtrate was concentrated under reduced pressure. The residue was purified by column chromatography, then liquid-separated with 200 parts of a 10% aqueous sodium hydroxide solution, further liquid-separated and washed with 300 parts of saturated saline, and dried over sodium sulfate, and then the filtrate was concentrated to obtain 60 parts (yield: 17.1%) of a X-57 precursor.

Thereafter, 60 parts of the X-57 precursor and 55.3 parts of Rhodamine B (manufactured by Tokyo Chemical Industry Co., Ltd.) were salt-exchanged in 300 parts of ethyl acetate and 300 parts of water, and the ethyl acetate layer was separated, dried over sodium sulfate, and concentrated under reduced pressure to obtain 110 parts (yield: 95%) of a monomer 1.

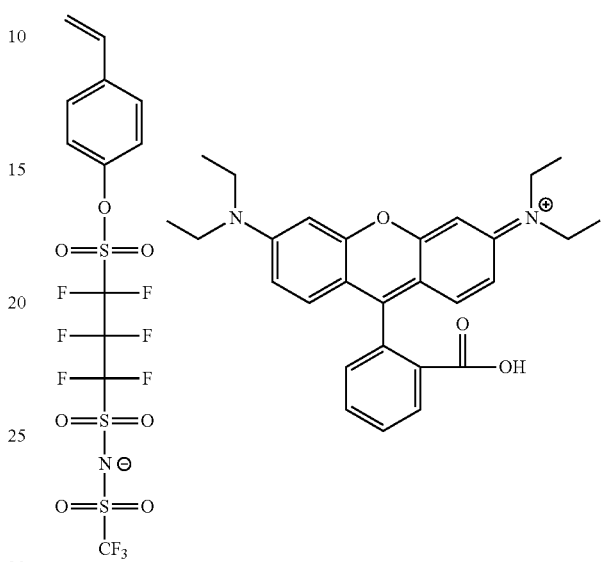

7.5 parts of the monomer 1, 0.23 parts of methacrylic acid, and 0.09 parts of dodecanethiol were dissolved in 3 parts of PGMEA. Half of the solution was put into a three-neck flask and stirred at 80° C., and 0.21 parts of a photopolymerization initiator V-601 (manufactured by Wako Pure Chemical Industries, Ltd.) was added dropwise over 1 hour to the other half of the solution in a three-neck flask. Thereafter, the mixture was stirred at 80° C. for 3 hours, and returned to room temperature, and then the reaction solution was added dropwise to 100 parts of hexane and crystallized, filtered and separated, and air-dried for 8 hours to obtain 6.5 parts (Mw 8200) of a polymer.

Synthesis Example 2 to 40

In the same manner as in Synthesis Example 1 except that the weakly nucleophilic anionic structures and the dyes shown in the following table were used in Synthesis Example 1, compounds (S-2) to (S-40) were synthesized.

TABLE 1

| Compound | Repeating unit 1 Anion part | Repeating unit 1 Cation part | % by mole | Repeating unit 2 | % by mole | Repeating unit 3 | % by mole | Repeating unit 4 | % by mole | Mw |
|---|---|---|---|---|---|---|---|---|---|---|
| S-1 | X-57 | A-xt-1 | 60 | B-1 | 40 | | | | | 8200 |
| S-2 | X-58 | A-xt-2 | 40 | B-1 | 30 | B-9 | 15 | B-18 | 15 | 15700 |
| S-3 | X-59 | A-xt-3 | 70 | B-1 | 20 | B-5 | 10 | | | 11500 |
| S-4 | X-60 | A-xt-4 | 40 | B-1 | 20 | B-7 | 20 | B-15 | 20 | 7100 |
| S-5 | X-61 | A-xt-5 | 70 | B-1 | 20 | B-3 | 10 | | | 15500 |
| S-6 | X-62 | A-xt-6 | 50 | B-1 | 30 | B-6 | 20 | | | 25200 |
| S-7 | X-63 | A-xt-7 | 50 | B-1 | 30 | B-11 | 20 | | | 9600 |
| S-8 | X-64 | A-xt-8 | 50 | B-1 | 30 | B-22 | 10 | B-18 | 10 | 6300 |
| S-9 | X-57 | A-xt-15 | 50 | B-7 | 30 | B-9 | 15 | B-19 | 5 | 15500 |
| S-10 | X-66 | A-xt-10 | 50 | B-1 | 30 | B-23 | 20 | | | 9200 |
| S-11 | X-67 | A-xt-11 | 30 | B-1 | 30 | B-4 | 30 | B-19 | 10 | 17300 |
| S-12 | X-68 | A-xt-12 | 50 | B-1 | 30 | B-10 | 20 | | | 7400 |
| S-13 | X-69 | A-xt-13 | 50 | B-1 | 30 | B-13 | 20 | | | 8600 |

TABLE 1-continued

| Compound | Repeating unit 1 Anion part | Repeating unit 1 Cation part | % by mole | Repeating unit 2 | % by mole | Repeating unit 3 | % by mole | Repeating unit 4 | % by mole | Mw |
|---|---|---|---|---|---|---|---|---|---|---|
| S-14 | X-70 | A-xt-14 | 50 | B-7 | 30 | B-9 | 20 | | | 7100 |
| S-15 | X-14 | A-xt-9 | 50 | B-1 | 30 | B-16 | 20 | | | 9900 |
| S-16 | X-32 | A-xt-16 | 50 | B-1 | 30 | B-14 | 20 | | | 5500 |
| S-17 | X-21 | PM-2 | 50 | B-1 | 40 | B-17 | 10 | | | 10100 |
| S-18 | X-61 | PM-3 | 50 | B-1 | 50 | | | | | 5900 |
| S-19 | X-30 | PM-4 | 40 | B-1 | 40 | B-7 | 20 | | | 8100 |
| S-20 | X-69 | PM-8 | 60 | B-7 | 30 | B-18 | 10 | | | 7000 |
| S-21 | X-63 | PM-9 | 70 | B-1 | 20 | B-11 | 10 | | | 6600 |
| S-22 | X-57 | PM-1 | 70 | B-1 | 20 | B-10 | 10 | | | 13700 |
| S-23 | X-65 | PM-7 | 70 | B-1 | 20 | B-15 | 10 | | | 6800 |
| S-24 | X-28 | tp-1 | 50 | B-1 | 50 | | | | | 7500 |
| S-25 | X-31 | tp-3 | 50 | B-1 | 40 | B-7 | 10 | | | 9400 |
| S-26 | X-59 | tp-5 | 60 | B-1 | 20 | B-23 | 15 | B-19 | 5 | 11500 |
| S-27 | X-45 | tp-8 | 70 | B-1 | 20 | B-20 | 10 | | | 10600 |
| S-28 | X-69 | tp-15 | 80 | B-7 | 20 | | | | | 5100 |
| S-29 | X-62 | tp-17 | 40 | B-1 | 30 | B-16 | 30 | | | 6700 |
| S-30 | X-64 | pm-1 | 80 | B-1 | 20 | | | | | 12000 |
| S-31 | X-57 | pm-4 | 50 | B-1 | 40 | | | B-18 | 10 | 8800 |
| S-32 | X-30 | pm-5 | 40 | B-7 | 60 | | | | | 7400 |
| S-33 | X-32 | pm-6 | 50 | B-1 | 30 | B-16 | 10 | B-19 | 10 | 7900 |
| S-34 | X-69 | pm-9 | 50 | B-1 | 40 | B-5 | 10 | | | 8200 |
| S-35 | X-63 | pm-10 | 40 | B-1 | 30 | | | B-18 | 30 | 8500 |
| S-36 | X-14 | pm-11 | 50 | B-1 | 30 | B-15 | 20 | | | 9800 |
| S-37 | X-61 | pm-15 | 50 | B-1 | 40 | B-12 | 10 | | | 5800 |
| S-38 | X-27 | pm-16 | 50 | B-2 | 50 | | | | | 6600 |
| S-39 | X-71 | sm-1 | 50 | B-1 | 30 | | | B-18 | 20 | 11400 |
| S-40 | X-57 | sm-2 | 50 | B-1 | 30 | | | B-18 | 20 | 21000 |

Examples 1 to 40 and Comparative Examples 1 to 4

1. Preparation of Resist Solution

Components with the following composition were mixed and dissolved to prepare a resist solution for an undercoat layer.

<Composition of Resist Solution for Undercoat Layer>

| | |
|---|---|
| Solvent: propylene glycol monomethyl ether acetate | 19.20 parts |
| Solvent: ethyl lactate | 36.67 parts |
| Alkali-soluble resin: 40% PGMEA solution of benzyl methacrylate/methacrylic acid/2-hydroxyethyl methacrylate copolymer (molar ratio = 60/22/18, weight-average molecular weight of 15,000, number-average molecular weight of 9,000) | 30.51 parts |
| Ethylenically unsaturated double bond-containing compound: dipentaerythritol hexaacrylate | 12.20 parts |
| Polymerization inhibitor: p-methoxyphenol | 0.0061 parts |
| Fluorine-based surfactant: F-475, manufactured by DIC Corporation | 0.83 parts |
| Photopolymerization initiator: trihalomethyl triazine-based photopolymerization initiator (TAZ-107 manufactured by Midori Kagaku Co., Ltd.) | 0.586 parts |

2. Manufacture of Undercoat Layer-Attached Silicon Wafer Substrate

A 6-inch silicon wafer was heated in an oven at 200° C. for 30 minutes. Next, the resist solution was applied onto this silicon wafer such that the dry film thickness became 1.5 μm. Further, the resultant was further heated and dried in an oven at 220° C. for 1 hour to form an undercoat layer, thereby obtaining an undercoat layer-attached silicon wafer substrate.

3. Preparation of Colored Composition

3-1. Preparation of Blue Pigment Dispersion

A blue pigment dispersion 1 was prepared in the following manner.

A mixed solution consisting of 13.0 parts of C. I. Pigment Blue 15:6 (blue pigment, average particle diameter of 55 nm), 5.0 parts of Disperbyk111 as a pigment dispersant, and 82.0 parts of PGMEA was mixed and dispersed for 3 hours by a beads mill (zirconia beads having a diameter of 0.3 mm) to prepare a pigment dispersion. Thereafter, the pigment dispersion was further subjected to a dispersion treatment under a pressure of 2000 kg/cm$^3$ and at a flow rate of 500 g/min, by using a high-pressure dispersing machine equipped with a depressurizing mechanism, NANO-3000-10 (manufactured by Nihon B.E.E Co., Ltd.). This dispersion treatment was repeated 10 times to obtain a blue pigment dispersion 1 (a dispersion of C. I. Pigment Blue 15:6, pigment concentration of 13%) used in the colored compositions of Examples or Comparative Examples.

For the obtained blue pigment dispersion, the particle diameter of the pigment was measured using a dynamic light scattering method (Microtrac Nanotrac UPA-EX150 (manufactured by Nikkiso Co., Ltd.), and as a result, was found to be 24 nm.

In the same manner as in the preparation of the blue pigment dispersion 1 except that a combination of the pigments shown in the following table and the resin dispersant Disperbyk111 was used instead of a combination of C. I. Pigment Blue 15:6 used as the blue pigment in the blue pigment dispersion 1 with a resin dispersant Disperbyk111 in "3.1 Preparation of Blue Pigment Dispersion", a red pigment dispersion, a green pigment dispersion, and a yellow pigment dispersion were prepared.

C. I. Pigment Red 254 (PR254)
C. I. Pigment Yellow (PY139)

3-2. Preparation of Colored Composition (1) Colored Compositions of Examples 1 to 40, and Comparative Examples 1 to 4

The following respective components were mixed, dispersed, and dissolved to obtain the respective colored compositions of Examples 1 to 40 and Comparative Examples 1 to 4.

| | |
|---|---|
| Cyclohexanone | 1.133 parts |
| Alkali-soluble resin (J1 or J2 shown below: the compound shown in the following table) | 0.030 parts |
| Solsperse 20000 (1% cyclohexane solution, manufactured by Lubrizol Japan Ltd.) | 0.125 parts |
| Photopolymerization initiator (the compound of the following structure: the compound described in the following table) | 0.012 parts |
| Dye multimer (A) (the compound described in the following table, provided that in Comparative Examples 1 to 4, a predetermined dye was used) | 0.040 parts in terms of a solid content |
| Pigment dispersion described in the following table (pigment concentration of 13.0%) | 0.615 parts |
| Dipentaerythritol hexaacrylate | 0.070 parts |
| Glycerol propoxylate (1% cyclohexane solution) | 0.048 parts |

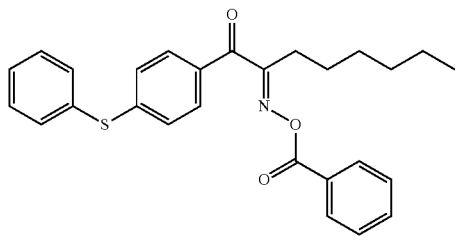

(I-1)
IRGACURE OXE01
(manufactured by BASF)

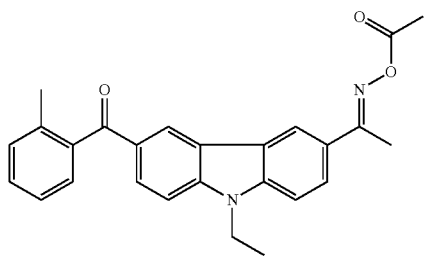

(I-2)
IRGACURE OXE02
(manufactured by BASF)

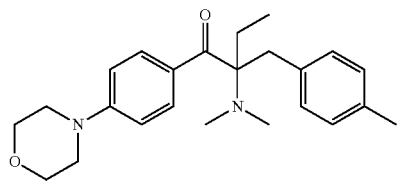

(I-3)
IRGACURE OXE379
(manufactured by BASF)

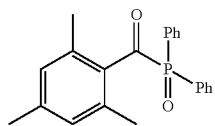

(I-4)
DAROCUR TPO
(manufactured by BASF)

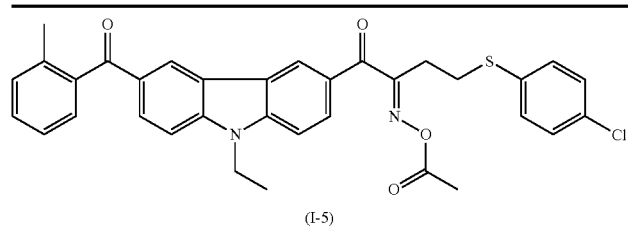
(I-5)
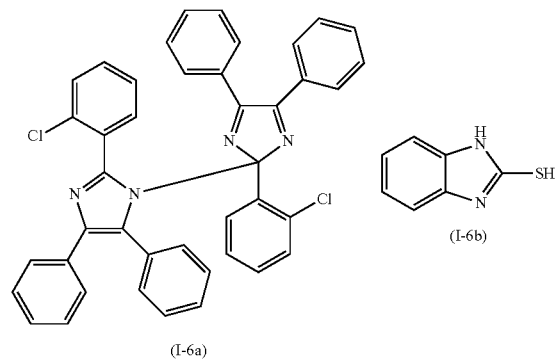
(I-6a)
(I-6b)
(I-6):(I-6a)/(I-6b) = 20/10 (mass ratio)
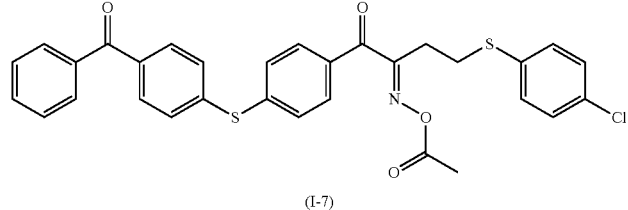 [SMILES: CC(=O)O/N=C(\CCSc1ccc(Cl)cc1)C(=O)c1ccc(Sc2ccc(C(=O)c3ccccc3)cc2)cc1 ; "(I-7)"]
(I-7)
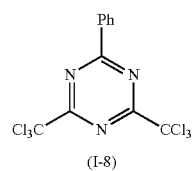
(I-8)
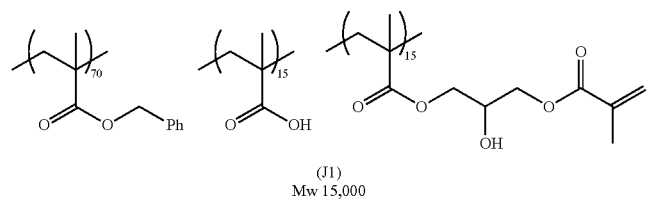
(J1)
Mw 15,000
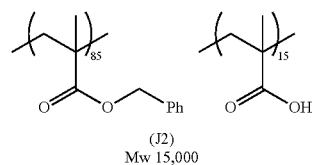
(J2)
Mw 15,000

In Comparative Examples 1 to 4, the following compounds were used as the dye multimer. In Comparative Example 4, a salt-forming product was used.

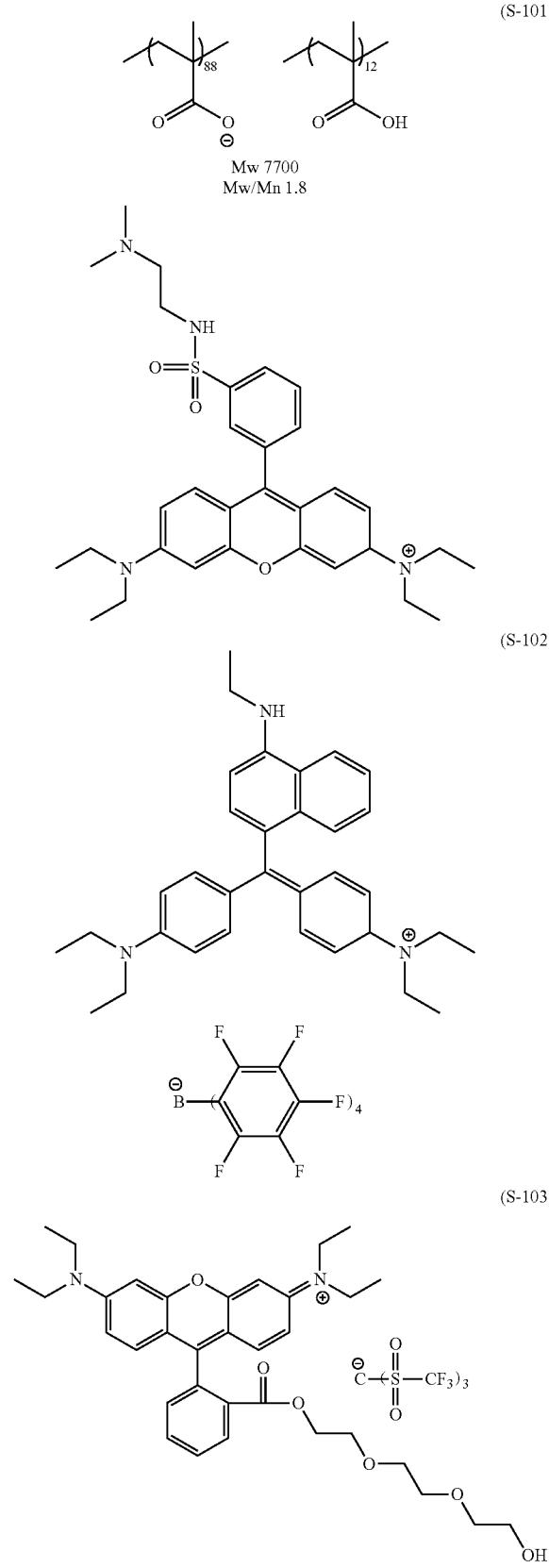

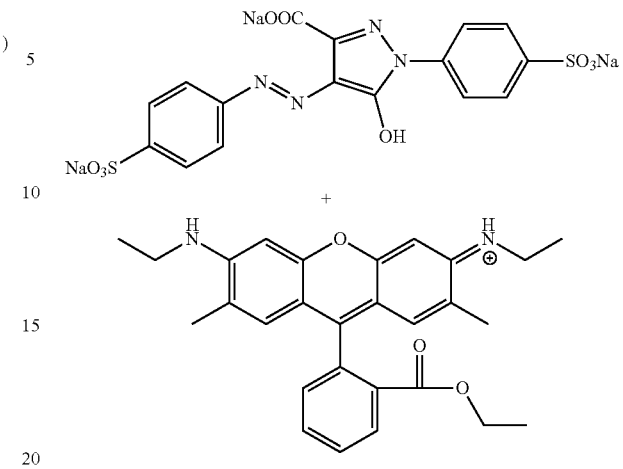

4. Manufacture of Color Filter Using Colored Composition

<Pattern Formation>

Each of the colored compositions of Examples and Comparative Examples, which had been prepared as above, was applied onto the undercoat layer of the undercoat layer-attached silicon wafer substrate obtained in the above section 2, thereby forming a colored composition layer (coating film) Then, a heating treatment (pre-baking) was carried out for 120 seconds by using a hot plate at 100° C. such that the dry film thickness of the coating film became 0.6 μm.

Next, by using an i-ray stepper exposure device FPA-3000i5+(manufactured by CANON Inc.), the wafer was exposed at a wavelength of 365 nm through an island pattern mask having a 1.0 μm×1.0 μm pattern, by varying the exposure dose in a range from 50 mJ/cm$^2$ to 1200 mJ/cm$^2$.

Subsequently, the silicon wafer substrate, which had been irradiated with light and had a coating film formed thereon, was loaded onto a horizontal spin table of a spin shower developing machine (Model DW-30, manufactured by Chemitronics Co., Ltd.), and subjected to paddle development at 23° C. for 60 seconds by using CD-2000 (manufactured by FUJIFILM Electronic Materials CO., LTD.), thereby forming a colored pattern on the silicon wafer substrate.

The silicon wafer on which the colored pattern had been formed was fixed onto the horizontal spin table by a vacuum chuck method, and the silicon wafer substrate was rotated at a rotation frequency of 50 r.p.m. by using a rotation device. In this state, from the position above the rotation center, pure water was supplied onto the wafer from a spray nozzle in the form of shower so as to perform a rinsing treatment, and then the wafer was spray-dried.

In the manner described above, monochromic color filters having the colored patterns formed of the colored compositions of Examples or Comparative Examples were manufactured.

Thereafter, the size of the colored pattern was measured by using a length measuring SEM "S-9260A" (manufactured by Hitachi High-Technologies Corporation). An exposure dose at which the pattern size became 1.0 μm was determined as an optimal exposure dose.

5. Evaluation of Performance

5-1. Heat Resistance

The glass substrate on which the colored composition obtained above had been applied was loaded onto a hot plate at 200° C. such that it came into contact with the substrate surface, and heated for 1 hour. Then, the color difference (ΔE*ab value) between before and after the heating was measured using a colorimeter MCPD-1000 (manufactured by Otsuka Electronics Co., Ltd.), and used as an index for evaluating the heat fastness, and the index was evaluated in accordance with the following evaluation criteria. A small ΔE*ab value indicates good heat resistance. Incidentally, the ΔE*ab value was a value determined from the following color-difference formula according to CIE 1976 (L*, a*, b*) color space (New Edition of Color Science Handbook (1985) p. 266, edited by The Color Science Association of Japan).

$$\Delta E^*ab = \{(\Delta L^*)2 + (\Delta a^*)2 + (\Delta b^*)2\}^{1/2}$$

5-2. Solubility in PGMEA

The solubility in solvents with respect to the compounds (S-1) to (S-42) in PGMEA were evaluated in accordance with the following criteria.

A: A case showing a solubility of 20% by mass or more.
B: A case showing a solubility of 10% by mass or more to less than 20% by mass.
C: A case showing a solubility of 5% by mass or more to less than 10% by mass.
D: A case showing a solubility of less than 5% by mass.

5-3. Evaluation of Color Migration

The absorbance of the colored pattern in each of the color filters was measured with MCPD-3000 (manufactured by Otsuka Electronics Co., Ltd.) (Absorbance A).

A CT-2000L solution (a transparent undercoating agent, manufactured by FUJIFILM Electronics Materials Co., Ltd.) was applied onto the surface, on which the colored pattern of the color filter had been formed, such that the dried film thickness became 1 μm, and dried to form a transparent film, and the film was subjected to a heating treatment at 280° C. for 5 minutes.

After the completion of heating, the absorbance of the transparent film adjacent to the colored pattern was measured with MCPD-3000 (manufactured by Otsuka Electronics Co., Ltd.) (Absorbance B).

The ratio [%] of the absorbance A value of the colored pattern which had been measured before heating to the absorbance B value of the obtained transparent film was calculated [the following (Equation A)]. The ratio was used as an index for evaluating the color migration to adjacent pixels.

Color migration (%)=Absorbance $B$/Absorbance $A$×100    (Equation A)

TABLE 2

| | Colored composition | Dye multimer | Pigment | Photopolymerization initiator | Alkali-soluble resin | Heat resistance | Solubility in solvents with respect to PGMEA | Color migration |
|---|---|---|---|---|---|---|---|---|
| Example 1 | (R-1) | (S-1) | PB15:6 | (I-1) | J1 | 1.4 | A | 5 |
| Example 2 | (R-2) | (S-2) | PB15:6 | (I-1) | J1 | 0.7 | A | 2 |
| Example 3 | (R-3) | (S-3) | PB15:6 | (I-1) | J1 | 1.2 | A | 5 |
| Example 4 | (R-4) | (S-4) | PB15:6 | (I-1) | J1 | 1.8 | A | 6 |
| Example 5 | (R-5) | (S-5) | PB15:6 | (I-1) | J1 | 0.9 | A | 3 |
| Example 6 | (R-6) | (S-6) | PB15:6 | (I-1) | J1 | 1 | A | 4 |
| Example 7 | (R-7) | (S-7) | PB15:6 | (I-1) | J1 | 1.2 | A | 5 |
| Example 8 | (R-8) | (S-8) | PB15:6 | (I-1) | J1 | 1.2 | B | 5 |
| Example 9 | (R-9) | (S-9) | PB15:6 | (I-1) | J1 | 0.5 | A | 0 |
| Example 10 | (R-10) | (S-10) | PB15:6 | (I-1) | J1 | 1.8 | A | 7 |
| Example 11 | (R-11) | (S-11) | PB15:6 | (I-1) | J1 | 0.7 | A | 2 |
| Example 12 | (R-12) | (S-12) | PB15:6 | (I-1) | J1 | 1.4 | A | 5 |
| Example 13 | (R-13) | (S-13) | PB15:6 | (I-1) | J1 | 1.4 | A | 5 |
| Example 14 | (R-14) | (S-14) | PB15:6 | (I-1) | J1 | 1.8 | A | 6 |
| Example 15 | (R-15) | (S-15) | PB15:6 | (I-1) | J1 | 2.3 | B | 7 |
| Example 16 | (R-16) | (S-16) | PB15:6 | (I-1) | J1 | 1.8 | A | 6 |
| Example 17 | (R-17) | (S-17) | PB15:6 | (I-1) | J1 | 1.8 | A | 3 |
| Example 18 | (R-18) | (S-18) | PB15:6 | (I-1) | J1 | 1.2 | A | 1 |
| Example 19 | (R-19) | (S-19) | PB15:6 | (I-1) | J1 | 1.8 | A | 6 |
| Example 20 | (R-20) | (S-20) | PB15:6 | (I-1) | J1 | 0.7 | A | 2 |
| Example 21 | (R-21) | (S-21) | PB15:6 | (I-1) | J1 | 1.2 | A | 5 |
| Example 22 | (R-22) | (S-22) | PR254 | (I-1) | J1 | 1.4 | A | 5 |
| Example 23 | (R-23) | (S-23) | PB15:6 | (I-1) | J1 | 1.4 | A | 5 |
| Example 24 | (R-24) | (S-24) | PB15:6 | (I-1) | J2 | 2.9 | B | 6 |
| Example 25 | (R-25) | (S-25) | PB15:6 | (I-1) | J1 | 2.9 | B | 7 |
| Example 26 | (R-26) | (S-26) | PB15:6 | (I-1) | J1 | 1.2 | A | 5 |
| Example 27 | (R-27) | (S-27) | PB15:6 | (I-1) | J1 | 3.7 | B | 9 |
| Example 28 | (R-28) | (S-28) | PB15:6 | (I-1) | J1 | 2.4 | B | 8 |
| Example 29 | (R-29) | (S-29) | PB15:6 | (I-1) | J1 | 2.4 | A | 8 |
| Example 30 | (R-30) | (S-30) | PB15:6 | (I-1) | J1 | 4 | B | 10 |
| Example 31 | (R-31) | (S-31) | PB15:6 | (I-1) | J1 | 1.7 | A | 5 |
| Example 32 | (R-32) | (S-32) | PB15:6 | (I-2) | J1 | 2.9 | B | 6 |
| Example 33 | (R-33) | (S-33) | PB15:6 | (I-3) | J1 | 1.8 | B | 6 |
| Example 34 | (R-34) | (S-34) | PB15:6 | (I-4) | J1 | 2.4 | B | 8 |
| Example 35 | (R-35) | (S-35) | PB15:6 | (I-5) | J1 | 1.2 | B | 5 |
| Example 36 | (R-36) | (S-36) | PB15:6 | (I-6) | J1 | 3.7 | A | 9 |
| Example 37 | (R-37) | (S-37) | PB15:6 | (I-7) | J1 | 2.2 | A | 7 |
| Example 38 | (R-38) | (S-38) | PB15:6 | (I-8) | J1 | 2.9 | B | 6 |
| Example 39 | (R-39) | (S-39) | PY139 | (I-1) | J1 | 3.3 | B | 9 |
| Example 40 | (R-40) | (S-40) | PB15:8 | (I-1) | J1 | 1.7 | B | 5 |

TABLE 2-continued

| | Colored composition | Dye multimer | Pigment | Photopolymerization initiator | Alkali-soluble resin | Heat resistance | Solubility in solvents with respect to PGMEA | Color migration |
|---|---|---|---|---|---|---|---|---|
| Comparative Example 1 | (R-39) | (S-101) | PB15:6 | (I-1) | J1 | 5.5 | D | 20 |
| Comparative Example 2 | (R-40) | (S-102) | PB15:6 | (I-2) | J1 | 6.2 | C | 42 |
| Comparative Example 3 | (R-41) | (S-103) | PB15:6 | (I-3) | J1 | 4.8 | B | 35 |
| Comparative Example 4 | (R-42) | (S-104) | PB15:6 | (I-4) | J1 | 8 | D | 51 |

6. Pattern Formation to which Dry Etching Method is Applied 6-1. Preparation of Colored Composition The following components were mixed and dissolved to prepare colored compositions.

The following respective components were mixed, dispersed, and dissolved to obtain the respective colored compositions of Examples 41 to 80, and Comparative Examples 5 to 8.

| | |
|---|---|
| Cyclohexanone | 1.133 parts |
| Photopolymerization initiator (the compound of the above structure: the compound described in the following table) | 0.012 parts |
| Dye multimer (A) (the compound described in the following table) | 0.040 parts in terms of a solid content |
| Pigment dispersion described in the following table (pigment concentration of 13.0%) | 0.615 parts |
| Polymerizable compound (EHPE-3150 (1,2-epoxy-4-(2-oxiranyl)cyclohexane adduct of 2,2-bis(hydroxymethyl)-1-butanol, manufactured by Daicel Chemical Industries, Ltd.)) | 0.070 parts |
| Glycerol propoxylate (1% cyclohexane solution) | 0.048 parts |

7. Performance Evaluation 7-1. Resistance to Alkaline Developing Liquid (Resistance to Developing Liquid)

The colored composition was applied onto a glass substrate, using a spin coater such that the film thickness became 0.6 and subjected to a heating treatment (pre-baking) using a hot plate at 100° C. for 120 seconds. Subsequently, a heating treatment (post-baking) was carried out by using a hot plate at 220° C. for 300 seconds to prepare a cured film.

The transmittance of the color filter thus obtained was measured in a wavelength region of 300 μm to 800 nm by a spectrophotometer (reference: glass substrate), which was a UV-VIS-NIR spectrophotometer, UV3600 (manufactured by SHIMADZU Corporation). In addition, differential interference images were observed through reflective observation (50× magnification) by using an optical microscope, BX60, manufactured by OLYMPUS Corporation.

Next, the color filter was immersed in an alkaline developing liquid, FHD-5 (manufactured by FUJIFILM Electronic Materials CO., LTD.) for 5 minutes, dried, and then subjected to spectrometry again. Thus, the change (a value represented by an equation |T0–T1|, in the case where the transmittance before solvent immersion is defined as T0 and the transmittance after solvent immersion is defined as T1) in the transmittance before and after solvent immersion was evaluated as follows.

AA: Good. A case where the change in the transmittance before and after immersion is less than 2% in the entire region in a range from 300 nm to 800 nm.

A: Satisfactory. A case where the change in the transmittance before and after immersion is 2% or more and less than 5% in the entire region in a range from 300 nm to 800 nm.

B: Sufficient. A case where the change in the transmittance before and after solvent immersion is 5% or more and less than 10% in the entire region in a range from 300 nm to 800 nm.

C: Insufficient. A case where the change in the transmittance before and after solvent immersion is 10% or more in the entire region in a range from 300 nm to 800 nm.

7-2. Resistance to Peeling Solution

Then, a positive-type photoresist "FHi622BC" (manufactured by FUJIFILM Electronic Materials CO., LTD.) was applied onto the colored film manufactured in section 7-1, and subjected to pre-baking to form a photoresist layer having a film thickness of 0.8 μm. Then, the photoresist layer was subjected to pattern exposure using an i-ray stepper (manufactured by CANON Inc.) in an exposure dose of 350 mJ/cm$^2$ and then subjected to a heating treatment for 1 minute at a temperature at which the temperature of the photoresist layer or ambient temperature reached 90° C. Thereafter, a peeling treatment was carried out using a photoresist peeling solution "MS230C" (manufactured by FUJIFILM Electronic Materials CO., LTD.) for 120 seconds to remove the resist pattern, and then cleaning with pure water and spin drying were carried out. Thereafter, dehydration and baking treatments were carried out at 100° C. for 2 minutes.

The obtained colored film was subjected to spectrometry and the change (a value represented by an equation |T0–T2|, in the case where the transmittance before solvent immersion is defined as T0 and the transmittance after solvent immersion is defined as T2) in the transmittance after peeling was evaluated.

AA: Good. A case where the change in the transmittance before and after solvent immersion is less than 2% in the entire region in a range from 300 nm to 800 nm.

A: Satisfactory. A case where the change in the transmittance before and after immersion is 2% or more and less than 5% in the entire region in a range from 300 nm to 800 nm.

B: Sufficient. A case where the change in the transmittance before and after immersion is 5% or more and less than 10% in the entire region in a range from 300 nm to 800 nm.

C: Insufficient. A case where the change in the transmittance before and after solvent immersion is 10% or more in the entire region in a range from 300 nm to 800 nm.

TABLE 3

| | Colored composition | Dye multimer | Pigment | Resistance to developing liquid | Resistance to peeling solution |
|---|---|---|---|---|---|
| Example 41 | (R-1) | (S-1) | PB15:6 | B | B |
| Example 42 | (R-2) | (S-2) | PB15:6 | A | A |
| Example 43 | (R-3) | (S-3) | PB15:6 | B | B |
| Example 44 | (R-4) | (S-4) | PB15:6 | B | B |
| Example 45 | (R-5) | (S-5) | PB15:6 | AA | AA |
| Example 46 | (R-6) | (S-6) | PB15:6 | A | A |
| Example 47 | (R-7) | (S-7) | PB15:6 | B | B |
| Example 48 | (R-8) | (S-8) | PB15:6 | B | B |
| Example 49 | (R-9) | (S-9) | PB15:6 | AA | AA |
| Example 50 | (R-10) | (S-10) | PB15:6 | B | B |
| Example 51 | (R-11) | (S-11) | PB15:6 | A | A |
| Example 52 | (R-12) | (S-12) | PB15:6 | B | B |
| Example 53 | (R-13) | (S-13) | PB15:6 | B | B |
| Example 54 | (R-14) | (S-14) | PB15:6 | B | B |
| Example 55 | (R-15) | (S-15) | PB15:6 | B | B |
| Example 56 | (R-16) | (S-16) | PB15:6 | B | B |
| Example 57 | (R-17) | (S-17) | PB15:6 | B | A |
| Example 58 | (R-18) | (S-18) | PB15:6 | B | A |
| Example 59 | (R-19) | (S-19) | PB15:6 | B | B |
| Example 60 | (R-20) | (S-20) | PB15:6 | A | A |
| Example 61 | (R-21) | (S-21) | PB15:6 | B | B |
| Example 62 | (R-22) | (S-22) | PR254 | B | B |
| Example 63 | (R-23) | (S-23) | PB15:6 | B | B |
| Example 64 | (R-24) | (S-24) | PB15:6 | B | B |
| Example 65 | (R-25) | (S-25) | PB15:6 | B | B |
| Example 66 | (R-26) | (S-26) | PB15:6 | B | B |
| Example 67 | (R-27) | (S-27) | PB15:6 | B | B |
| Example 68 | (R-28) | (S-28) | PB15:6 | B | B |
| Example 69 | (R-29) | (S-29) | PB15:6 | B | B |
| Example 70 | (R-30) | (S-30) | PB15:6 | B | B |
| Example 71 | (R-31) | (S-31) | PB15:6 | B | B |
| Example 72 | (R-32) | (S-32) | PB15:6 | B | B |
| Example 73 | (R-33) | (S-33) | PB15:6 | B | B |
| Example 74 | (R-34) | (S-34) | PB15:6 | B | B |
| Example 75 | (R-35) | (S-35) | PB15:6 | B | B |
| Example 76 | (R-36) | (S-36) | PB15:6 | B | B |
| Example 77 | (R-37) | (S-37) | PB15:6 | B | B |
| Example 78 | (R-38) | (S-38) | PB15:6 | B | B |
| Example 79 | (R-39) | (S-39) | PY139 | B | B |
| Example 80 | (R-40) | (S-40) | PB15:8 | B | B |
| Comparative Example 5 | (R-39) | (S-101) | PB15:6 | C | C |
| Comparative Example 6 | (R-40) | (S-102) | PB15:6 | C | C |
| Comparative Example 7 | (R-41) | (S-103) | PB15:6 | C | C |
| Comparative Example 8 | (R-42) | (S-104) | PB15:6 | C | C |

It could be seen that the resistance to a developing liquid and the resistance to a peeling solution were excellent in the case where color filters were manufactured by etching resists using the colored compositions of Examples 41 to 80, whereas those properties deteriorated with the colored compositions of Comparative Examples 5 to 8.

What is claimed is:

1. A colored composition comprising:

a polymer anion having a repeating unit containing a weakly nucleophilic anionic structure; and a cation having a dye structure, wherein the polymer anion contains a repeating unit having an acid group and the weakly nucleophilic anionic structure represents an anionic structure produced by dissociating an organic acid having a lower pKa value than the pKa value of sulfuric acid.

2. The colored composition according to claim 1, wherein the repeating unit containing a weakly nucleophilic anionic structure is represented by General Formula (1):

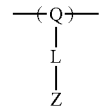

General Formula (1)

in which in General Formula (1), Q represents the main chain of the repeating unit, L represents a single bond or a divalent linking group, and Z is an anionic structure represented by General Formula (2-1), an anionic structure represented by General Formula (2-2), or an anionic structure represented by the following General Formula (2-3);

General Formula (2-1)

in General Formula (2-1), * represents a binding site to L in General Formula (1), $Y^1$ represents a fluorinated alkylene group, and $A^1$ represents $SO_3^-$;

General Formula (2-2)

in General Formula (2-2), * represents a binding site to L in General Formula (1), and $Y^2$ represents an anion including a boron atom, a carbon atom, a nitrogen atom, or a phosphorus atom;

in the case where $Y^2$ is a boron atom, n is 3, and $A^2$'s are each a halogen atom, a cyano group, an alkyl group containing at least one of a fluorine atom and a cyano group, or an aryl group containing at least one of a fluorine atom and a cyano group;

in the case where $Y^2$ is a carbon atom, n is 2, and $A^2$'s are each a halogen atom, a cyano group, an alkyl group containing at least one of a fluorine atom and a cyano group, an aryl group containing at least one of a fluorine atom and a cyano group, an alkylsulfonyl group which may contain at least one of a fluorine atom and a cyano group, or an arylsulfonyl group which may contain at least one of a fluorine atom and a cyano group, and two $A^2$'s may be bonded to each other to form a ring;

in the case where $Y^2$ is a nitrogen atom, n is 1, and $A^2$'s are each an alkyl group containing at least one of a fluorine atom and a cyano group, an aryl group containing at least one of a fluorine atom and a cyano group, an alkylsulfonyl group which may contain at least one of a fluorine atom and a cyano group, or an arylsulfonyl group which may contain at least one of a fluorine atom and a cyano group; and in the case where $Y^2$ is a phosphorus atom, n is 1 or 3, and $A^2$'s are each an alkyl group containing at least one of a fluorine atom and a cyano group, an aryl group containing at least one of a fluorine atom and a cyano group, an alkylsulfonyl group which may contain at least one of a fluorine atom and a cyano group, or an arylsulfonyl group which may contain at least one of a fluorine atom and a cyano group); and General Formula (2-3)

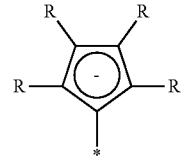

in General Formula (2-3), * represents a binding site to L in General Formula (1), and R's each represent a cyano group or a fluorinated alkyl group.

3. The colored composition according to claim 2, wherein in the case where Z in General Formula (1) is represented by General Formula (2-1), L has a fluorinated alkylene group having 1 to 10 carbon atoms.

4. The colored composition according to claim 2, wherein Z in General Formula (1) is an anionic structure represented by General Formula (2-1), or an anionic structure produced by dissociating at least one group selected from a fluorinated alkylsulfonimide group and a fluorinated alkylsulfonemethide group.

5. The colored composition according to claim 1, wherein the cation having a dye structure has a polymerizable group.

6. The colored composition according to claim 1, wherein the colored composition further comprises a polymerizable compound.

7. The colored composition according to claim 1, wherein the colored composition further comprises a pigment other than the cation having a dye structure.

8. The colored composition according to claim 1, wherein the colored composition further comprises a photopolymerization initiator.

9. The colored composition according to claim 8, wherein the photopolymerization initiator is an oxime compound.

10. The colored composition according to claim 1, wherein the cation having a dye structure has a dye structure selected from a dipyrromethene dye, a triarylmethane dye, a xanthene dye, a cyanine dye, and a squarylium dye.

11. The colored composition according to claim 1, wherein the polymer anion having the repeating unit containing a weakly nucleophilic anionic structure and the cation having a dye structure form a dye multimer.

12. The colored composition according to claim 1, which is used for formation of a colored layer of a color filter.

13. A cured film obtained by curing the colored composition according to claim 1.

14. A color filter comprising the cured film according to claim 13.

15. A solid-state image sensor comprising the color filter according to claim 14.

16. An image display device comprising the color filter according to claim 14.

17. A method for producing a color filter, comprising:
applying the colored composition according to claim 1 onto a support to form a colored composition layer;
patternwise exposing the colored composition layer; and developing an unexposed area after the exposure.

18. The colored composition according to claim 1, wherein the proportion of the repeating units containing a repeating unit having an acid group is from 1 mole to 60 moles with respect to 100 moles of the repeating unit containing the polymer anion.

19. The colored composition according to claim 1, wherein the acid group contained in the repeating unit is a carboxylic acid group.

20. A colored composition comprising:
a polymer anion having a repeating unit containing a weakly nucleophilic anionic structure; and
a cation having a dye structure,
wherein the weakly nucleophilic anionic structure represents an anionic structure produced by dissociating an organic acid having a lower pKa value than the pKa value of sulfuric acid; and
the cation having a dye structure has a dye structure selected from a dipyrromethene dye, a xanthene dye, a cyanine dye, and a squarylium dye.

21. The colored composition according to claim 20, wherein the repeating unit containing a weakly nucleophilic anionic structure is represented by General Formula (1):

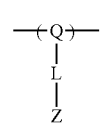

General Formula (1)

in which
in General Formula (1), Q represents the main chain of the repeating unit, L represents a single bond or a divalent linking group, and Z is an anionic structure represented by General Formula (2-1), an anionic structure represented by General Formula (2-2), or an anionic structure represented by the following General Formula (2-3);

General Formula (2-1)

in General Formula (2-1), * represents a binding site to L in General Formula (1), $Y^1$ represents a fluorinated alkylene group, and $A^1$ represents $SO_3^-$;

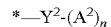

General Formula (2-2)

in General Formula (2-2), * represents a binding site to L in General Formula (1), and $Y^2$ represents an anion including a boron atom, a carbon atom, a nitrogen atom, or a phosphorus atom;

in the case where $Y^2$ is a boron atom, n is 3, and $A^2$'s are each a halogen atom, a cyano group, an alkyl group containing at least one of a fluorine atom and a cyano group, or an aryl group containing at least one of a fluorine atom and a cyano group;

in the case where $Y^2$ is a carbon atom, n is 2, and $A^2$'s are each a halogen atom, a cyano group, an alkyl group containing at least one of a fluorine atom and a cyano group, an aryl group containing at least one of a fluorine atom and a cyano group, an alkylsulfonyl group which may contain at least one of a fluorine atom and a cyano group, or an arylsulfonyl group which may contain at least one of a fluorine atom and a cyano group, and two $A^2$'s may be bonded to each other to form a ring;

in the case where $Y^2$ is a nitrogen atom, n is 1, and $A^2$'s are each an alkyl group containing at least one of a fluorine atom and a cyano group, an aryl group containing at least one of a fluorine atom and a cyano group, an alkylsulfonyl group which may contain at least one of a fluorine atom and a cyano group, or an arylsulfonyl group which may contain at least one of a fluorine atom and a cyano group; and in the case where $Y^2$ is a phosphorus atom, n is 1 or 3, and $A^2$'s are each an alkyl group containing at least one of a fluorine atom and a cyano group, an aryl group containing at least one of a fluorine atom and a cyano group, an alkylsulfonyl group which may contain at least one of a fluorine atom and a cyano group, or an arylsulfonyl group which may contain at least one of a fluorine atom and a cyano group); and

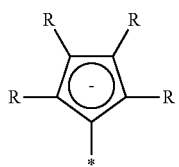

General Formula (2-3)

in General Formula (2-3), * represents a binding site to L in General Formula (1), and R's each represent a cyano group or a fluorinated alkyl group.

22. The colored composition according to claim 21, wherein in the case where Z in General Formula (1) is represented by General Formula (2-1), L has a fluorinated alkylene group having 1 to 10 carbon atoms.

23. The colored composition according to claim 21, wherein Z in General Formula (1) is an anionic structure represented by General Formula (2-1), or an anionic structure produced by dissociating at least one group selected from a fluorinated alkylsulfonimide group and a fluorinated alkylsulfonemethide group.

24. The colored composition according to claim 20, wherein the cation having a dye structure has a polymerizable group.

25. The colored composition according to claim 20, wherein the polymer anion contains a repeating unit having an acid group.

26. The colored composition according to claim 20, wherein the colored composition further comprises a polymerizable compound.

27. The colored composition according to claim 20, wherein the colored composition further comprises a pigment other than the cation having a dye structure.

28. The colored composition according to claim 20, wherein the colored composition further comprises a photopolymerization initiator.

29. The colored composition according to claim 28, wherein the photopolymerization initiator is an oxime compound.

30. The colored composition according to claim 20, wherein the polymer anion having the repeating unit containing a weakly nucleophilic anionic structure and the cation having a dye structure form a dye multimer.

31. A cured film obtained by curing the colored composition according to claim 20.

32. A color filter comprising the cured film according to claim 31.

33. A solid-state image sensor comprising the color filter according to claim 32.

34. An image display device comprising the color filter according to claim 32.

35. A method for producing a color filter, comprising:
applying the colored composition according to claim 20 onto a support to form a colored composition layer;
patternwise exposing the colored composition layer; and
developing an unexposed area after the exposure.

36. The colored composition according to claim 20, wherein the cation having a dye structure has a dye structure selected from a xanthene dye and a squarylium dye.

* * * * *